(12) United States Patent
Taniguchi et al.

(10) Patent No.: US 11,579,526 B2
(45) Date of Patent: Feb. 14, 2023

(54) RESIST COMPOSITION AND PATTERNING PROCESS

(71) Applicant: SHIN-ETSU CHEMICAL CO., LTD., Tokyo (JP)

(72) Inventors: Ryosuke Taniguchi, Joetsu (JP); Satoshi Watanabe, Joetsu (JP); Masaki Ohashi, Joetsu (JP); Naoya Inoue, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 346 days.

(21) Appl. No.: 16/798,842

(22) Filed: Feb. 24, 2020

(65) Prior Publication Data
US 2020/0301274 A1 Sep. 24, 2020

(30) Foreign Application Priority Data

Mar. 22, 2019 (JP) .................. JP2019-54571

(51) Int. Cl.
| | |
|---|---|
| G03F 7/038 | (2006.01) |
| G03F 7/004 | (2006.01) |
| C08L 45/00 | (2006.01) |
| C08L 25/06 | (2006.01) |
| G03F 7/20 | (2006.01) |
| G03F 7/32 | (2006.01) |

(52) U.S. Cl.
CPC ............ *G03F 7/0382* (2013.01); *C08L 25/06* (2013.01); *C08L 45/00* (2013.01); *G03F 7/0045* (2013.01); *G03F 7/2004* (2013.01); *G03F 7/322* (2013.01)

(58) Field of Classification Search
CPC .... G03F 7/0045; G03F 7/0382; G03F 7/0392; G03F 7/397; G03F 7/004
See application file for complete search history.

(56) References Cited

U.S. PATENT DOCUMENTS

| | | |
|---|---|---|
| 2002/0051933 A1 | 5/2002 | Kodama et al. |
| 2002/0098443 A1 | 7/2002 | Hatakeyama et al. |
| 2004/0106063 A1 | 6/2004 | Hatakeyama et al. |
| 2008/0085469 A1 | 4/2008 | Ohsawa et al. |
| 2008/0118860 A1 | 5/2008 | Harada et al. |
| 2008/0318160 A1 | 12/2008 | Ohsawa et al. |
| 2009/0246694 A1 | 10/2009 | Ohsawa et al. |
| 2010/0035185 A1 | 2/2010 | Hagiwara et al. |
| 2010/0119970 A1 | 5/2010 | Ohsawa et al. |
| 2010/0209827 A1 | 8/2010 | Ohashi et al. |

(Continued)

FOREIGN PATENT DOCUMENTS

| | | |
|---|---|---|
| JP | 2001-194776 A | 7/2001 |
| JP | 2002-226470 A | 8/2002 |

(Continued)

OTHER PUBLICATIONS

Oct. 20, 2021 Office Action issued in Korean Patent Application No. 10-2020-0034504.

(Continued)

*Primary Examiner* — Duane Smith
*Assistant Examiner* — Nicholas E Brown
(74) *Attorney, Agent, or Firm* — Oliff PLC

(57) ABSTRACT

A chemically-amplified negative resist composition includes: (A) a quencher containing an onium salt shown by the following formula (A-1); (B) a base polymer containing repeating units shown by the following formulae (B1) and (B2); and (C) a photo-acid generator which generates an acid. Thus, the present invention provides: a negative resist composition which can form a favorable profile with high sensitivity and low LWR and CDU in a pattern; and a resist patterning process using the composition.

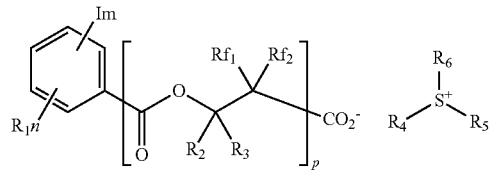

(A-1)

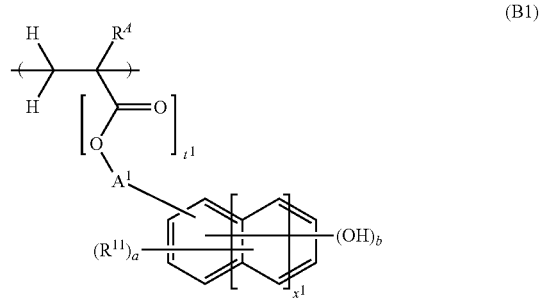

(B1)

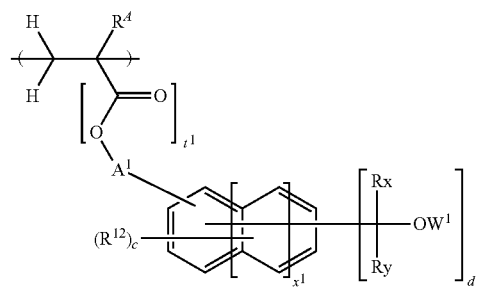

(B2)

16 Claims, 1 Drawing Sheet

(56) References Cited

U.S. PATENT DOCUMENTS

| | | |
|---|---|---|
| 2011/0008735 A1 | 1/2011 | Ohsawa et al. |
| 2012/0045724 A1 | 2/2012 | Ohsawa et al. |
| 2012/0100486 A1 | 4/2012 | Sagehashi et al. |
| 2012/0225386 A1 | 9/2012 | Watanabe et al. |
| 2013/0337378 A1 | 12/2013 | Ohashi et al. |
| 2014/0199629 A1 | 7/2014 | Ohashi et al. |
| 2015/0323865 A1 | 11/2015 | Sagehashi et al. |
| 2016/0004155 A1 | 1/2016 | Ohashi et al. |
| 2016/0299428 A1 | 10/2016 | Masunaga et al. |
| 2017/0315442 A1 | 11/2017 | Fukushima et al. |
| 2017/0351177 A1* | 12/2017 | Hatakeyama ......... G03F 7/0048 |
| 2018/0275512 A1 | 9/2018 | Hatakeyama et al. |
| 2019/0155155 A1 | 5/2019 | Hatakeyama et al. |

FOREIGN PATENT DOCUMENTS

| | | |
|---|---|---|
| JP | 2002-363148 A | 12/2002 |
| JP | 2004-115630 A | 4/2004 |
| JP | 2007-145797 A | 6/2007 |
| JP | 2008-106045 A | 5/2008 |
| JP | 2008-111103 A | 5/2008 |
| JP | 2009-007327 A | 1/2009 |
| JP | 4226803 B2 | 2/2009 |
| JP | 2009-258695 A | 11/2009 |
| JP | 2010-113209 A | 5/2010 |
| JP | 2010-215608 A | 9/2010 |
| JP | 2011-016746 A | 1/2011 |
| JP | 2012-041320 A | 3/2012 |
| JP | 2012-106986 A | 6/2012 |
| JP | 2012-153644 A | 8/2012 |
| JP | 2012-181306 A | 9/2012 |
| JP | 2014-001259 A | 1/2014 |
| JP | 2014-133723 A | 7/2014 |
| JP | 2015-214634 A | 12/2015 |
| JP | 2016-018007 A | 2/2016 |
| KR | 10-2016-0122085 A | 10/2016 |
| KR | 10-2017-0138355 A | 12/2017 |
| TW | 201701065 | 1/2017 |
| TW | 201812447 A | 4/2018 |
| TW | 201838972 A | 11/2018 |
| WO | 2016/063764 A1 | 4/2016 |

OTHER PUBLICATIONS

Mar. 8, 2021 Office Action and Search Report issued in Taiwanese Patent Application No. 109108894.

* cited by examiner

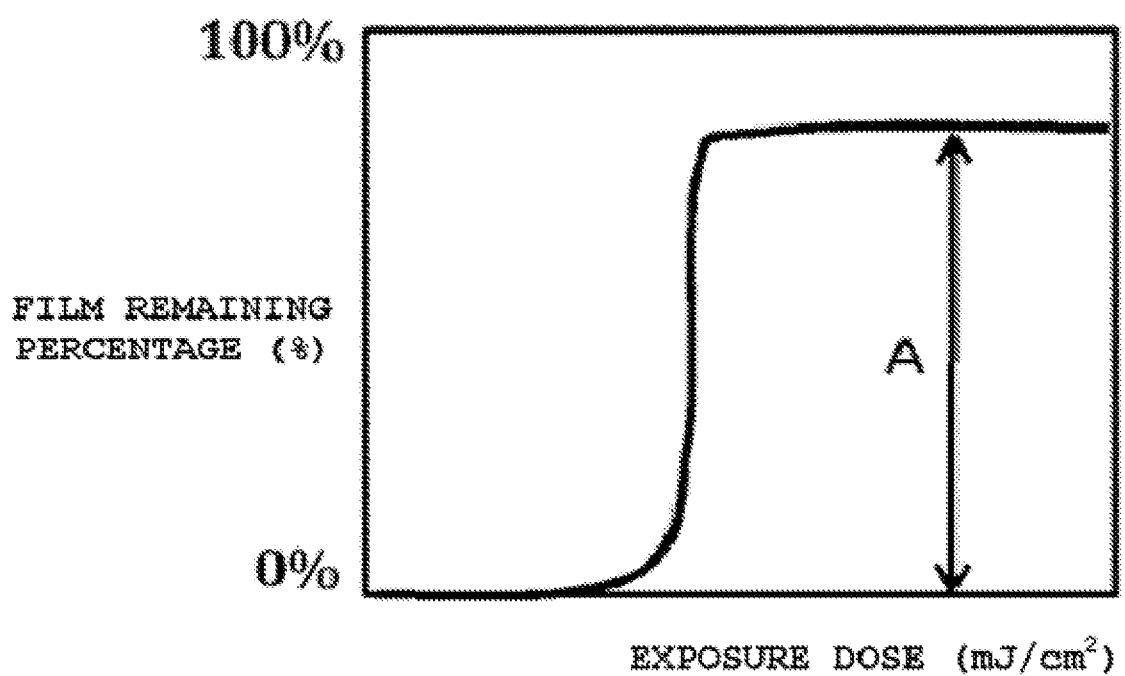

RESIST COMPOSITION AND PATTERNING PROCESS

TECHNICAL FIELD

The present invention relates to a chemically-amplified negative resist composition and a resist patterning process using the composition.

BACKGROUND ART

As LSIs advance toward higher integration and higher processing speed, miniaturization of pattern rule is progressing rapidly. Especially, the expansion of flash memory market and the increase in memory capacity lead this miniaturization. As a cutting-edge technology for miniaturization, 65-nm node devices have been mass-produced by ArF lithography, and mass-production of next-generation 45-nm node by ArF immersion lithography is under preparation. For next-generation 32-nm node, there is immersion lithography with a super high NA lens using a combination of a liquid having a higher refractive index than water, a high refractive index lens, and a high refractive index resist material. Recently, to obtain finer patterns, studies have been conducted of resist materials for light with short wavelength such as electron beam (EB) and extreme ultraviolet ray (EUV).

Regarding EUV resist, high sensitivity, high resolution and low LWR (line width roughness) have to be achieved at the same time. Shortening the acid diffusion distance reduces not only LWR but also sensitivity. For example, decreasing the post exposure bake (PEB) temperature reduces LWR, but results in lower sensitivity. When a quencher is added in a larger amount, LWR is reduced, but the sensitivity is lowered, too. It is necessary to overcome the tradeoff relation between sensitivity and LWR.

Resist compositions used in photolithography include: positive type in which an exposed portion is dissolved to form a pattern; and negative type in which an exposed portion is left to form a pattern. Among these, one which is easy to use is selected depending on a required resist pattern. When a dot pattern is to be formed, if alkali development is employed on a positive resist composition, a bright mask needs to be used. In this case, there is such a disadvantage that a large area is irradiated with high-energy electron beam or EUV light, degrading the mask. For this reason, a dark mask with small exposure area is used. In this case, a negative resist whose exposed portion is insolubilized with respect to an alkaline developer is essential.

For a chemically-amplified negative resist material in which an acid generator is added and irradiated with light or an electron beam (EB) to generate an acid for polarity inversion reaction or crosslinking reaction, the effect of a quencher added so as to control the diffusion of the acid to an unexposed portion and improve the contrast is very effective. Hence, many amine quenchers have been proposed (Patent Documents 1 to 3).

As another method for increasing the contrast, the exposure dose is increased to decrease the amine concentration. In this method, it is conceivable to apply a compound which loses the function as a quencher by light. Patent Document 4 describes a positive photosensitive composition for ArF excimer laser exposure, the composition containing a carboxylic acid onium salt. In these technologies, a strong acid (sulfonic acid) generated from another photo-acid generator by exposure is subjected to ion exchange with a weak-acid onium salt, so that a weak acid and a strong-acid onium salt are formed; thus, the substitution between the strong acid (sulfonic acid) with high acidity and a weak acid (carboxylic acid) suppresses the acid decomposition reaction of the acid labile group and shortens (controls) the acid diffusion distance, consequently demonstrating a function as what is called a quencher. Such carboxylic acid onium salts lose the ability as a quencher by photo decomposition, and thus function as a photo-decomposable quencher, contributing to contrast improvement.

Meanwhile, in a negative resist to which an alkaline developer is applied, an acid is generated from an exposed portion, and a base polymer is insolubilized by the action of this acid. The acid generated from the exposed portion has such a high affinity to an alkaline developer that the exposed portion is dissolved during development, causing top loss in the pattern and thereby LWR and CDU degradation problems.

Carboxylic acid onium salt is not an exception of this and also has a problem that a carboxylic acid onium salt breaks down by the salt exchange with a strong acid (sulfonic acid) or by an electron beam or light, so that the resulting carboxylic acid assists a developer to dissolve a pattern formed at an exposed portion. Additionally, the carboxylic acid formed by the exchange with a strong acid might contribute to deprotection of a protective group, though the contribution is not as great as that by a strong acid (sulfonic acid); hence, it is also necessary to suppress the diffusion of the carboxylic acid. However, the currently-available carboxylic acid onium salts have problems that a profile with top loss is formed as described above, and that the diffusion is insufficiently suppressed and an unexposed portion, which should be dissolved originally, remains as scum due to lowered solubility in alkali.

CITATION LIST

Patent Literature

Patent Document 1: Japanese Unexamined Patent Application Publication No. 2001-194776
Patent Document 2: Japanese Unexamined Patent Application Publication No. 2002-226470
Patent Document 3: Japanese Unexamined Patent Application Publication No. 2002-363148
Patent Document 4: Japanese Patent No. 4226803

SUMMARY OF INVENTION

Technical Problem

The present invention has been made to solve the above-described problems. An object of the present invention is to provide: a negative resist composition which is capable of exhibiting high sensitivity, low LWR of a line-and-space pattern (L/S pattern), and low CDU of a dot pattern, and capable of forming a favorable profile with little top loss in a chemically-amplified resist that uses an acid as a catalyst; and a resist patterning process using the composition.

Solution to Problem

To achieve the above object, the present invention provides a chemically-amplified negative resist composition comprising:
(A) a quencher containing an onium salt shown by the following formula (A-1);

(B) a base polymer containing repeating units shown by the following formulae (B1) and (B2); and
(C) a photo-acid generator which generates an acid,

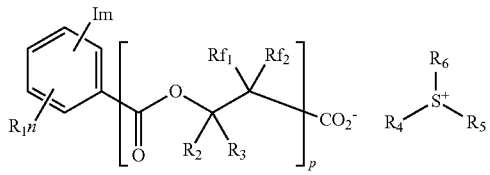

(A-1)

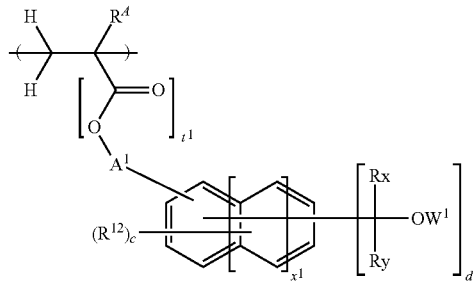

(B2)

wherein $R_1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, —$NR_7$—$C(=O)$—$R_8$, or —$NR_7$—$C(=O)$—O—$R_8$; $R_7$ represents a hydrogen atom or a linear, branched, or cyclic alkyl group having 1 to 6 carbon atoms optionally containing a halogen atom, a hydroxy group, an alkoxy group, an acyl group, or an acyloxy group; $R_8$ represents a linear, branched, or cyclic alkyl group having 1 to 16 carbon atoms or alkenyl group having 2 to 16 carbon atoms, or an aryl group having 6 to 12 carbon atoms, and optionally contains a halogen atom, a hydroxy group, an alkoxy group, an acyl group, or an acyloxy group; $R_2$ and $R_3$ each represent a hydrogen atom or a linear, branched, or cyclic alkyl group having 1 to 20 carbon atoms; $Rf_1$ and $Rf_2$ each independently represent a hydrogen atom, a fluorine atom, or a trifluoromethyl group; $R_4$, $R_5$, and $R_6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, and carbon atoms of these groups are optionally interposed by an ether group, an ester group, a carbonyl group, a carbonate group, or a sulfonic acid ester group; $R_4$ and $R_5$ optionally bond with each other to form a ring with a sulfur atom bonded to $R_4$ and $R_5$; "m" represents an integer of 1 to 5; "n" represents an integer satisfying $0 \le n \le 5-m$; and "p" represents an integer of 0 or 1, wherein $R^A$ represents a hydrogen atom, a fluorine atom, a methyl group, or a trifluoromethyl group; $R^{11}$ and $R^{12}$ each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted; $A^1$ represents a single bond or a linear, branched, or cyclic alkylene group having 1 to 10 carbon atoms and optionally having an ether bond interposed in a carbon-carbon bond; $W^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond; Rx and Ry each independently represent a hydrogen atom, an alkyl group having 1 to 15 carbon atoms optionally substituted with a hydroxy group or an alkoxy group, or a monovalent aromatic group optionally having a substituent, given that not both of Rx and Ry are hydrogen atoms simultaneously, and Rx and Ry optionally bond with each other to form a ring with a carbon atom bonded to Rx and Ry; $t^1$ represents 0 or 1; $x^1$ represents an integer of 0 to 2; "a" represents an integer satisfying $0 \le a \le 5+2x^1-b$; "c" represents an integer satisfying $0 \le c \le 5+2x^1-d$; and "b" and "d" each represent an integer of 1 to 3.

The inventive chemically-amplified negative resist composition makes it possible to provide a negative resist composition capable of exhibiting high sensitivity, low LWR in an L/S pattern, and low CDU in a dot pattern, and capable of forming a favorable profile with little top loss in a chemically-amplified resist that uses an acid as a catalyst.

Moreover, the present invention provides the chemically-amplified negative resist composition, wherein the base polymer further contains at least one repeating unit selected from a repeating unit shown by the following formula (B3) and a repeating unit shown by the following formula (B4):

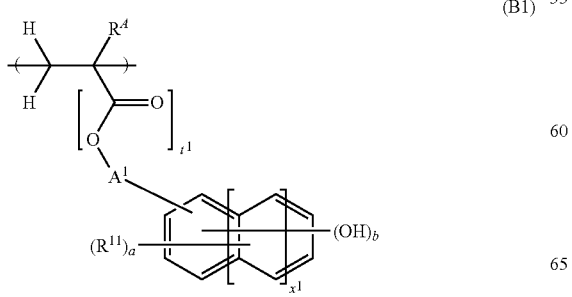

(B1)

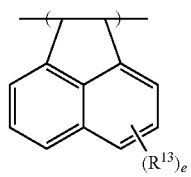

(B3)

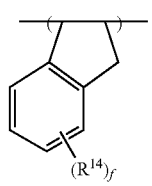

(B4)

wherein $R^{13}$ and $R^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted; and "e" and "f" each independently represent an integer of 0 to 4.

Such a chemically-amplified negative resist composition demonstrates not only the etching durability attributable to the aromatic ring, but also an effect of improving the durability to electron beam irradiation in etching and pattern inspection because the cyclic structure is added to the main chain.

In the present invention, the base polymer preferably contains a repeating unit shown by the following formula (B5) and a repeating unit shown by the following formula (B6):

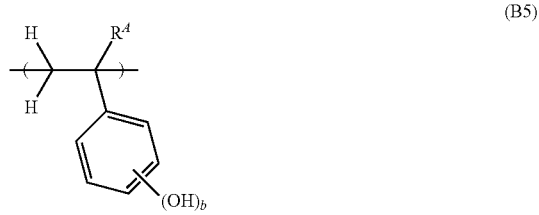

(B5)

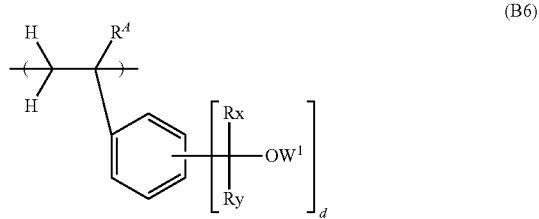

(B6)

wherein $R^A$, Rx, Ry, $W^1$, "b", and "d" are as defined above.

In such a chemically-amplified negative resist composition, the repeating unit B5 acts to further improve the etching durability and also improve the adhesion to a substrate and the solubility to an alkaline developer. In addition, the repeating unit B6 acts to enable the negative reaction (insolubilization) to more efficiently progress. Accordingly, the resolution can be further improved.

The chemically-amplified negative resist composition can further comprise (D) a crosslinking agent.

With such a chemically-amplified negative resist composition, the dissolution rate of an exposed portion is further reduced, so that a pattern with particularly low LWR and CDU and favorable profile can be obtained.

Moreover, the present invention provides a resist patterning process using the above-described chemically-amplified negative resist composition, comprising steps of:

forming a resist film by using the inventive chemically-amplified negative resist composition on a substrate to be processed;

irradiating the resist film with a high energy beam to form a pattern; and developing the resist film by using an alkaline developer.

The inventive resist patterning process makes it possible to form a favorable resist pattern with high sensitivity, low LWR in an L/S pattern, low CDU in a dot pattern, and little top loss.

In this event, the high energy beam is preferably an electron beam or an extreme ultraviolet ray with a wavelength of 3 to 15 nm.

The inventive resist composition is suitable for fine patterning particularly with electron beam (EB) and extreme ultraviolet ray (EUV) among high energy beams, and can form a resist pattern having lower LWR and CDU and favorable profile.

Advantageous Effects of Invention

The sulfonium salt (A) constituting the inventive chemically-amplified negative resist composition has high molecular weight due to iodine, so that it is characterized in that the acid diffusion is small. Further, since iodine considerably absorbs EUV at a wavelength of 13.5 nm, secondary electrons generated from iodine during exposure move to a strong-acid generator and promote the decomposition of protective group, so that high sensitivity is achieved. Furthermore, iodine atoms have a low affinity to an alkaline developer and lower the solubility thereto, so that a negative pattern formed using the inventive negative resist composition is less dissolved in a developer than negative patterns formed using conventional negative resist compositions are. Accordingly, a pattern with little top loss and favorable profile can be formed. Moreover, the base polymer (B) also has adequate solubility in alkali and high dissolution contrast. These make it possible to construct a resist with high sensitivity, low LWR, low CDU, and favorable profile. These effects cannot be obtained solely from the sulfonium salt (A) or the base polymer (B), but can be obtained only when the two are combined.

BRIEF DESCRIPTION OF DRAWINGS

FIG. 1 is a graph showing a relation between exposure dose and film remaining percentage.

DESCRIPTION OF EMBODIMENTS

The present inventors have earnestly studied to achieve the above object and consequently found that when a certain carboxylic acid onium salt is combined with a specific base polymer, it is possible to obtain a negative resist composition which exhibits high sensitivity, little top loss, and low LWR and CDU. This finding has led to the completion of the present invention.

Specifically, the present invention is a chemically-amplified negative resist composition comprising:

(A) a quencher containing an onium salt shown by a formula (A-1) to be described below;

(B) a base polymer containing repeating units shown by formulae (B1) and (B2) to be described below; and (C) a photo-acid generator which generates an acid.

Hereinafter, the present invention will be described in detail, but the present invention is not limited thereto.

[Chemically-Amplified Negative Resist Composition]

The inventive resist composition is characterized by including essential components of:

(A) a quencher containing an onium salt (carboxylic acid sulfonium salt) shown by the following formula (A-1);

(B) a base polymer containing repeating units shown by the following formulae (B1) and (B2); and (C) a photo-acid generator which generates an acid.

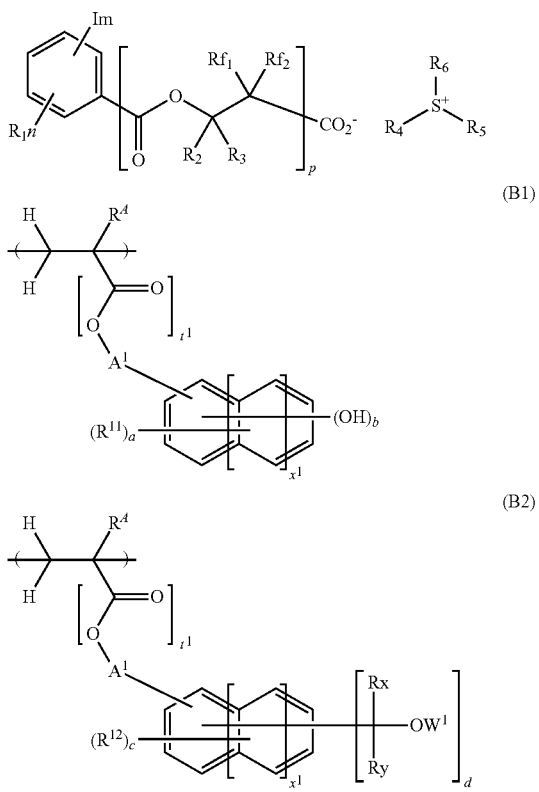

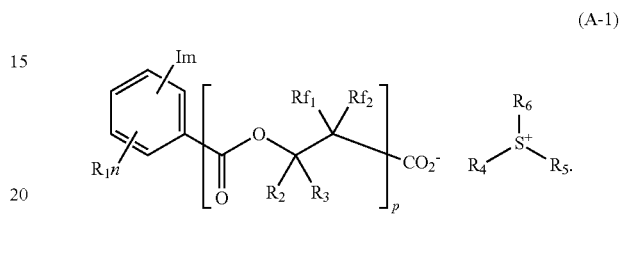

The carboxylic acid sulfonium salt in (A) is an acid generator that generates an iodinated carboxylic acid upon light irradiation, but functions as a quencher for the following reason.

When a mixture of the carboxylic acid sulfonium salt (A-1) in (A) with an acid generator, which generates a strong acid including super strong acid such as perfluoroalkylsulfonic acid, is irradiated with light, a carboxylic acid derived from (A-1) and a strong acid (such as a perfluoroalkylsulfonic acid) are generated. Since the acid generator is not completely decomposed, an undecomposed acid generator exists nearby. Here, for example, when the carboxylic acid sulfonium salt (A-1) and the perfluoroalkylsulfonic acid coexist, first, the perfluoroalkylsulfonic acid undergoes ion exchange with the sulfonium salt (A-1), and a perfluoroalkylsulfonic acid sulfonium salt is formed, while the carboxylic acid is released. This is because the perfluoroalkylsulfonic acid salt with high acidity is more stable. Meanwhile, even when the perfluoroalkylsulfonic acid sulfonium salt and the carboxylic acid exist together, no ion exchange takes place. The resulting carboxylic acid hardly contributes to the deprotection reaction of the base polymer, so that the carboxylic acid sulfonium salt in (A) function as a quencher. Similar ion exchanges occur not only with the perfluoroalkylsulfonic acid but also with arylsulfonic acid, alkylsulfonic acid, imide acid, methide acid, and the like which have higher acidity (lower pKa) than the iodinated carboxylic acid.

The iodinated carboxylic acid has a higher molecular weight than unsubstituted carboxylic acid, and thus the ability to suppress the acid diffusion is high. Moreover, iodine greatly absorbs EUV with a wavelength of 13.5 nm and thereby generates secondary electrons during exposure. The energy of the secondary electrons is transferred to the acid generator and promotes the decomposition, thereby leading to high sensitivity. This effect is particularly high when the number of iodine atoms substituted therewith is 2 or more.

[(A) Quencher]

The inventive chemically-amplified negative resist composition includes a quencher containing an onium salt (sulfonium compound) shown by the following formula (A-1) as the component (A):

In the formula, $R_1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, $-NR_7-C(=O)-R_8$, or $-NR_7-C(=O)-O-R_8$. $R_7$ represents a hydrogen atom or a linear, branched, or cyclic alkyl group having 1 to 6 carbon atoms optionally containing a halogen atom, a hydroxy group, an alkoxy group, an acyl group, or an acyloxy group. $R_8$ represents a linear, branched, or cyclic alkyl group having 1 to 16 carbon atoms or alkenyl group having 2 to 16 carbon atoms, or an aryl group having 6 to 12 carbon atoms, and optionally contains a halogen atom, a hydroxy group, an alkoxy group, an acyl group, or an acyloxy group. $R_2$ and $R_3$ each represent a hydrogen atom or a linear, branched, or cyclic alkyl group having 1 to 20 carbon atoms. $Rf_1$ and $Rf_2$ each independently represent a hydrogen atom, a fluorine atom, or a trifluoromethyl group. $R_4$, $R_5$, and $R_6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, while carbon atoms of these groups are optionally interposed by an ether group, an ester group, a carbonyl group, a carbonate group, or a sulfonic acid ester group. $R_4$ and $R_5$ optionally bond with each other to form a ring with a sulfur atom bonded to $R_4$ and $R_5$. "m" represents an integer of 1 to 5. "n" represents an integer satisfying $0 \leq n \leq 5-m$. "p" represents an integer of 0 or 1.

Preferable examples of hydrocarbon portions of the alkyl group, the alkoxy group, and the acyloxy group at $R_1$ include a methyl group, an ethyl group, a propyl group, an isopropyl group, an n-butyl group, a sec-butyl group, a tert-butyl group, an n-pentyl group, a tert-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, an adamantyl group, and the like.

Preferable examples of hydrocarbon portions of the alkyl group, the alkoxy group, the acyl group, and the acyloxy group at $R_7$ and hydrocarbon portions of the alkyl group, the alkoxy group, the acyl group, and the acyloxy group at $R_8$ include the aforementioned hydrocarbon groups having corresponding carbon atoms.

Preferable examples of the alkenyl group and the aryl group at $R_8$ include a vinyl group, an allyl group, a butenyl group, a phenyl group, a naphthyl group, an anthracenyl group, a tolyl group, a xylyl group, and the like.

Examples of the alkyl group at $R_2$ and $R_3$ include those aforementioned for $R_1$.

$Rf_1$ and $Rf_2$ are each independently a hydrogen atom, a fluorine atom, or a trifluoromethyl group. Both $Rf_1$ and $Rf_2$ are preferably hydrogen atoms, fluorine atoms, or trifluoromethyl groups simultaneously.

Examples of hydrocarbon portions of the alkyl group, the oxoalkyl group, the alkenyl group, the oxoalkenyl group, and the aryl group at $R_4$, $R_5$, and $R_6$ include those aforementioned for $R_1$. Examples of hydrocarbon portions of the aralkyl group and the aryloxoalkyl group thereat include a benzyl group, a phenethyl group, a phenylpropyl group, a diphenylmethyl group, and the like.

"m" is an integer of 1 to 5. "n" is an integer satisfying 0≤n≤5−m. "p" is an integer of 0 or 1.

Preferably, "m" is an integer of 1 to 3, "n" is an integer of 1 or 2, and "p" is an integer of 0 or 1.

Examples of the anion moiety of the sulfonium salt shown by the formula (A-1) include ones shown below, but are not limited thereto.

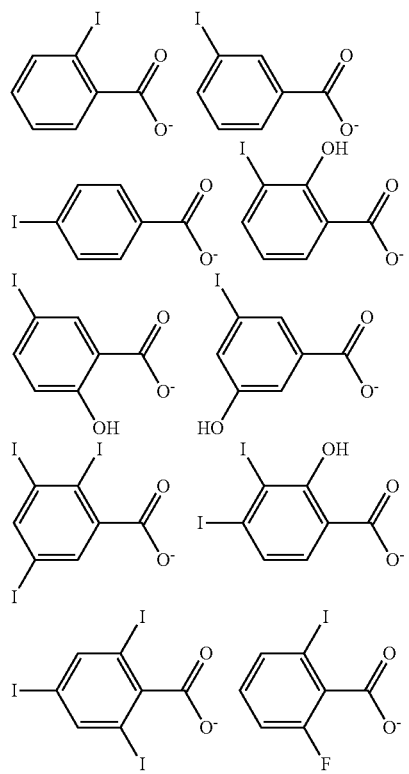

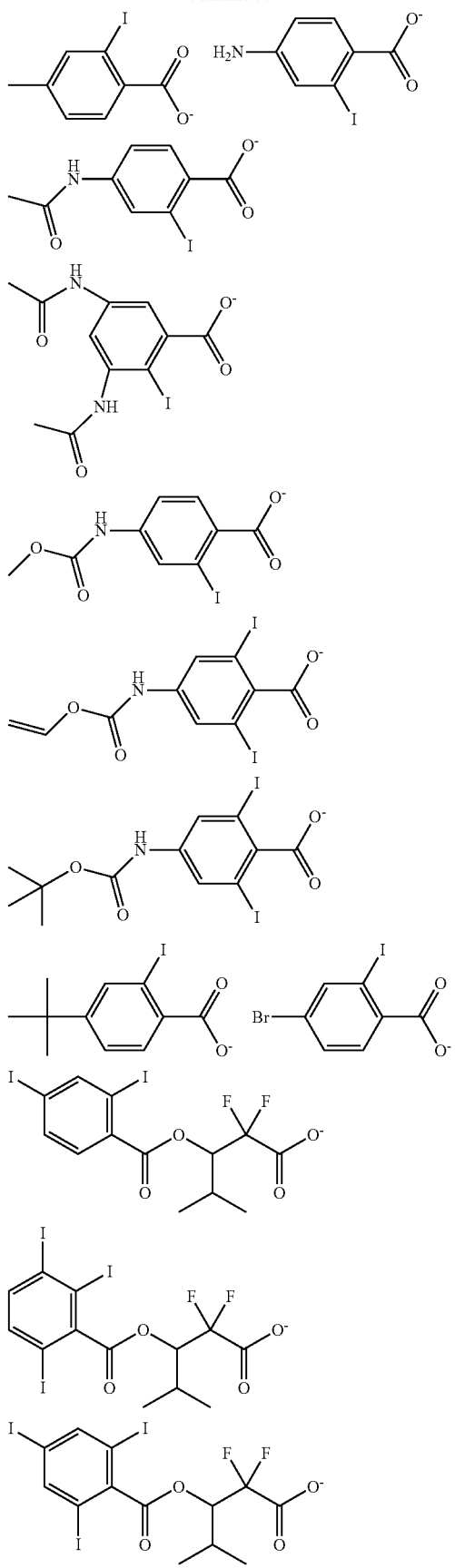

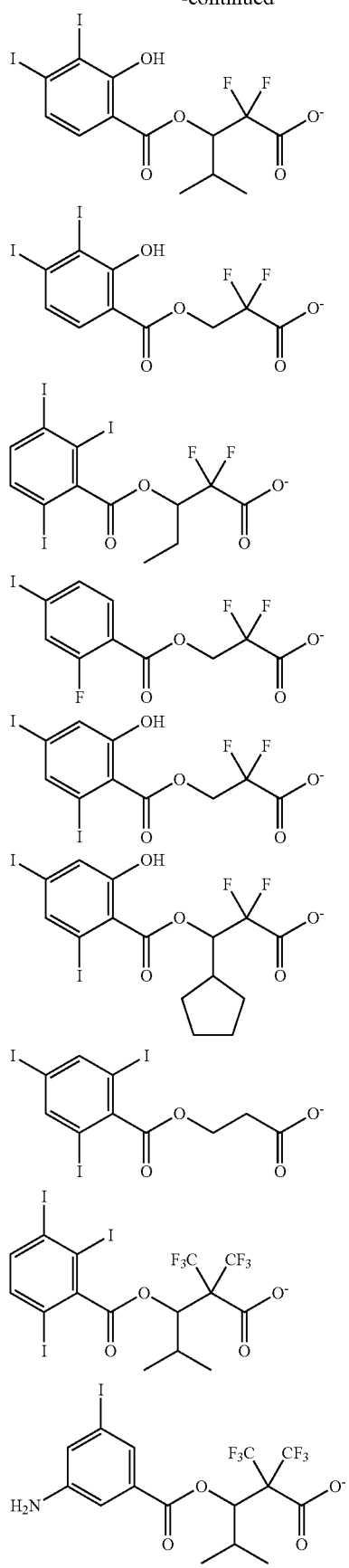
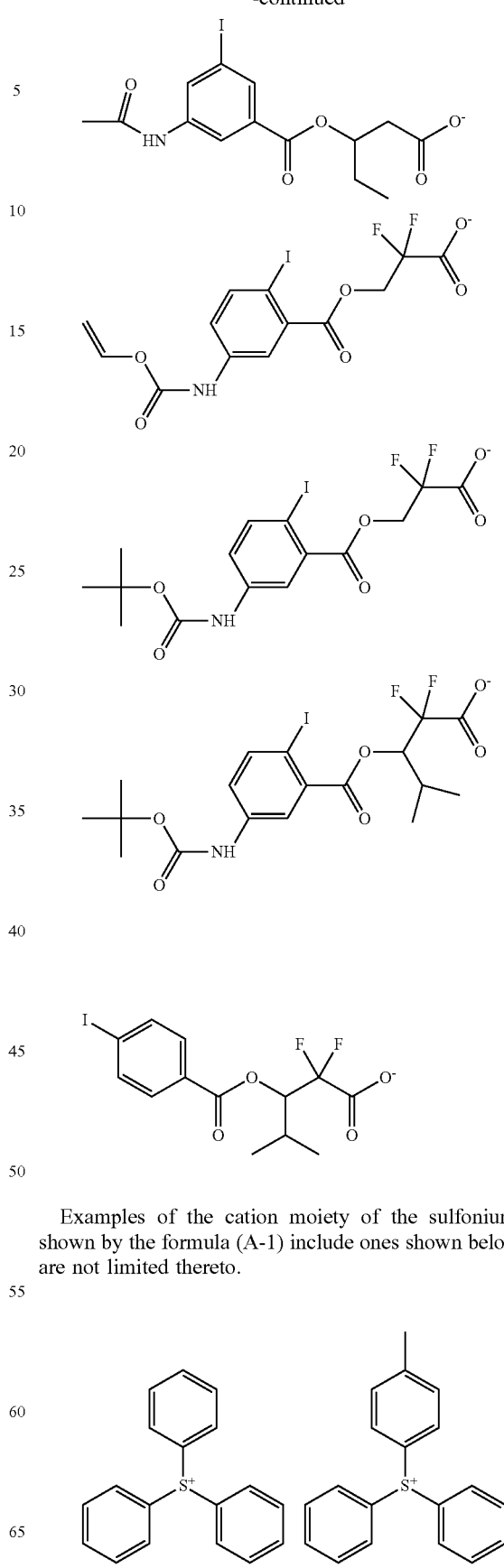
Examples of the cation moiety of the sulfonium salt shown by the formula (A-1) include ones shown below, but are not limited thereto.
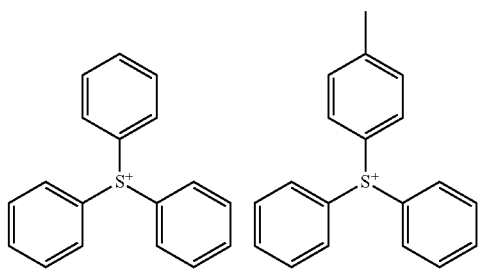

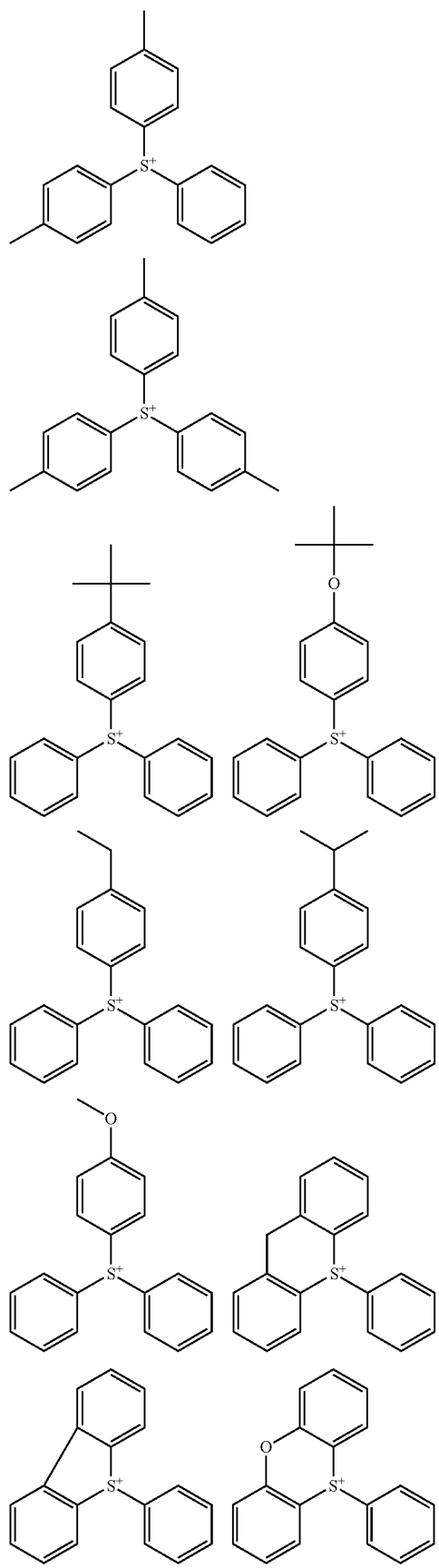
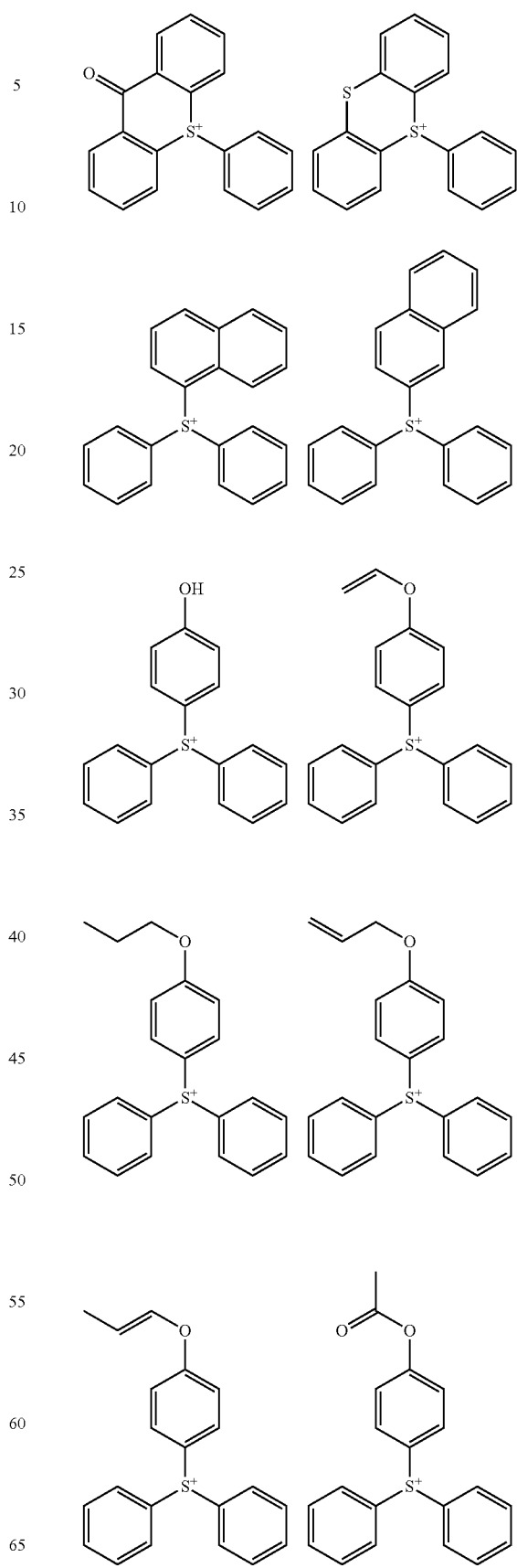

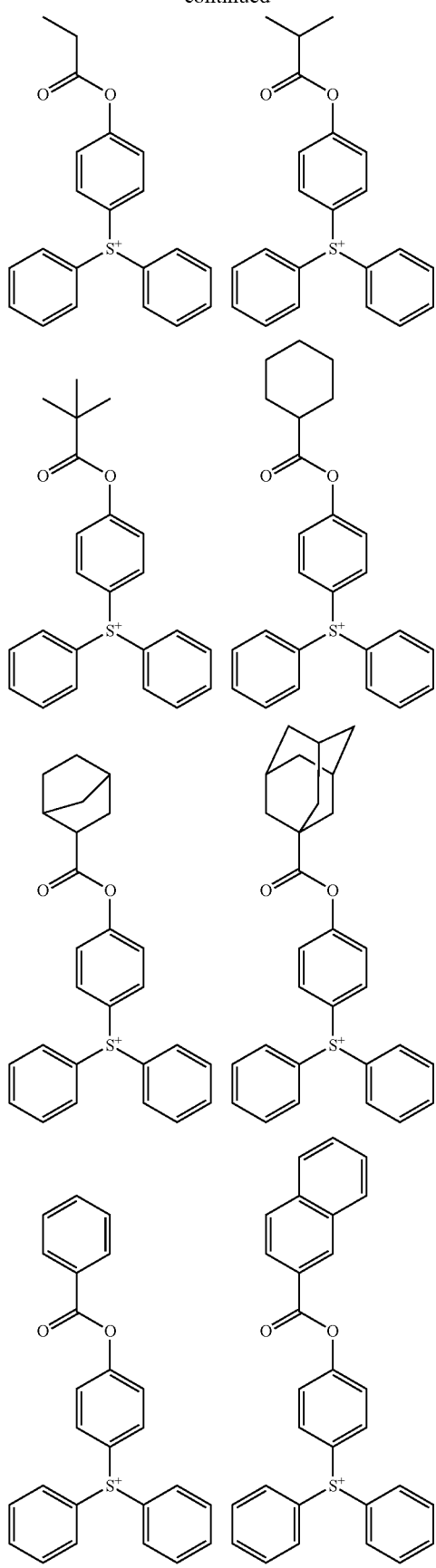
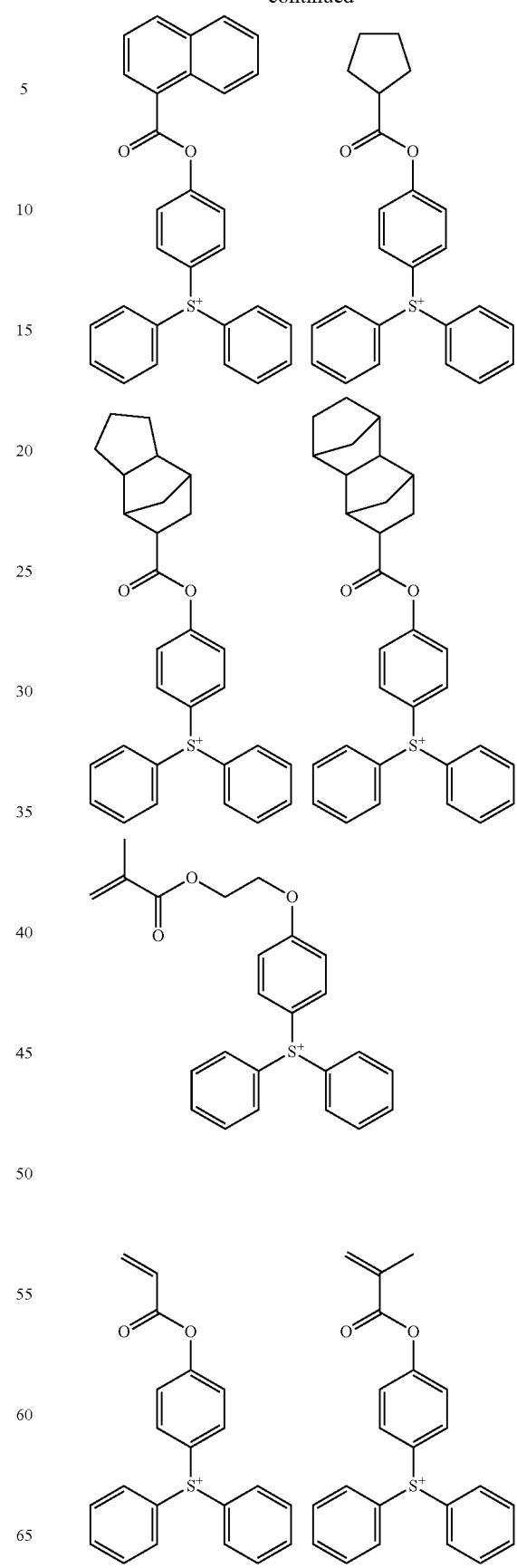

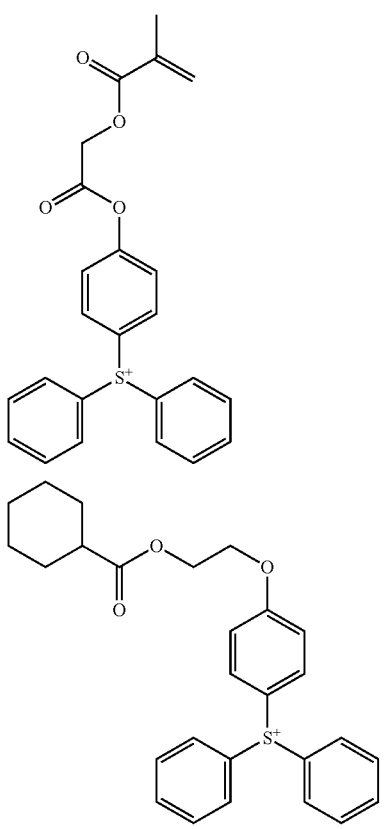
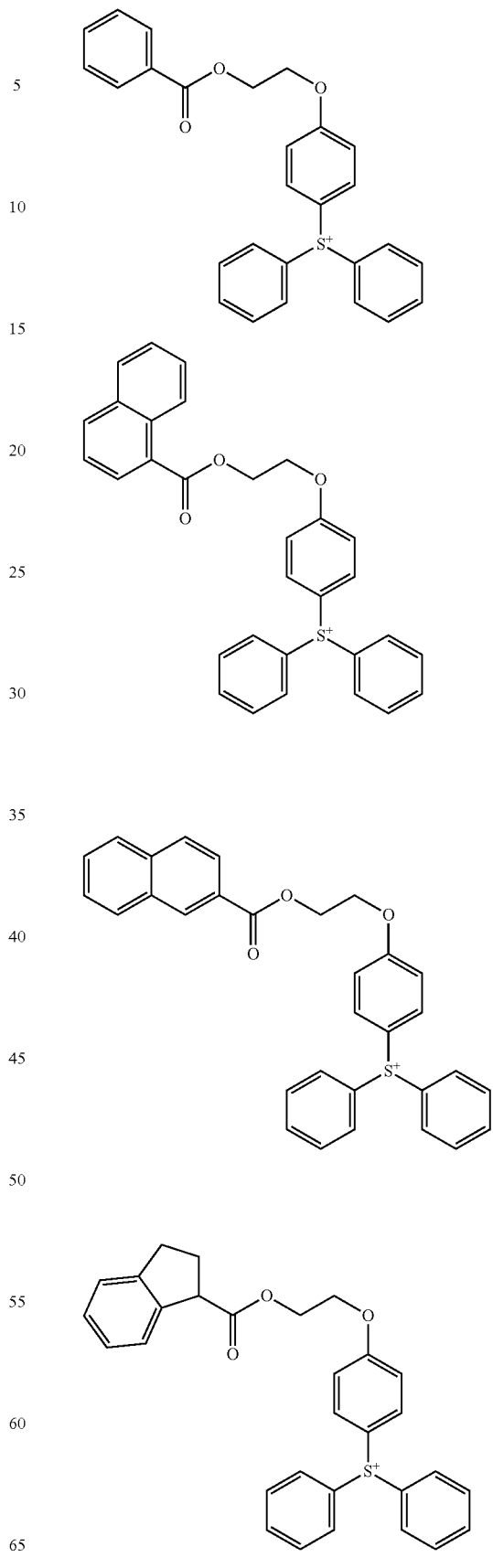

19
-continued
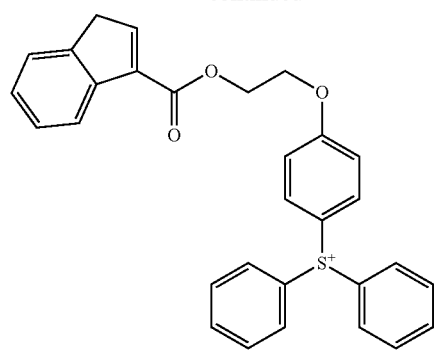
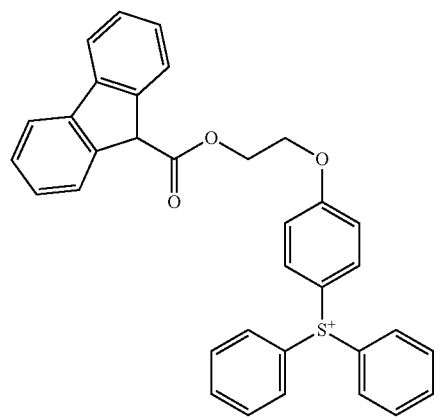
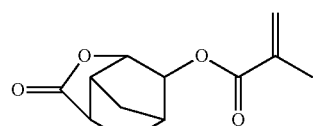
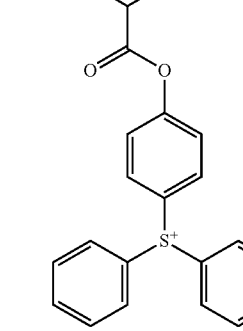
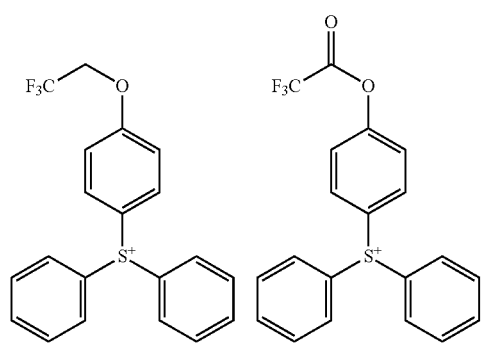
20
-continued
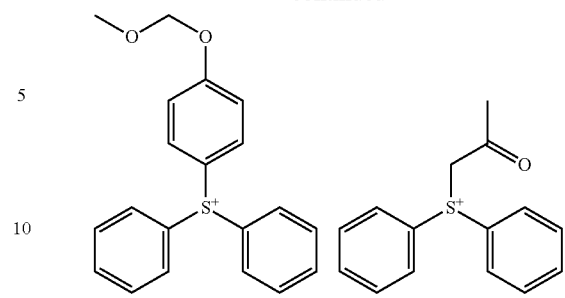
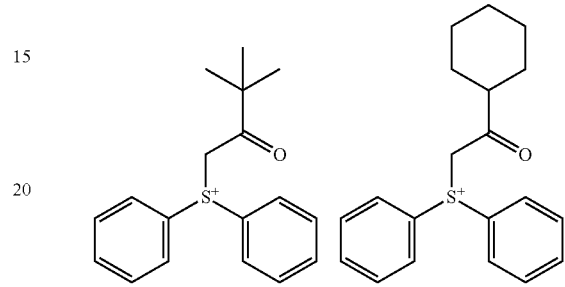
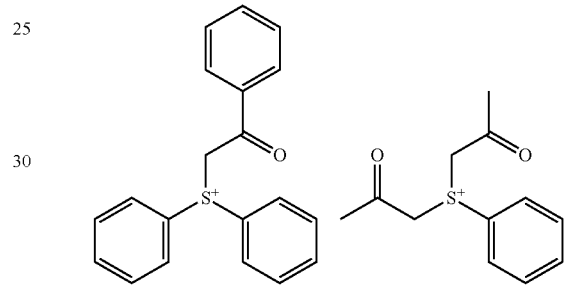
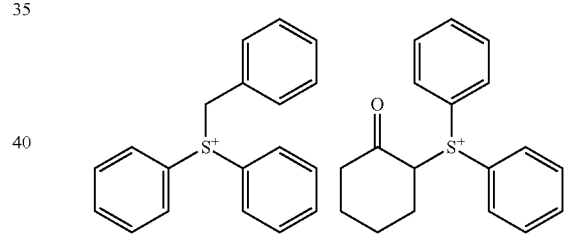
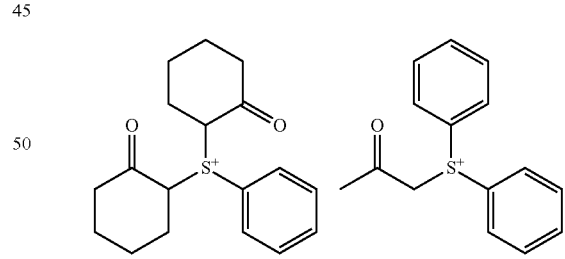
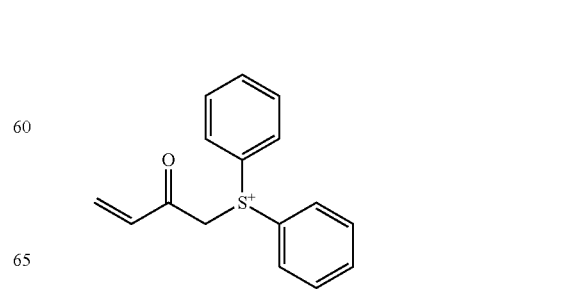

-continued
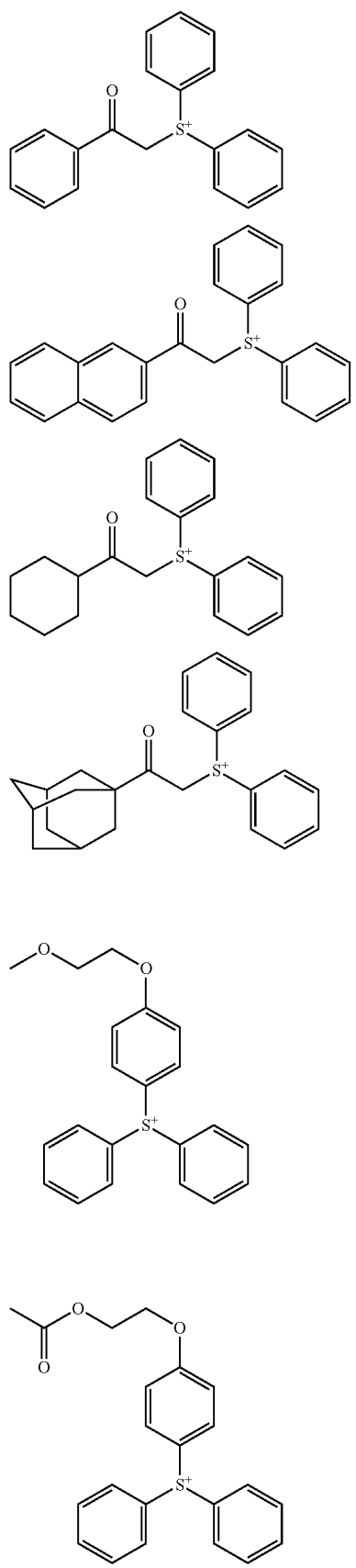
-continued
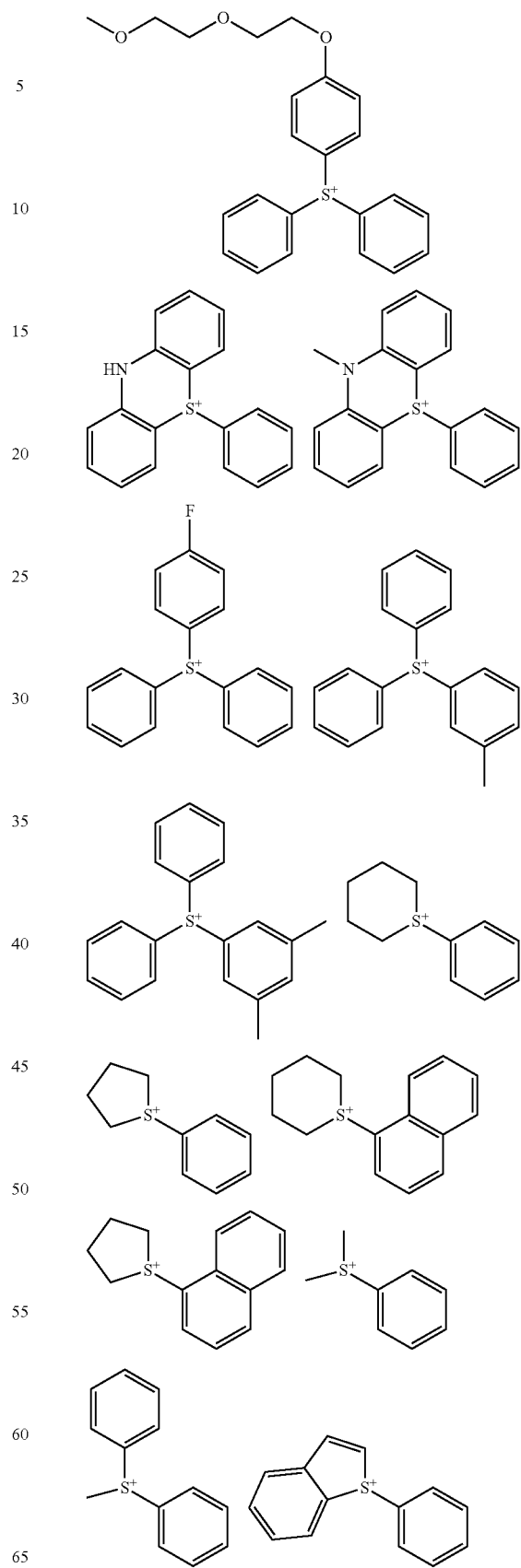

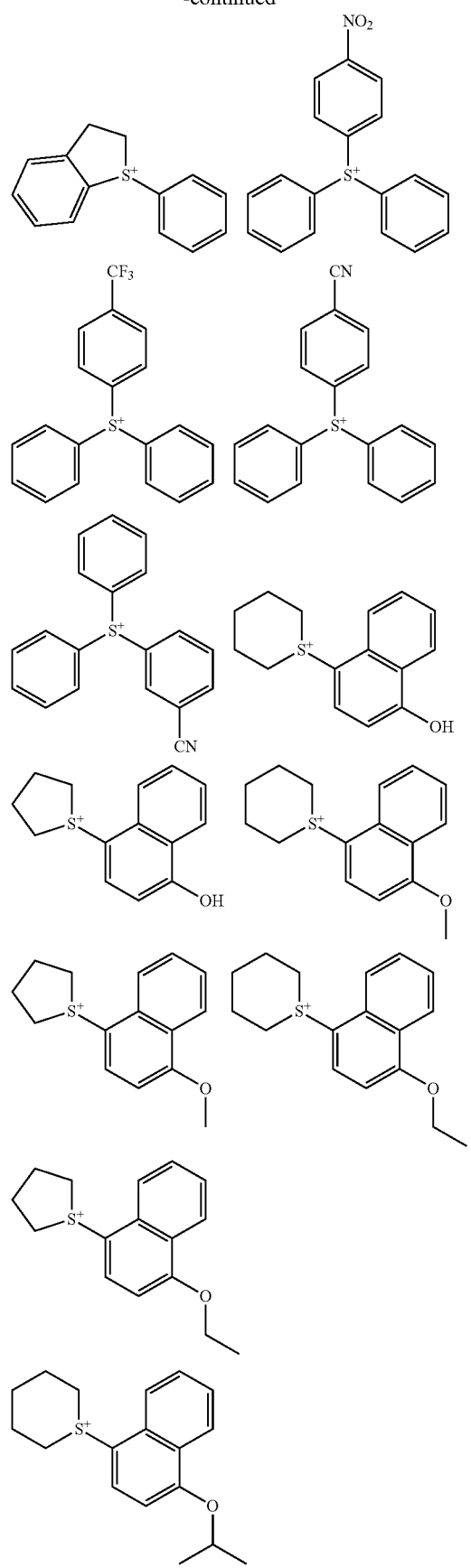
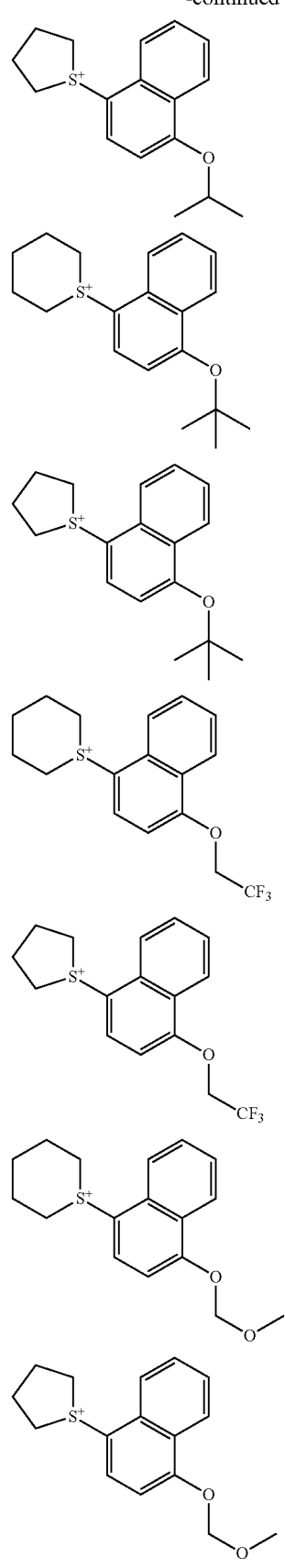

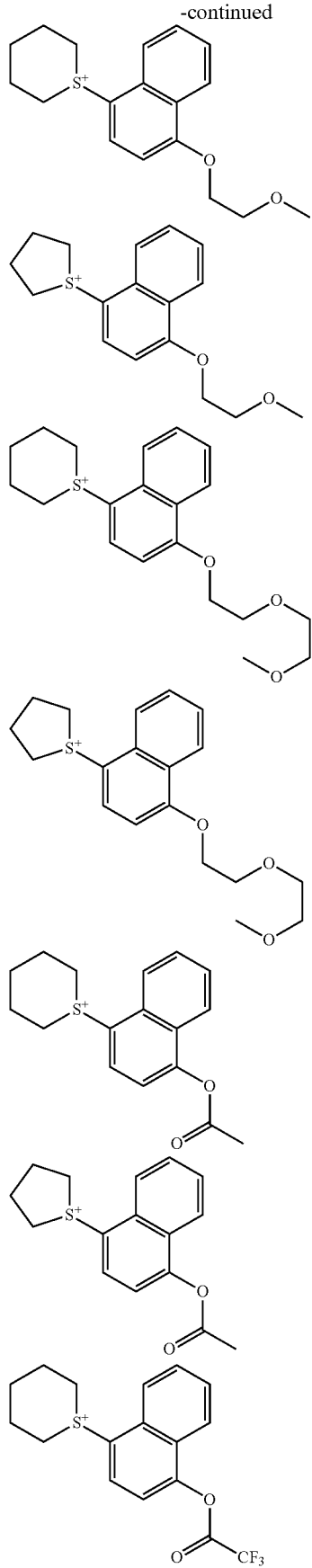
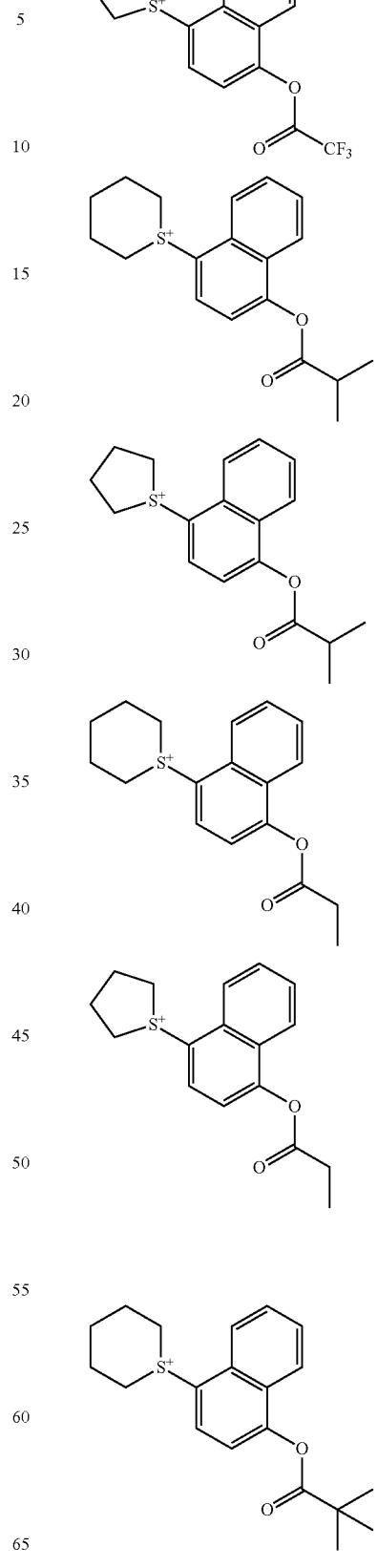

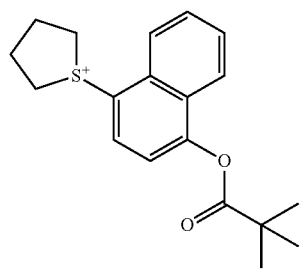
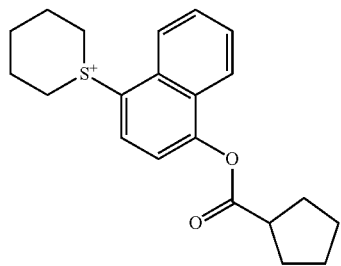
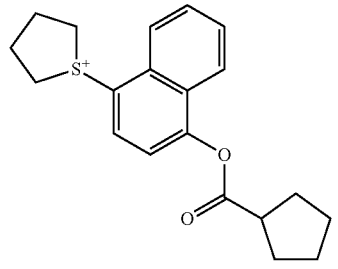
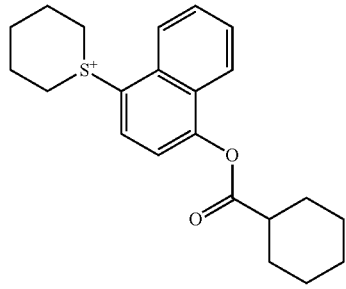
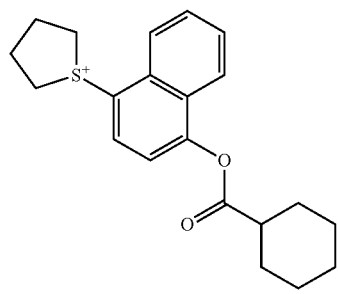
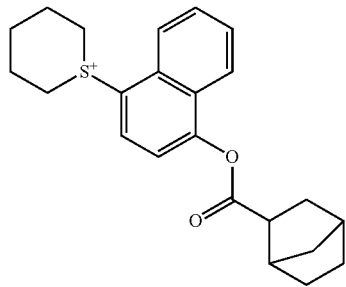
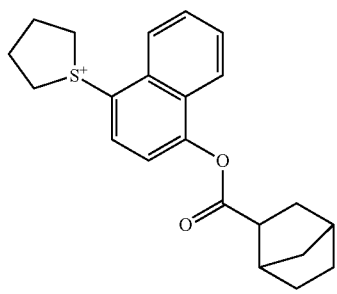
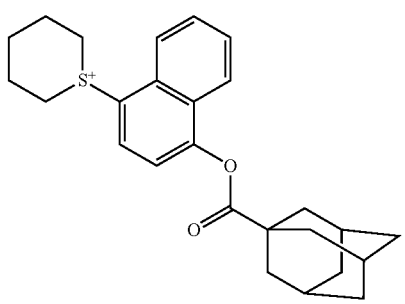
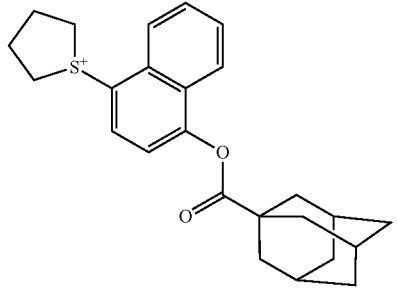
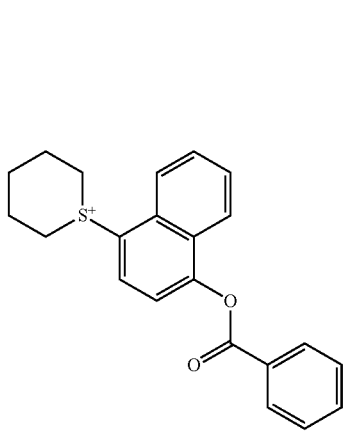
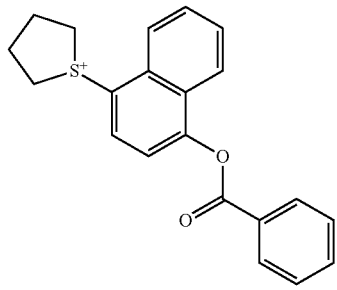

29
-continued
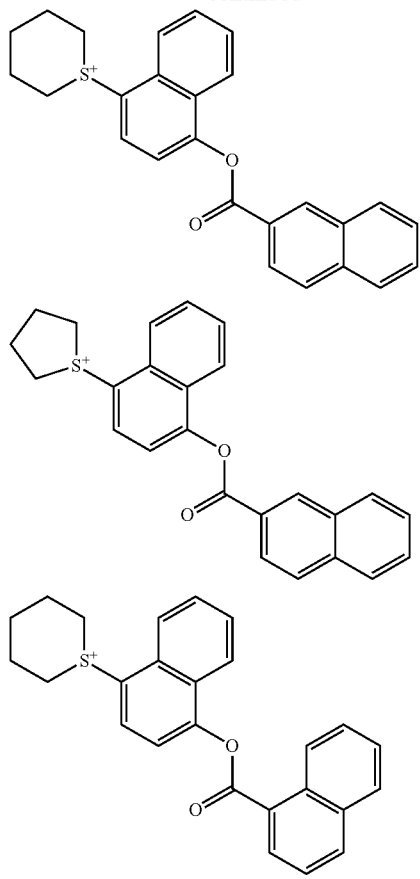
30
-continued
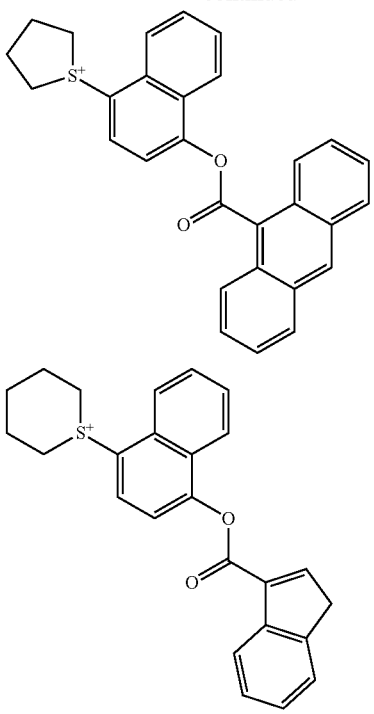
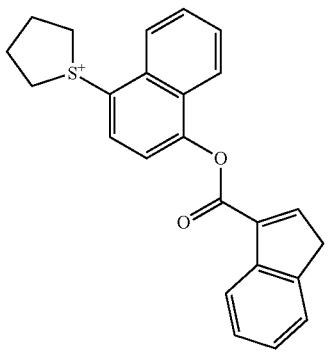
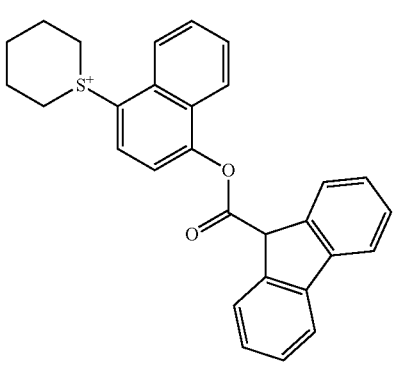

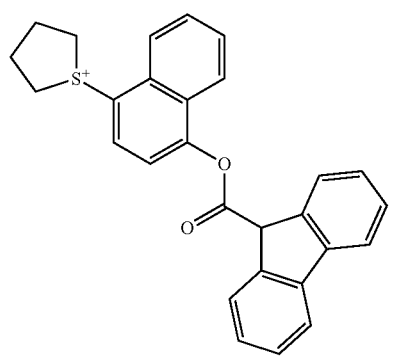
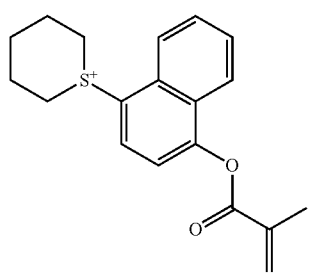
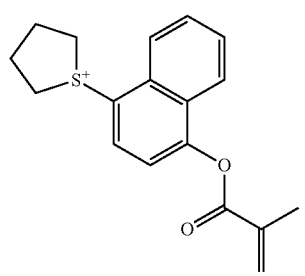
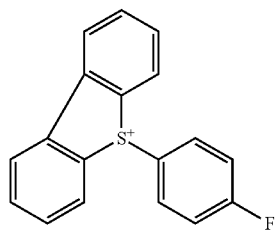
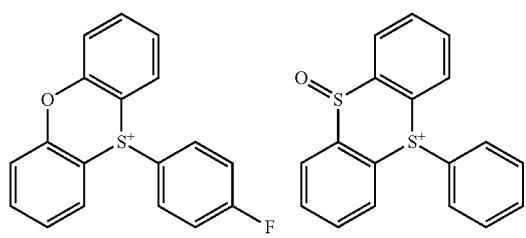
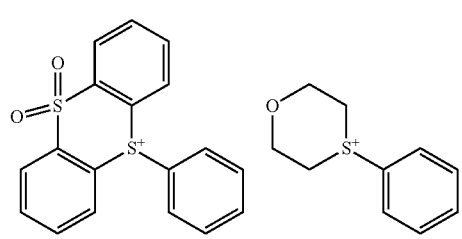
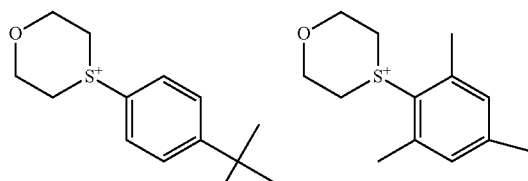
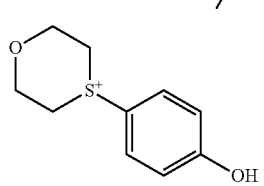
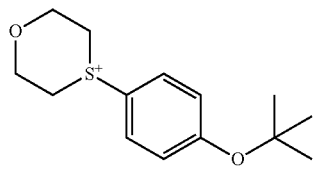
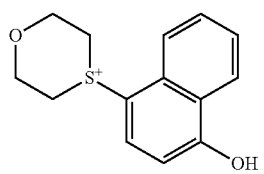
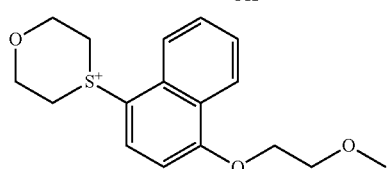
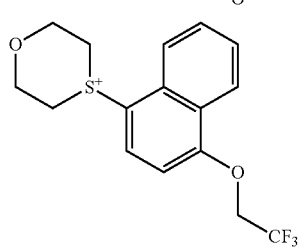
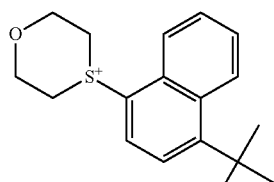
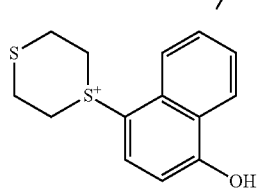
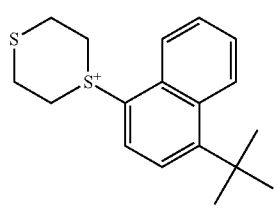

33
-continued
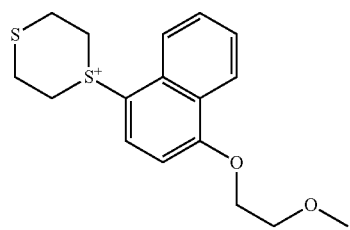
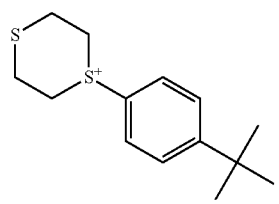
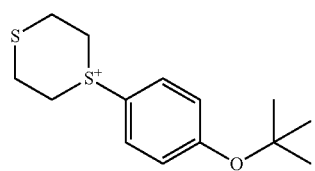
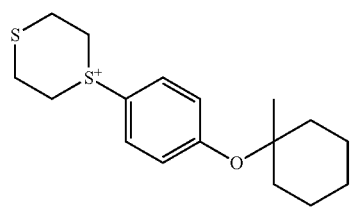
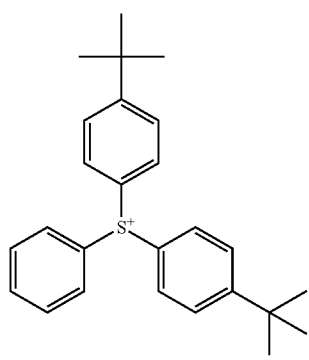
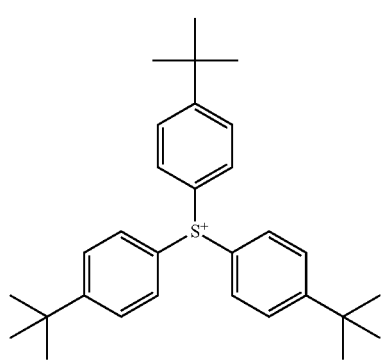
34
-continued
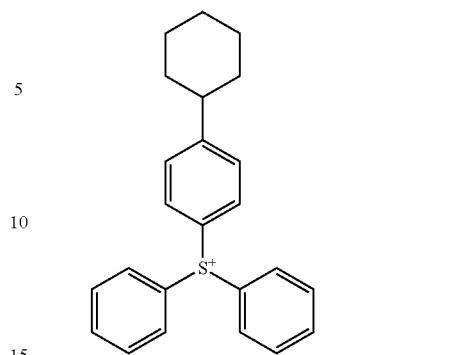
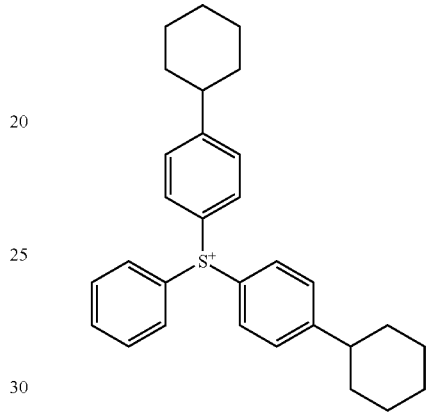
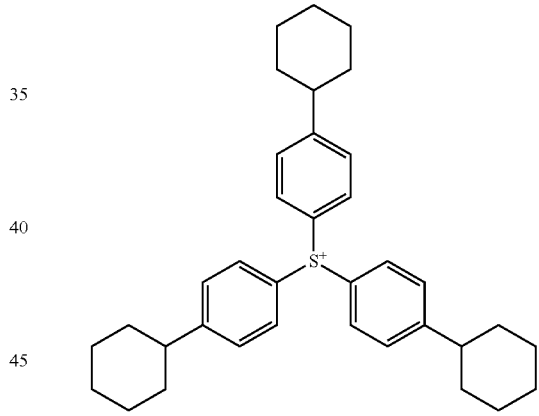
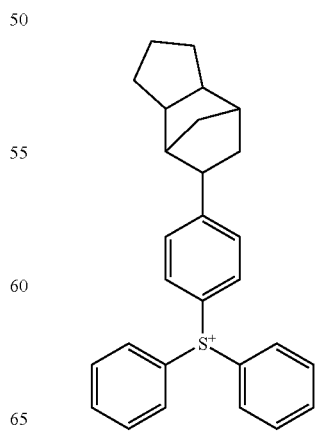

35
-continued
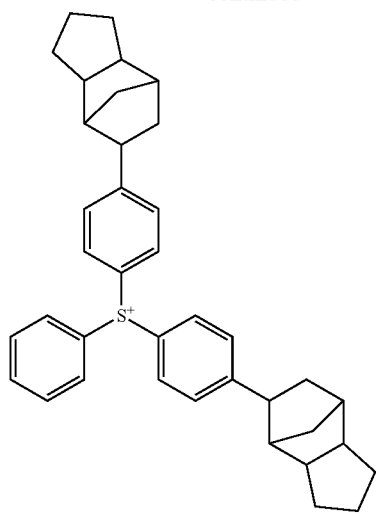
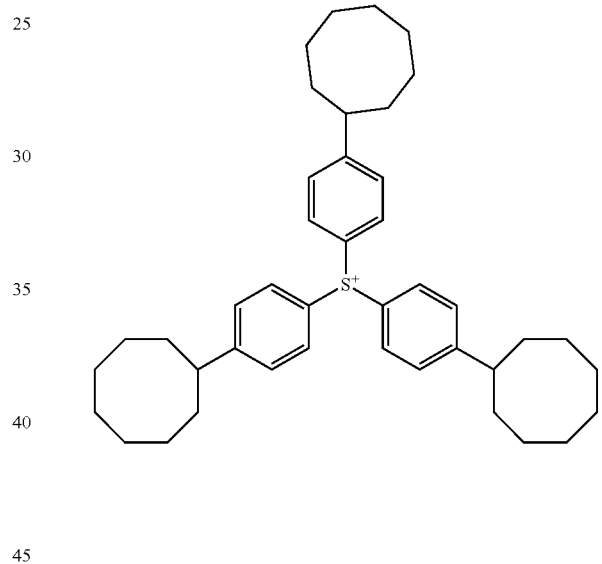
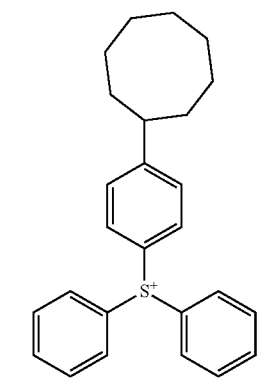
36
-continued
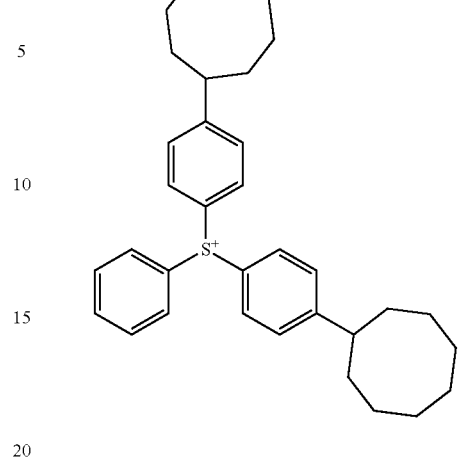
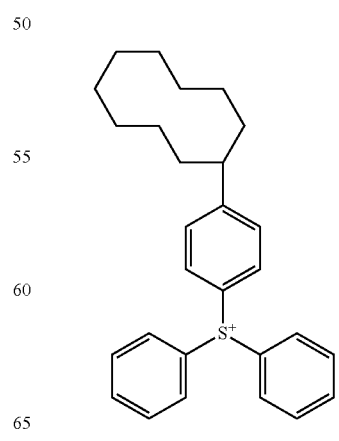

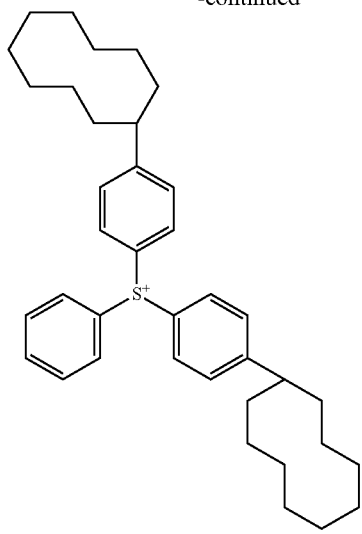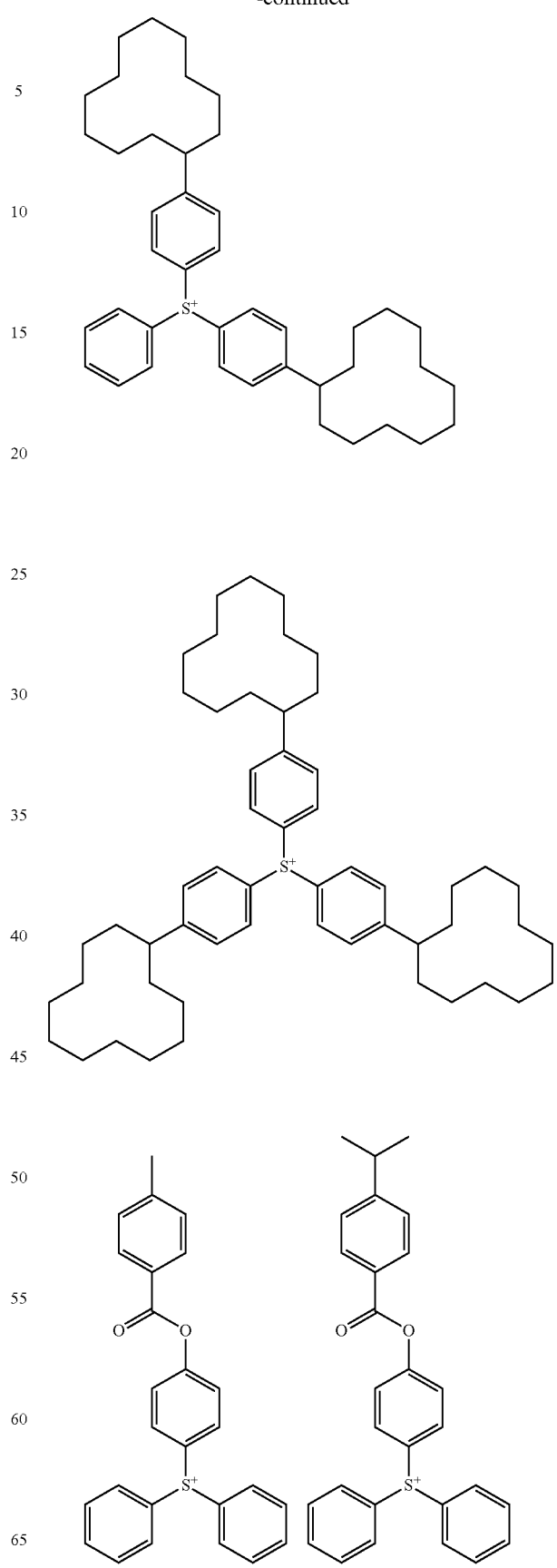

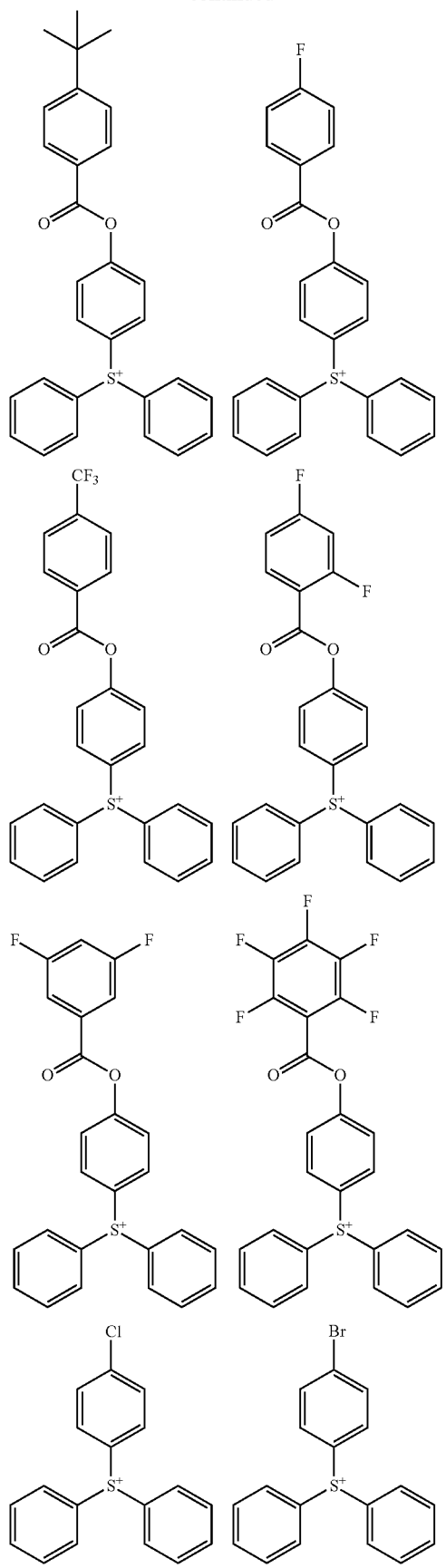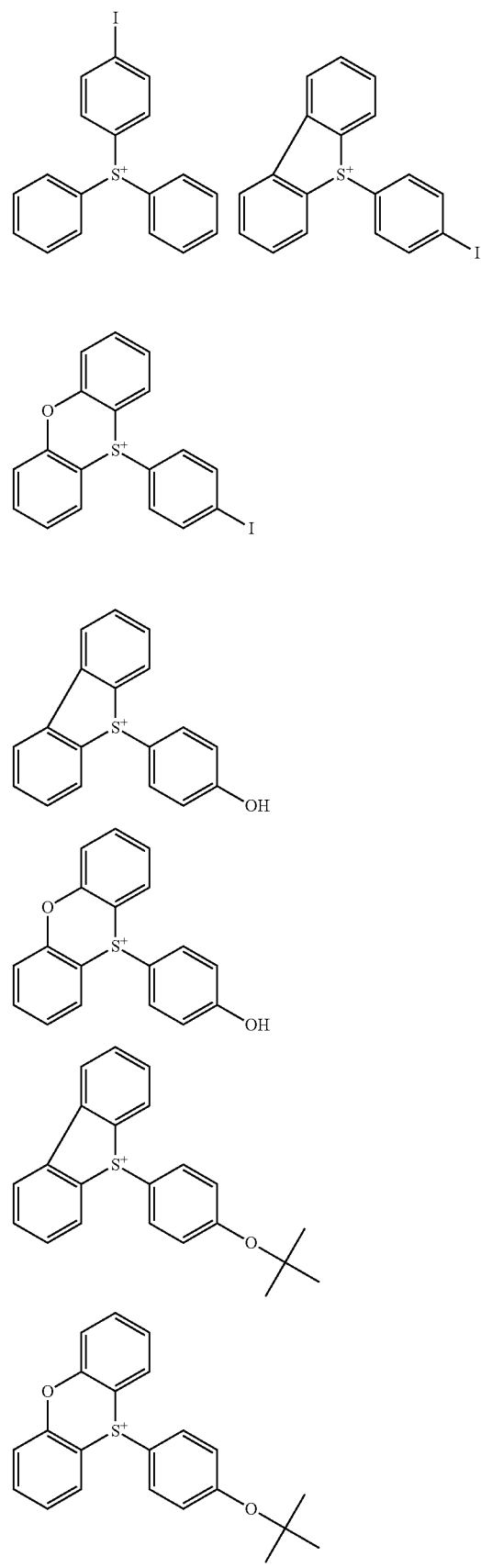

-continued

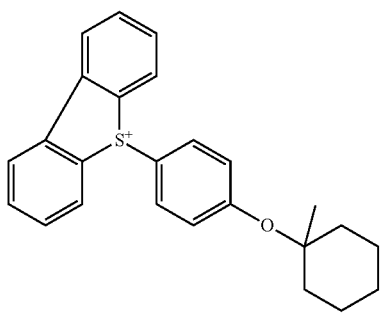
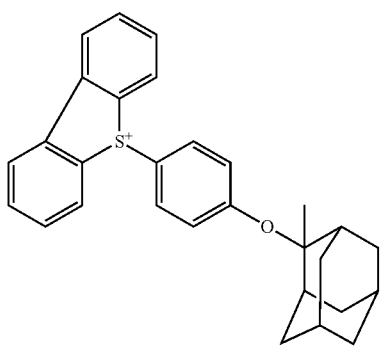
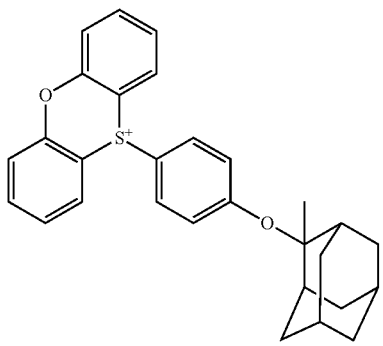
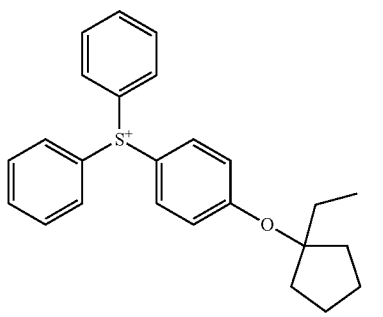
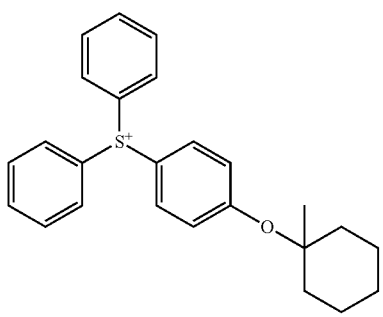

-continued

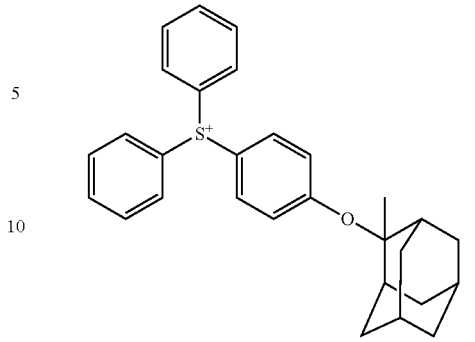
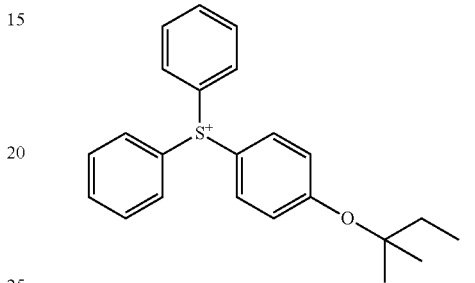
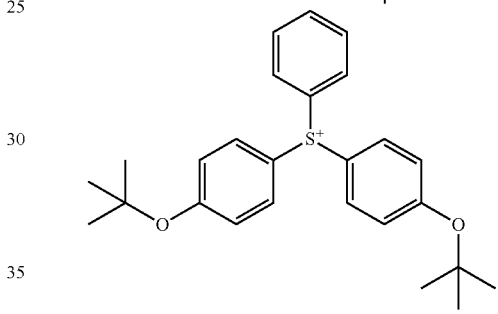
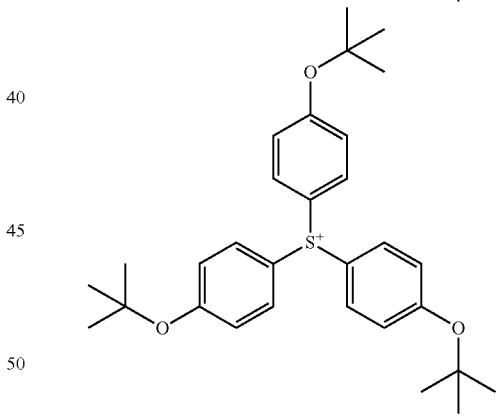

The inventive resist material contains the sulfonium salt shown by the formula (A-B) in an amount of preferably 0.01 to 100 parts by mass, more preferably 0.05 to 50 parts by mass, based on 100 parts by mass of the base polymer described below, from the viewpoints of sensitivity and the effect of suppressing acid diffusion.

[(B) Base Polymer]

The base polymer (B) contained in the inventive negative resist composition is a polymer (hereinafter also referred to as polymer B) containing a repeating unit shown by the following formula (B1) (hereinafter also referred to as repeating unit B1) and a repeating unit shown by the following formula (B2) (hereinafter also referred to as repeating unit B2). The repeating unit B1 is a repeating unit which imparts etching durability, adhesion to a substrate, and solubility to an alkaline developer. The repeating unit B2 is a repeating unit in which the acid-eliminable group leaves (elimination reaction) by action of an acid generated from the acid generator upon irradiation with high energy beam, thereby inducing alkali insolubilization and crosslinking reaction between polymers. By the action of the repeating unit B2, the negative reaction can more efficiently proceed, thus making it possible to improve the resolution.

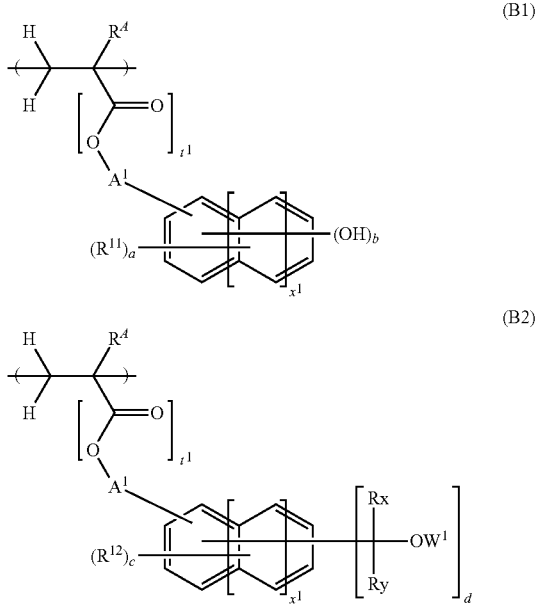

In the formulae, $R^4$ represents a hydrogen atom, a fluorine atom, a methyl group, or a trifluoromethyl group. $R^{11}$'s each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted. $R^{12}$'s each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted.

$A^1$ represents a single bond or a linear, branched, or cyclic alkylene group having 1 to 10 carbon atoms and optionally having an ether bond interposed in a carbon-carbon bond. $W^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond. Rx and Ry each independently represent a hydrogen atom, an alkyl group having 1 to 15 carbon atoms optionally substituted with a hydroxy group or an alkoxy group, or a monovalent aromatic group optionally having a substituent. Nevertheless, not both of Rx and Ry are hydrogen atoms simultaneously. Alternatively, Rx and Ry optionally bond with each other to form a ring with a carbon atom bonded to Rx and Ry. $t^1$ represents 0 or 1. $x^1$ represents an integer of 0 to 2. "a" represents an integer satisfying $0 \leq a \leq 5+2x^1-b$. "c" represents an integer satisfying $0 \leq c \leq 5+2x^1-d$. "b" and "d" each represent an integer of 1 to 3.

Examples of the alkylene group represented by $A^1$ include a methylene group, an ethylene group, a propylene group, a butylene group, a pentylene group, a hexylene group, structural isomers with carbon skeleton having a branched or cyclic structure, and the like. When the alkylene group contains an ether bond and $t^1$ in the formula (B1) is 1, the ether bond may be at any position except for positions between α-carbon and β-carbon with respect to the ester oxygen. Meanwhile, when $t^1$ is 0, the atom bonded to the main chain is the ether oxygen, and a second ether bond may be inserted at any position except for positions between α-carbon and n-carbon with respect to the ether oxygen. Note that the number of carbon atoms of the alkylene group is preferably 10 or less because sufficient solubility to an alkaline developer can be obtained.

Preferable examples of hydrocarbon portions of the acyloxy group, the alkyl group, and the alkoxy group represented by $R^{11}$ and $R^{12}$ include a methyl group, an ethyl group, a propyl group, an isopropyl group, a butyl group, a pentyl group, a hexyl group, structural isomers with carbon skeleton having a branched or cyclic structure, and the like. When the number of carbon atoms in $R^{11}$ and $R^{12}$ is the aforementioned upper limits or less, the solubility to an alkaline developer is favorable.

In the formula (B1), $x^1$ represents an integer of 0 to 2. More specifically, the formula (B1) shows a benzene skeleton when $x^1$ is 0, a naphthalene skeleton when $x^1$ is 1, and an anthracene skeleton when $x^1$ is 2. "a" is an integer satisfying $0 \leq a \leq 5+2x1-b$; when $x^1$ is 0, it is preferable that "a" be an integer of 0 to 3 and "b" be an integer of 1 to 3; and when $x^1$ is 1 or 2, it is preferable that "a" be an integer of 0 to 4 and "b" be an integer of 1 to 3.

In order to obtain high resolution by establishing a high contrast between a portion turned negative by irradiation with high energy beam and a portion not irradiated therewith (portion not turned negative), the lower limit of the content of the repeating unit B1 in all the repeating units constituting the polymer B is preferably 40 mol %, more preferably 50 mol %, while the upper limit is preferably 90 mol %, more preferably 80 mol %.

When $t^1$ is 0 and $A^1$ is a single bond, that is, when the aromatic ring is directly bonded to the main chain of the polymer compound (i.e., no linker), preferable examples of such repeating unit B1 include units derived from 3-hydroxystyrene, 4-hydroxystyrene, 5-hydroxy-2-vinylnaphthalene, 6-hydroxy-2-vinylnaphthalene, and the like.

The examples of the repeating unit B1 in this case include ones shown below, but are not limited thereto.

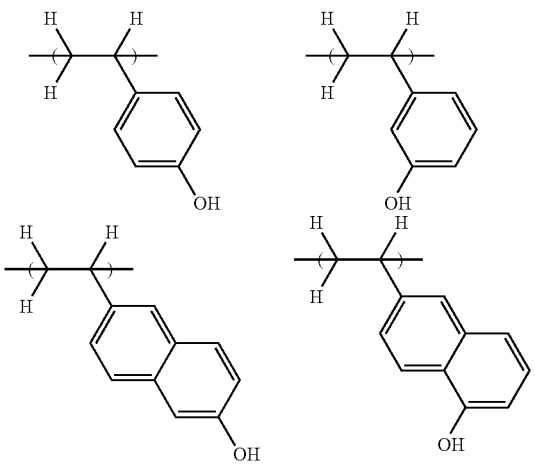

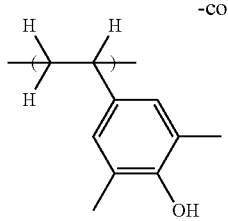
A more preferable example of the repeating unit B1 is a repeating unit shown by the following formula (B5) or the like:
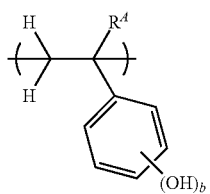
(B5)
where $R^A$ and "b" are as defined above.
Meanwhile, when $t^1$ is 1, in other words, when the repeating unit B1 has an ester skeleton as the linker, preferable examples of the repeating unit B1 include ones shown below, but are not limited thereto.
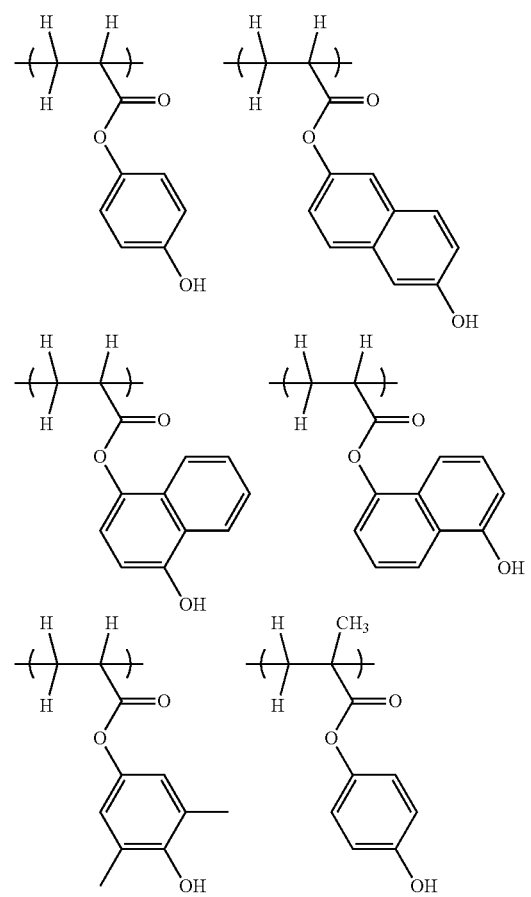
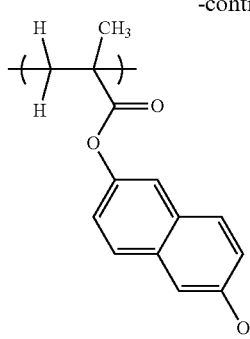
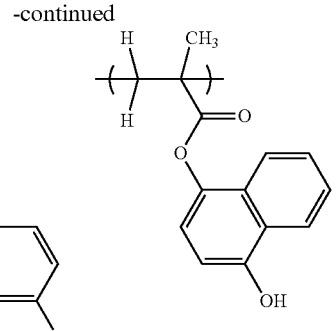
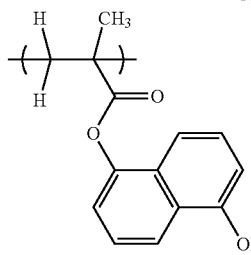
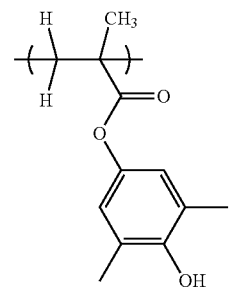
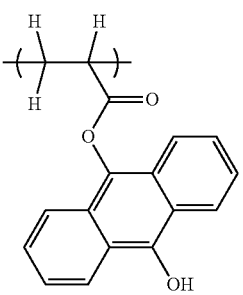
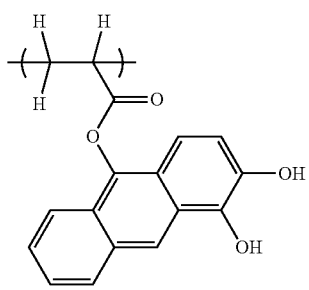
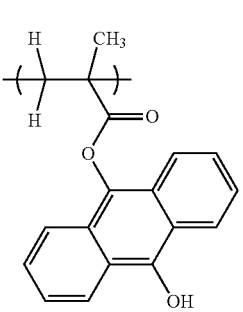
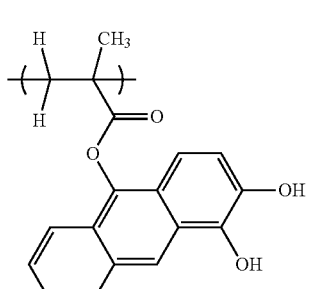
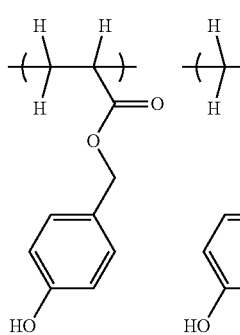
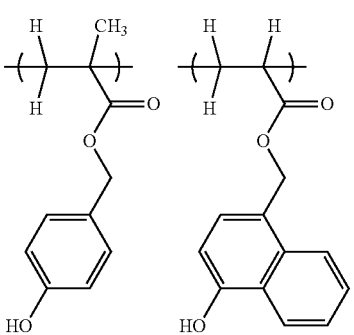

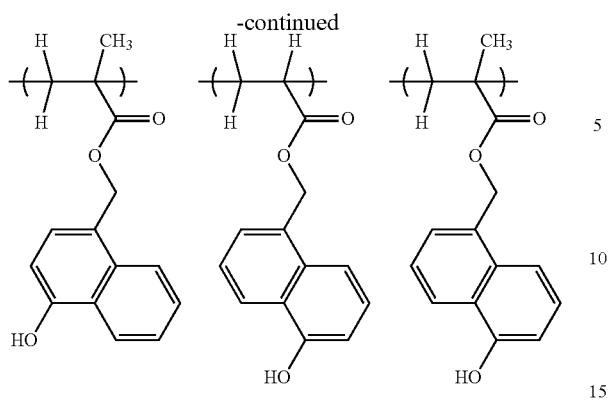

When the repeating unit B2 is irradiated with a high energy beam or the like, the acid-eliminable group undergoes elimination reaction by action of an acid generated from the acid generator, so that the repeating unit induces alkali insolubilization and crosslinking reaction between polymers. Since the repeating unit B2 functions to enable the negative reaction to more efficiently progress, the resolution can be improved.

Examples of the monovalent aromatic group or the aliphatic monovalent hydrocarbon group represented by $W^1$ include a methyl group, an ethyl group, a propyl group, an isopropyl group, a cyclopentyl group, a cyclohexyl group, an adamantyl group, a methylcarbonyl group, a phenyl group, and the like.

Preferable examples of Rx or Ry include a methyl group, an ethyl group, a propyl group, a butyl group, structural isomers thereof, and these groups having some hydrogen atoms substituted with a hydroxy group or an alkoxy group.

$x^1$ represents an integer of 0 to 2. More specifically, the formula (B2) shows a benzene ring when $x^1$ is 0, a naphthalene ring when $x^1$ is 1, and an anthracene ring when $x^1$ is 2.

Examples of the alkylene group represented by $A^1$ include a methylene group, an ethylene group, a propylene group, a butylene group, a pentylene group, a hexylene group, structural isomers with carbon skeleton having a branched or cyclic structure, and the like. When the alkylene group contains an ether bond and $t^1$ in the formula (B2) is 1, the ether bond may be at any position except for positions between α-carbon and β-carbon with respect to the ester oxygen. Meanwhile, when $t^1$ is 0, the atom bonded to the main chain is the ether oxygen, and a second ether bond may be inserted at any position except for positions between α-carbon and n-carbon with respect to the ether oxygen.

The repeating unit B2 is preferably a repeating unit shown by the following formula (B6):

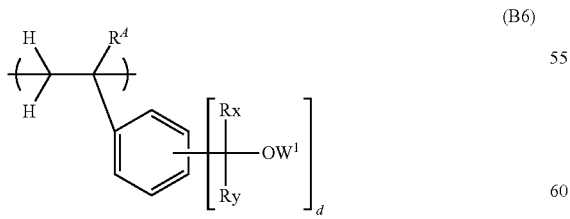
(B6)

where $R^A$, Rx, Ry, $W^1$ and "d" are as defined above.

Preferable examples of the repeating unit B2 include ones shown below, but are not limited thereto. Note that, in the following examples, Me represents a methyl group, and Ac represents an acetyl group.

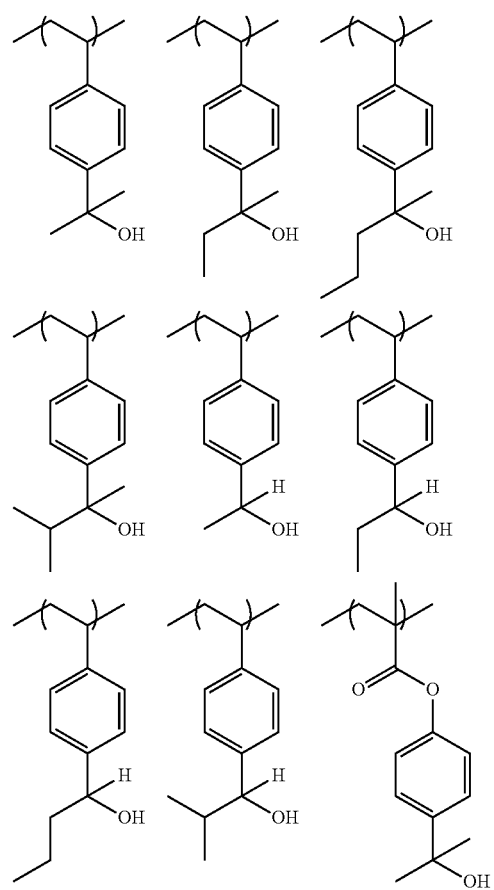

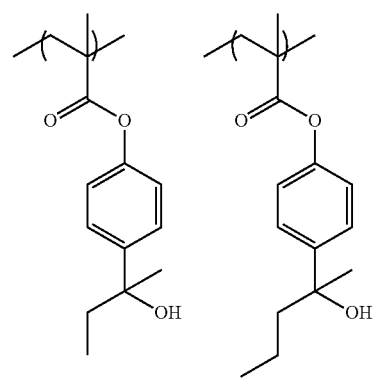

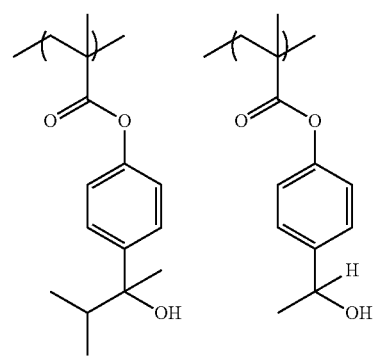

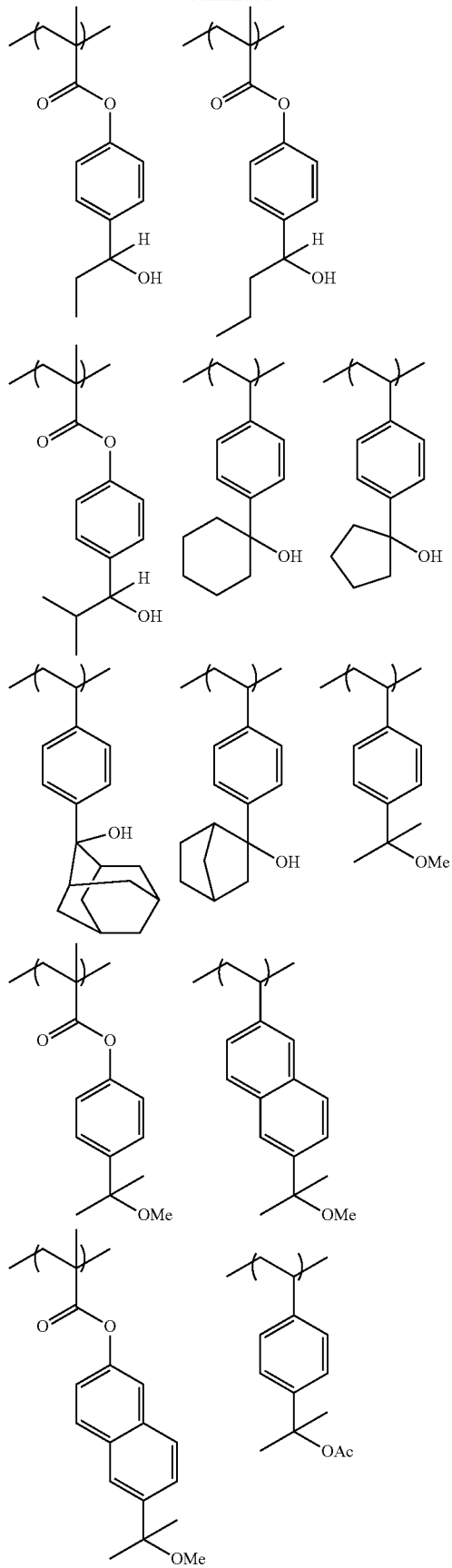
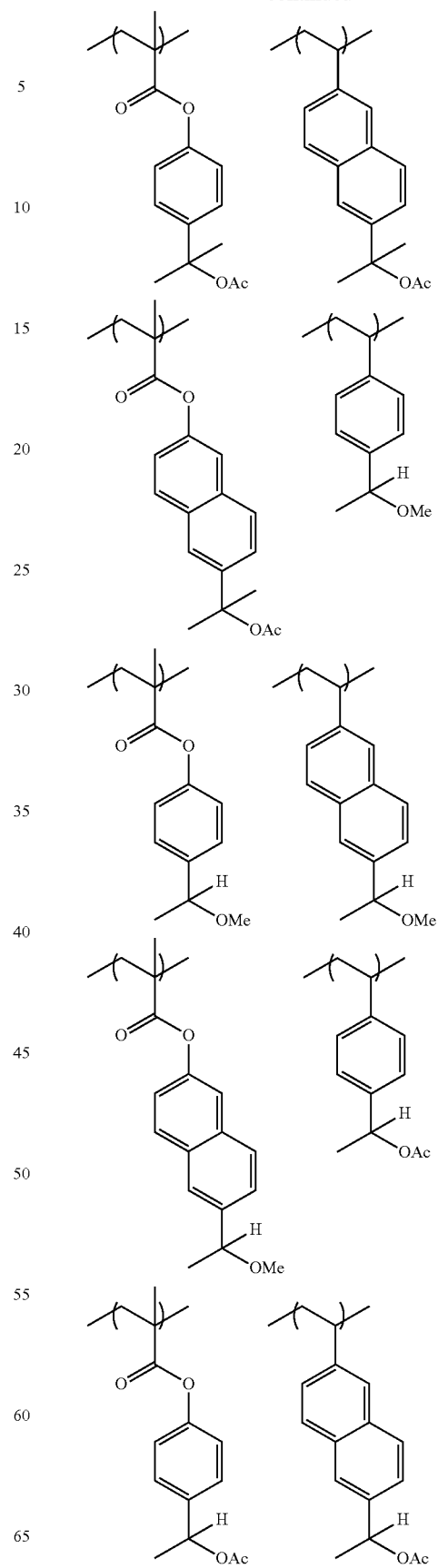

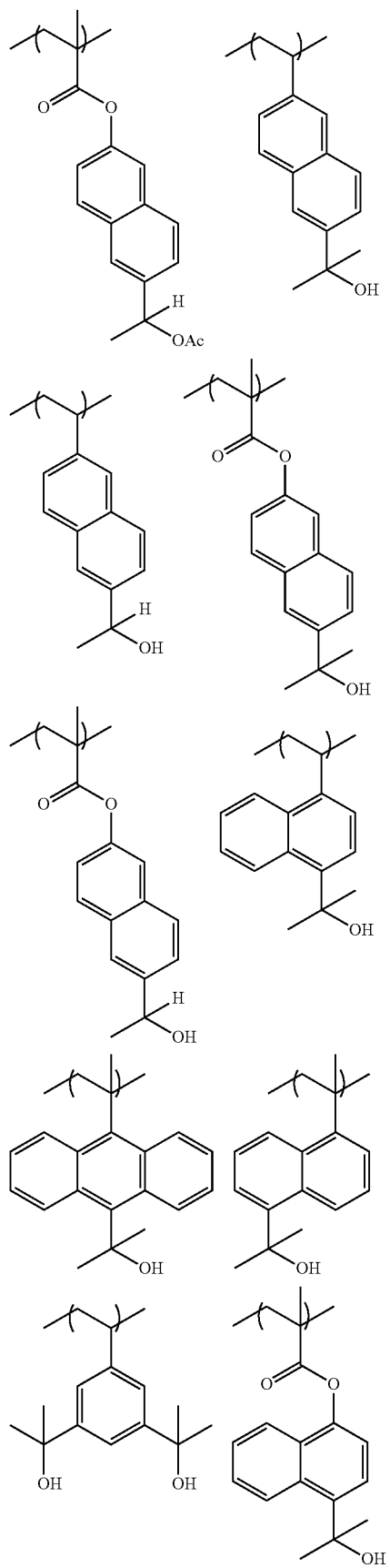
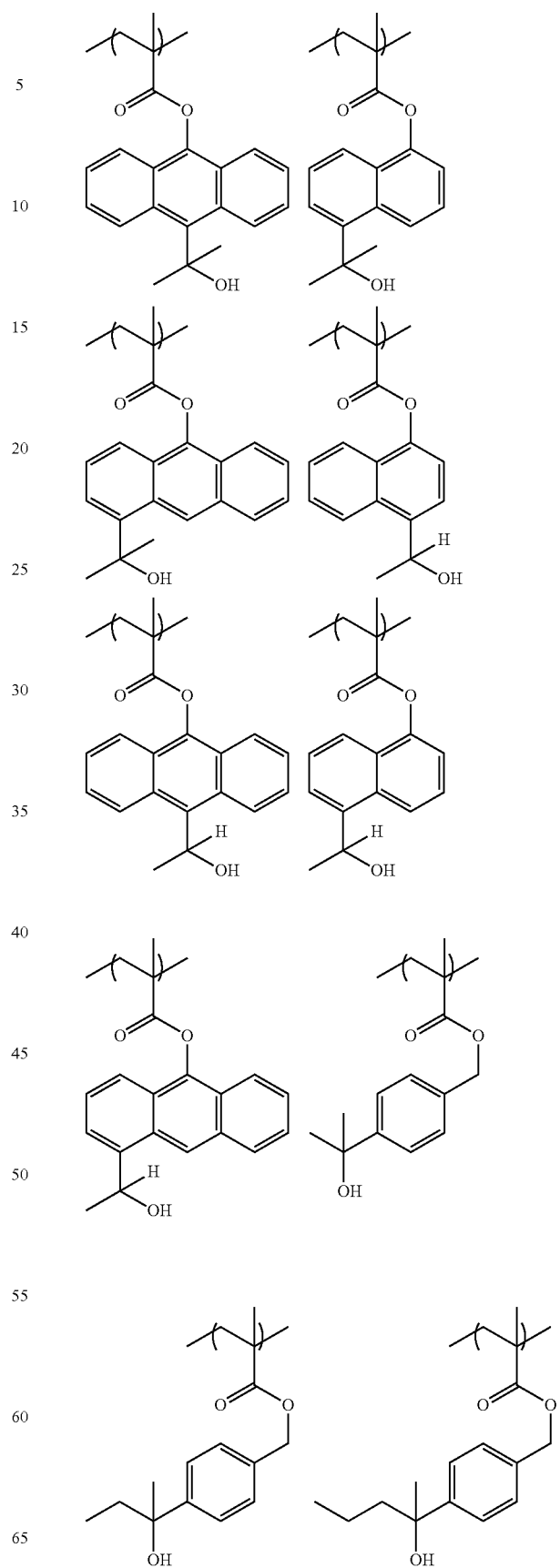

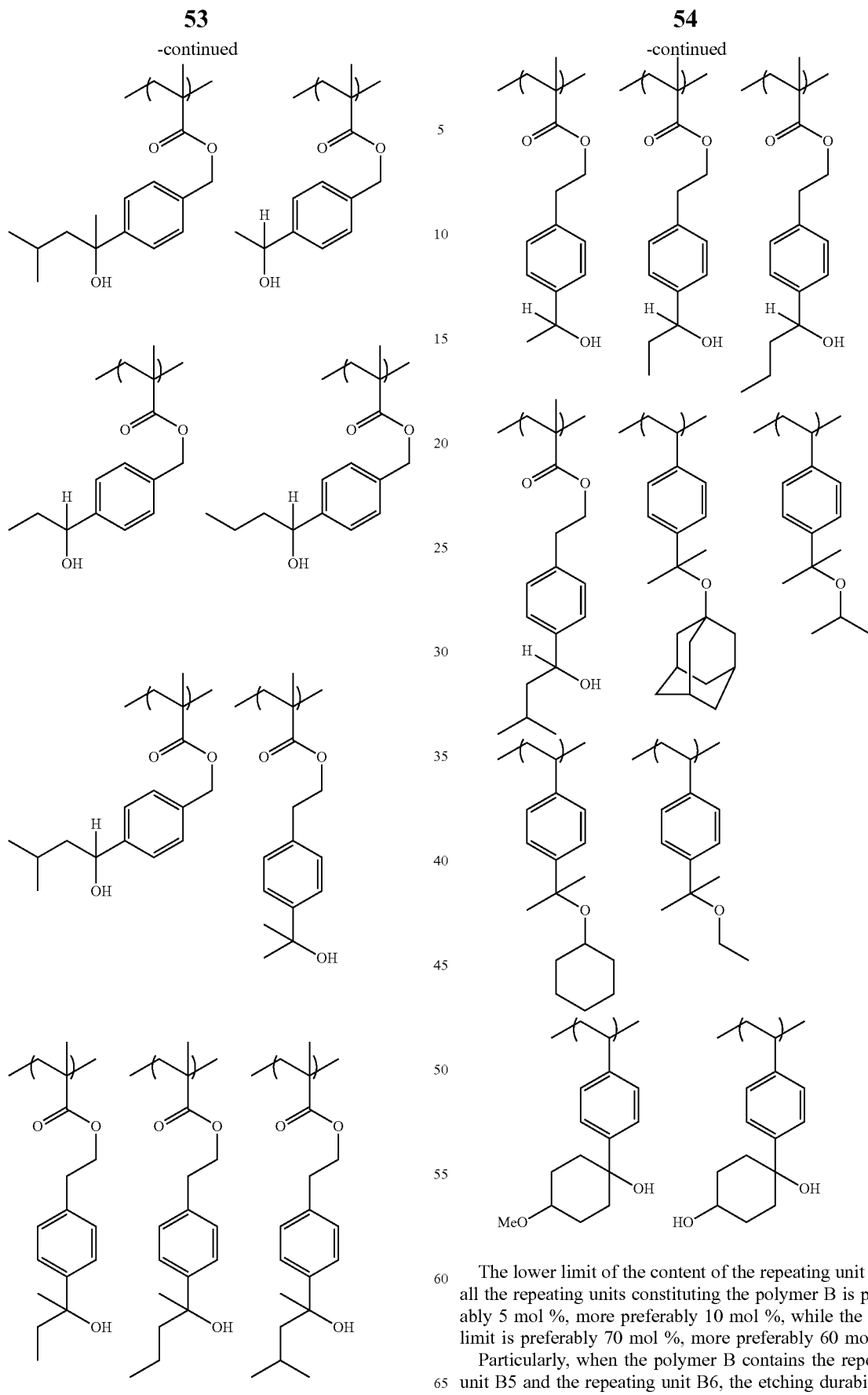

The lower limit of the content of the repeating unit B2 in all the repeating units constituting the polymer B is preferably 5 mol %, more preferably 10 mol %, while the upper limit is preferably 70 mol %, more preferably 60 mol %.

Particularly, when the polymer B contains the repeating unit B5 and the repeating unit B6, the etching durability is further improved and the adhesion to a substrate and the solubility to an alkaline developer are also improved by the action of the repeating unit B5. Moreover, the negative reaction can progress more efficiently by the action of the repeating unit B6. Thus, the resolution can be further improved.

To improve the etching durability, the base polymer B may further contain at least one repeating unit selected from a repeating unit shown by the following formula (B3) (hereinafter also referred to as repeating unit B3) and a repeating unit shown by the following formula (B4) (hereinafter also referred to as repeating unit B4).

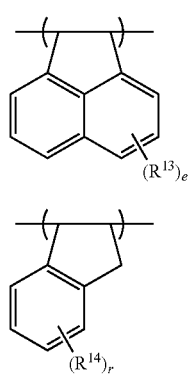

(B3)

(B4)

In the formulae, $R^{13}$ and $R^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted. "e" and "f" each independently represent an integer of 0 to 4.

When at least one of the repeating units B3 and B4 is used as a constitutional unit, the etching durability is obtained by the aromatic ring(s), and also the effect of improving the durability to electron beam irradiation in etching and pattern inspection is obtained because of the cyclic structure(s) added to the main chain.

One kind of each of the repeating units B3 and B4 may be used alone, or two or more kinds thereof may be used in combination. To obtain the effect of improving the etching durability, the lower limit of the content of the repeating units B3 and B4 in all the repeating units constituting the polymer B is preferably 2 mol %, more preferably 5 mol %, while the upper limit is preferably 30 mol %, more preferably 20 mol %.

[(C) Photo-Acid Generator]

The inventive chemically-amplified negative resist composition includes, as the component (C), a photo-acid generator which generates an acid. In the present invention, a "photo-acid generator which generates an acid" means a "photo-acid generator which generates a strong acid," and the strong acid refers to an acid having a higher acidity (lower pKa) than an acid generated by the sulfonium salt shown by the formula (A-1).

As described above, when the component (A) (carboxylic acid sulfonium salt (A-1)) and the component (C) (acid generator which generates a strong acid) are present together and irradiated with light, a carboxylic acid derived from (A-1) and a strong acid (such as a perfluoroalkylsulfonic acid) are generated. As a result, the undecomposed acid generator exists near the carboxylic acid sulfonium salt (A-1) and the strong acid in the coexistent state. Thus, at first, the generated strong acid is subjected to ion exchange with the sulfonium salt (A-1), so that a sulfonium salt of the strong acid is formed, and the carboxylic acid is released at the same time. This is because the component (C) of the present invention is a photo-acid generator which generates a strong acid (this acid has a lower pKa than the acid generated by the sulfonium salt shown by the formula (A-1)) as described above, and because the salt of the strong acid having higher acidity (such as perfluoroalkylsulfonic acid salt) is more stable. Meanwhile, even when the salt of the strong acid such as perfluoroalkylsulfonic acid sulfonium salt exists with the carboxylic acid, no ion exchange occurs. Accordingly, the generated carboxylic acid derived from (A-1) remains unchanged. Moreover, since this carboxylic acid hardly contributes to the deprotection reaction of the base polymer, the carboxylic acid sulfonium salt in (A) functions as a quencher. Similar ion exchanges occur not only with the perfluoroalkylsulfonic acid but also with arylsulfonic acid, alkylsulfonic acid, imide acid, methide acid, and the like which have higher acidity (lower pKa) than the iodinated carboxylic acid derived from (A-1).

Thus, the inventive chemically-amplified negative resist composition incorporating the components (A) to (C) in combination has advantageous functions and effects as follows.

(1) A strong acid generated from the photo-acid generator of the component (C) by exposure is subjected to ion exchange with the weak-acid onium salt as the component (A), forming a weak acid and a strong-acid onium salt. Hence, the strong acid of high acidity is substituted for the weak acid (carboxylic acid). Thus, the component (A) functions as what is called a quencher which suppresses the acid decomposition reaction of the acid labile group in the base polymer (B) and shortens (controls) the acid diffusion distance. Further, the component (A) functions as a photo-decomposable quencher which loses the ability as a quencher by photo-decomposition, and contributes to pattern contrast improvement.

(2) The carboxylic acid generated by the decomposition of the carboxylic acid onium salt of the component (A) does not assist a developer to dissolve a pattern formed at the exposed portion. Moreover, the carboxylic acid onium salt of the component (A) has a high molecular weight due to iodine and sufficiently suppresses the acid diffusion. This prevents an unexposed portion, which should be dissolved, from remaining as scum due to low solubility in alkali.

(3) The acid generated by exposure has a sufficient ability to insolubilize the base polymer (B), and the affinity of the acid generated by the decomposition of the carboxylic acid onium salt of the component (A) to an alkaline developer is not too high. Hence, there are no problems of top loss in the pattern during development and accompanying LWR and CDU degradations.

The photo-acid generator is not particularly limited, as long as it is a compound that generates a strong acid by irradiation with light such as a high energy beam. Examples of suitable photo-acid generators include sulfonium salts, iodonium salts, sulfonyldiazo methane, N-sulfonyl oxydicarboxy imide, O-arylsulfonyl oxime, O-alkylsulfonyl oxime, and the like. Specific examples thereof include compounds disclosed in paragraphs [0102] to [0113] of Japanese Unexamined Patent Application Publication No. 2007-145797, paragraphs [0122] to [0142] of Japanese Unexamined Patent Application Publication No. 2008-111103, paragraphs [0081] to [0092] of Japanese Unexamined Patent Application Publication No. 2014-001259, compounds disclosed in Japanese Unexamined Patent Application Publication Nos. 2012-041320, 2012-153644, 2012-106986, and 2016-018007, and the like. The photo-acid generators which generate partially fluorinated sulfonic acids disclosed in these patent documents have appropriate acidity and diffusion length of acids generated therefrom particularly in EUV lithography and ArF lithography, and are preferably usable. When an iodonium salt is used in combination, a cation thereof is preferably a diphenyliodonium cation, a p-fluorophenylphenyliodonium cation, a tert-butylphenylphenyliodonium cation or a di-tert-butylphenyliodonium cation.

A preferable example of the photo-acid generator of the component (C) includes a sulfonium salt shown by the following formula (C-1).

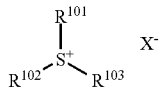
(C-1)

In the formula (C-1), $R^{101}$, $R^{102}$ and $R^{103}$ each independently represent a monovalent hydrocarbon group having 1 to 20 carbon atoms optionally containing a heteroatom. Any two of $R^{101}$, $R^{102}$ and $R^{103}$ may be bonded to each other to form a ring with a sulfur atom bonded to the two. Examples of the monovalent hydrocarbon group include those aforementioned for $R^{11}$ and $R^{12}$. At least one of $R^{101}$, $R^{102}$ and $R^{103}$ is preferably an aryl group.

The sulfonium cation in the formula (C-1) is described in detail in paragraphs [0082] to [0085] of Japanese Unexamined Patent Application Publication No. 2014-001259. Specific examples of the sulfonium cation include cations disclosed in paragraphs [0027] to [0033] of Japanese Unexamined Patent Application Publication No. 2007-145797 and paragraph [0059] of Japanese Unexamined Patent Application Publication No. 2010-113209, and cations disclosed in Japanese Unexamined Patent Application Publication Nos. 2012-041320, 2012-153644, and 2012-106986.

In the formula (C-1), $X^-$ represents an anion selected from the following formulae (C-1A) to (C-1D).

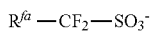
(C-1A)

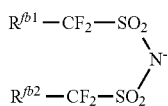
(C-1B)

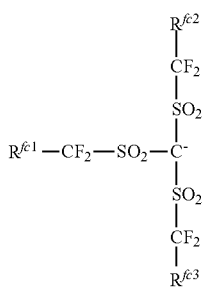
(C-1C)

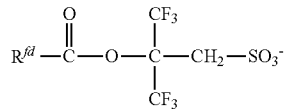
(C-1D)

In the formula (C-1A), $R^{fa}$ represents a fluorine atom or a monovalent hydrocarbon group having 1 to 40 carbon atoms optionally containing a heteroatom. The anion shown by the formula (C-1A) is particularly preferably is shown by the following formula (C-1A').

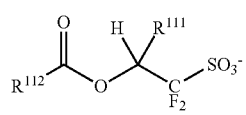
(C-1A')

In the formula (C-1A'), $R^{111}$ represents a hydrogen atom or a trifluoromethyl group, preferably a trifluoromethyl group. $R^{112}$ represents a monovalent hydrocarbon group having 1 to 35 carbon atoms optionally containing a heteroatom. The heteroatom is preferably an oxygen atom, a nitrogen atom, a sulfur atom, a halogen atom, or the like, more preferably an oxygen atom. The monovalent hydrocarbon group particularly preferably has 6 to 30 carbon atoms from the viewpoint of obtaining high resolution in fine pattern formation. The monovalent hydrocarbon group may be linear, branched, or cyclic. Specific examples thereof include linear or branched alkyl groups such as a methyl group, an ethyl group, a propyl group, an isopropyl group, a butyl group, an isobutyl group, a sec-butyl group, a tert-butyl group, a pentyl group, a neopentyl group, a cyclopentyl group, a hexyl group, a heptyl group, a 2-ethylhexyl group, a nonyl group, an undecyl group, a tridecyl group, a pentadecyl group, a heptadecyl group, and an icosanyl group; monovalent saturated alicyclic hydrocarbon groups such as a cyclohexyl group, a 1-adamantyl group, a 2-adamantyl group, a 1-adamantylmethyl group, a norbornyl group, a norbornylmethyl group, a tricyclodecanyl group, a tetracyclododecanyl group, a tetracyclododecanylmethyl group, and a dicyclohexylmethyl group; monovalent unsaturated aliphatic hydrocarbon groups such as an allyl group and a 3-cyclohexenyl group; aralkyl groups such as a benzyl group and a diphenylmethyl group; and the like. Examples of the monovalent hydrocarbon group containing a heteroatom include a tetrahydrofuryl group, a methoxymethyl group, an ethoxymethyl group, a methylthiomethyl group, an acetamide methyl group, a trifluoroethyl group, a (2-methoxyethoxy)methyl group, an acetoxymethyl group, a 2-carboxy-1-cyclohexyl group, a 2-oxopropyl group, a 4-oxo-1-adamantyl group, a 3-oxocyclohexyl group, and the like. Some of hydrogen atoms of these groups may be substituted with a group containing a heteroatom such as an oxygen atom, a sulfur atom, a nitrogen atom, or a halogen atom. Alternatively, the groups may have some carbon atoms substituted with a group containing a heteroatom such as an oxygen atom, a sulfur atom, or a nitrogen atom. As a result, $R^{112}$ may contain a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like.

The anion shown by the formula (C-1A') is described in detail in Japanese Unexamined Patent Application Publication Nos. 2007-145797, 2008-106045, 2009-007327, 2009-258695, and 2012-181306.

In the formula (C-1B), $R^{fb1}$ and $R^{fb2}$ each independently represent a fluorine atom or a monovalent hydrocarbon group having 1 to 40 carbon atoms optionally containing a heteroatom. The monovalent hydrocarbon group may be linear, branched, or cyclic. Specific examples thereof include those aforementioned for $R^{112}$. $R^{fb1}$ and $R^{fb2}$ are each preferably a fluorine atom or a linear fluorinated alkyl group having 1 to 4 carbon atoms. $R^{fb1}$ and $R^{fb2}$ may be bonded to each other to form a ring with a group (—$CF_2$—$SO_2$—$N^-$—$SO_2$—$CF_2$—) bonded to $R^{fb1}$ and $R^{fb2}$. In this case, the group in which $R^{fb1}$ and $R^{fb2}$ are bonded to each other is preferably a fluorinated ethylene group or a fluorinated propylene group.

In the formula (C-1C), $R^{fc1}$, $R^{fc2}$ and $R^{fc3}$ each independently represent a fluorine atom or a monovalent hydrocarbon group having 1 to 40 carbon atoms optionally containing a heteroatom. The monovalent hydrocarbon group may be linear, branched, or cyclic. Specific examples thereof include those aforementioned for $R^{112}$. $R^{fc1}$, $R^{fc2}$ and $R^{fc3}$ are each preferably a fluorine atom or a linear fluorinated alkyl group having 1 to 4 carbon atoms. R and R may be bonded to each other to form a ring with a group (—$CF_2$—$SO_2$—$C^-$—$SO_2$—$CF_2$—) bonded to $R^{fc1}$ and $R^{fc2}$. In this case, the group in which R and $R^{fc2}$ are bonded to each other is preferably a fluorinated ethylene group or a fluorinated propylene group.

In the formula (C-1D), $R^{fd}$ represents a monovalent hydrocarbon group having 1 to 40 carbon atoms optionally containing a heteroatom. The monovalent hydrocarbon group may be linear, branched, or cyclic. Specific examples thereof include those aforementioned for $R^{112}$. The anion shown by the formula (C-1D) is described in detail in Japanese Unexamined Patent Application Publication Nos. 2010-215608 and 2014-133723. Note that the photo-acid generator having the anion shown by the formula (C-1D) does not have fluorine atom at a position of the sulfo group but has two trifluoromethyl groups at β position. Thus, the photo-acid generator has a sufficient acidity to cleave the acid labile group in the base resin. Hence, it is usable as a photo-acid generator.

Examples of the anion represented by $X^-$ include ones shown below, but are not limited thereto. Note that, in the following formulae, A represents a hydrogen atom or a trifluoromethyl group, and Ac represents an acetyl group.

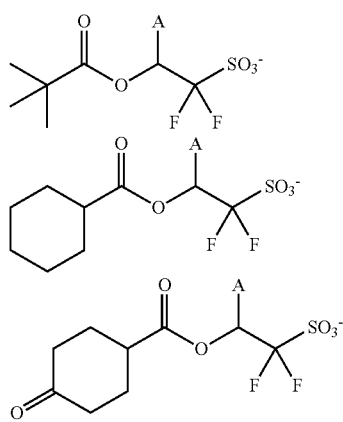

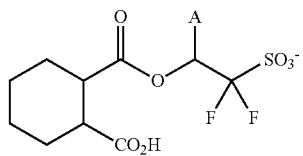

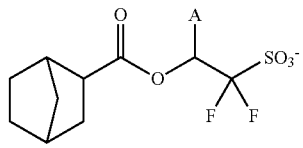

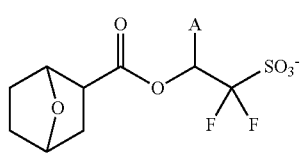

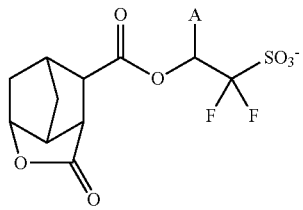

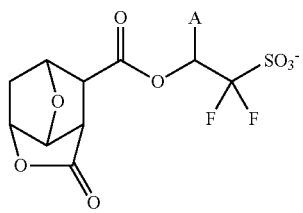

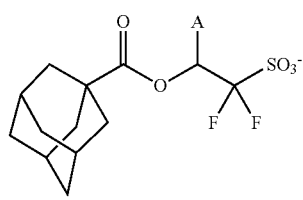

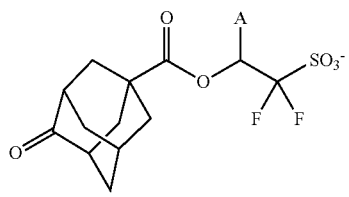

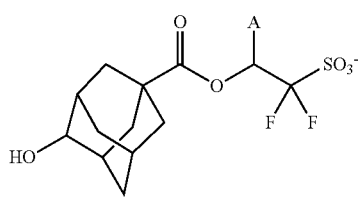

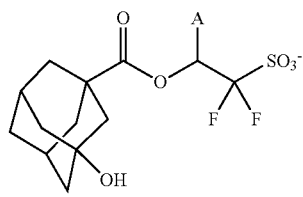

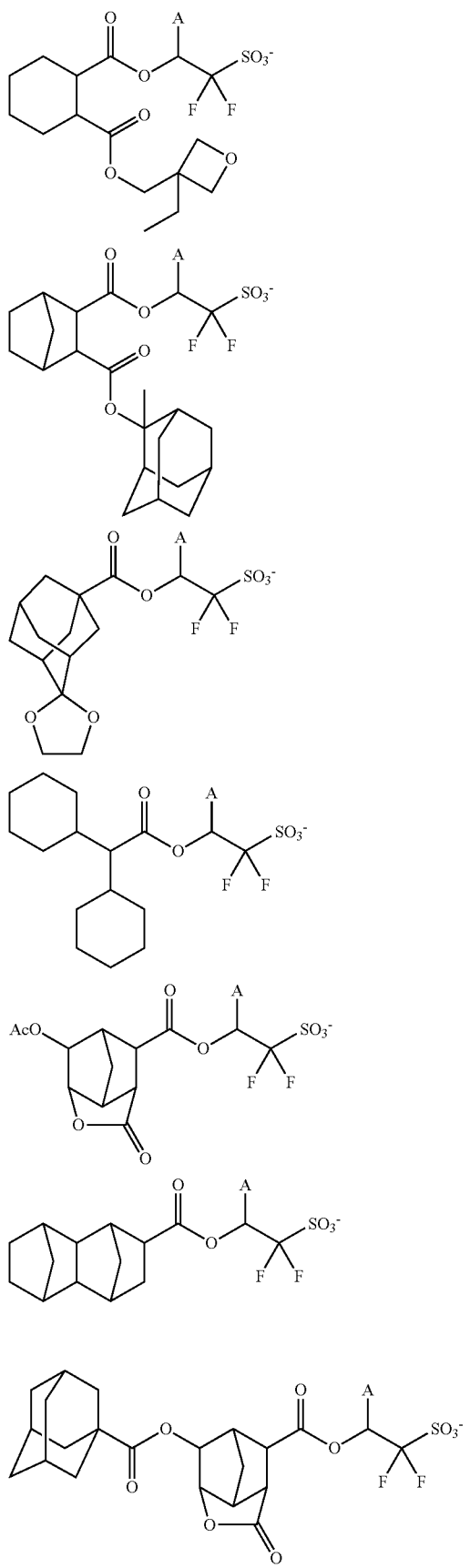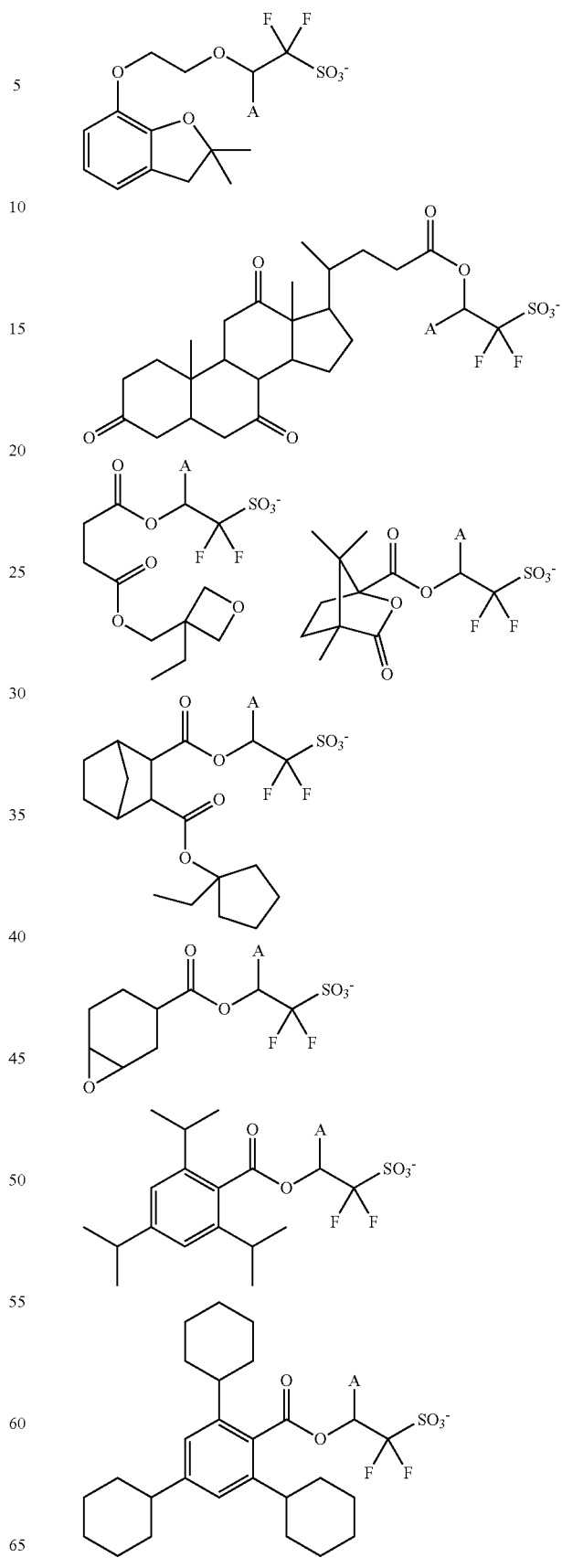

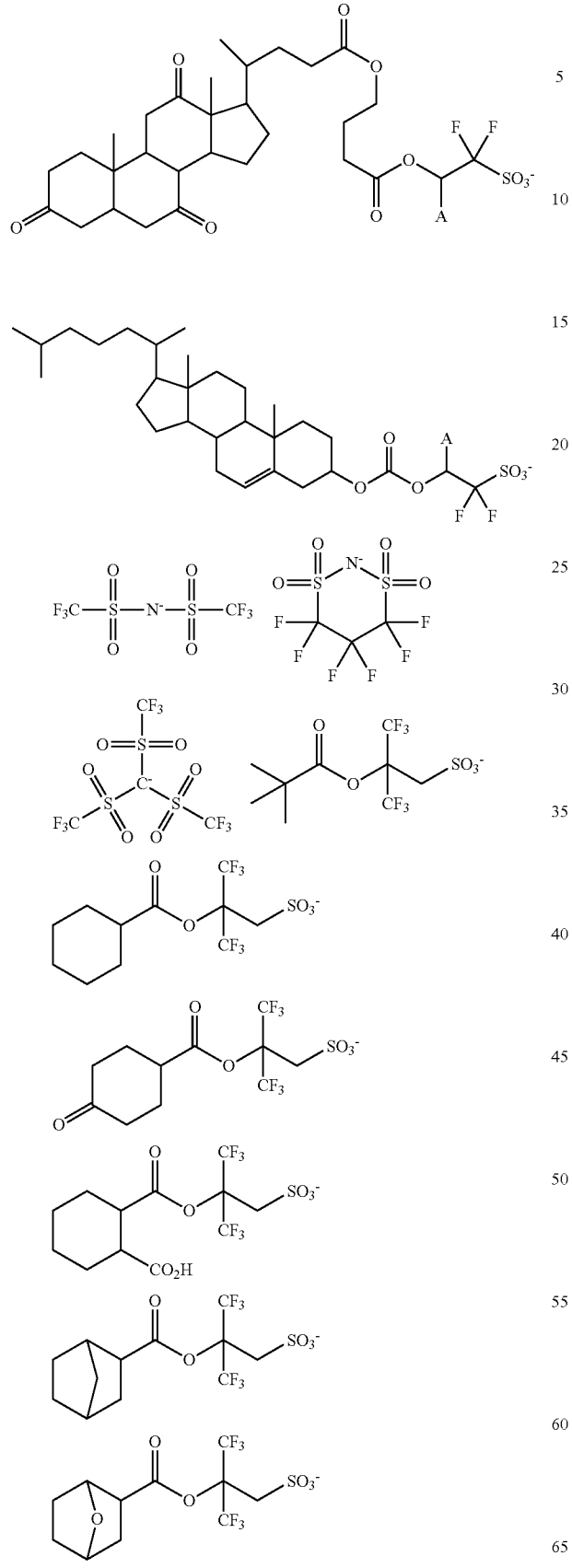
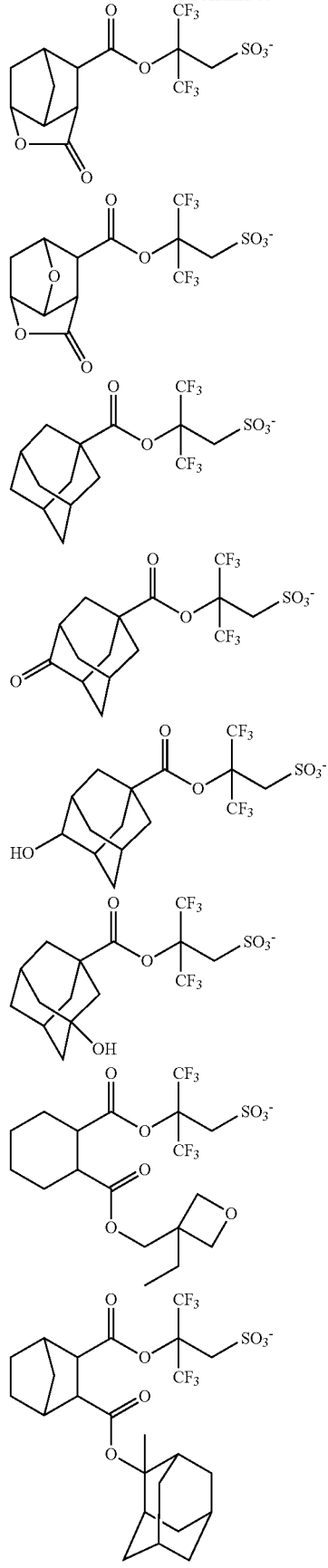

-continued
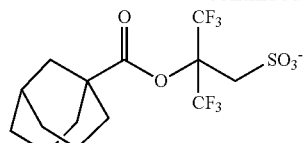
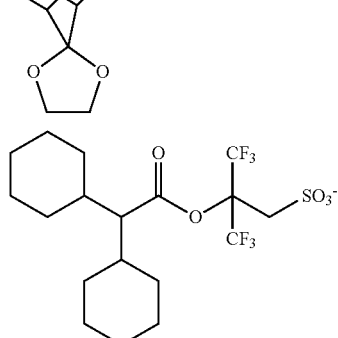
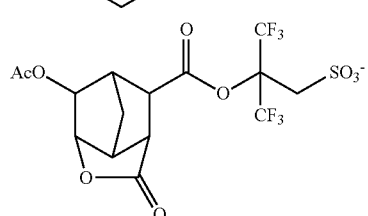
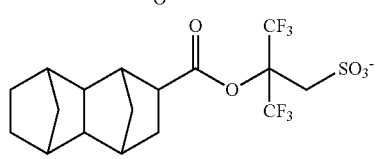
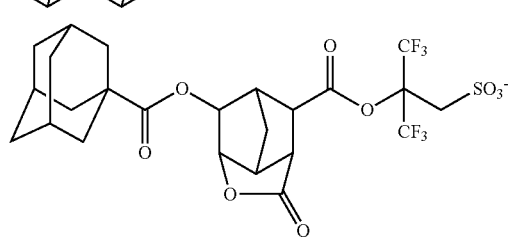
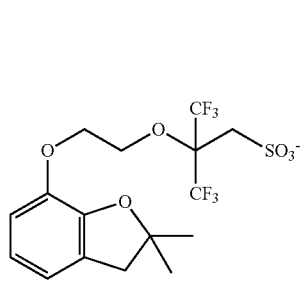
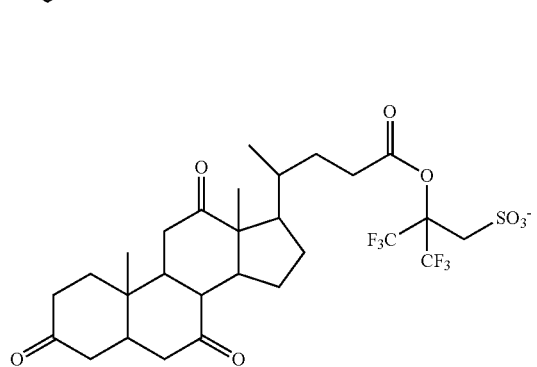
-continued
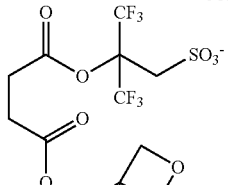
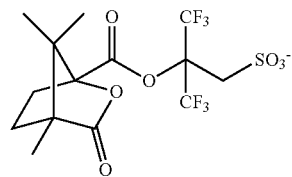
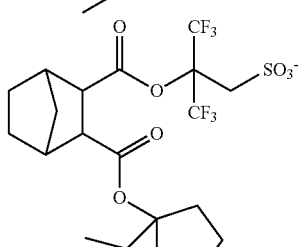
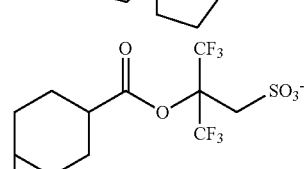
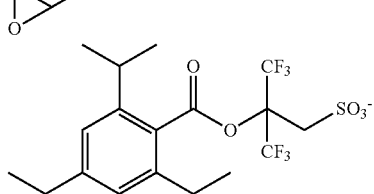
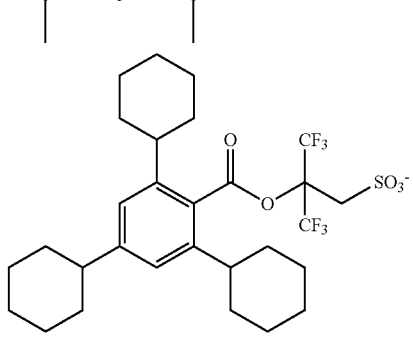
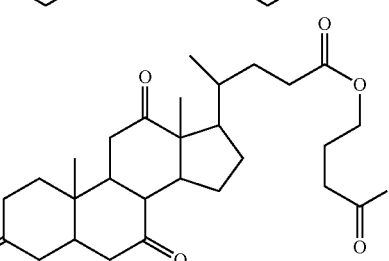
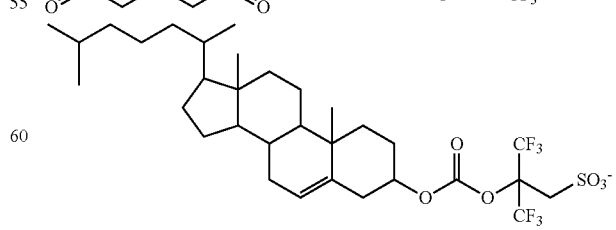
Examples of the specific structure of the sulfonium salt shown by the formula (C-1) include any combination of specific examples of the anion and specific examples of the cation, but are not limited thereto.

Another preferable example of the photo-acid generator of the component (C) includes a compound shown by the following formula (C-2).

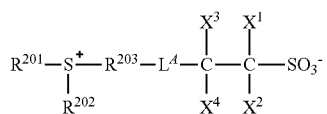

(C-2)

In the formula (C-2), $R^{201}$ and $R^{202}$ each independently represent a monovalent hydrocarbon group having 1 to 30 carbon atoms optionally containing a heteroatom. $R^{203}$ represents a divalent hydrocarbon group having 1 to 30 carbon atoms optionally containing a heteroatom. Any two of $R^{201}$, $R^{202}$ and $R^{203}$ may be bonded to each other to form a ring with a sulfur atom bonded to the two. $L^A$ represents a single bond, an ether bond, or a divalent hydrocarbon group having 1 to 20 carbon atoms optionally containing a heteroatom. $X^1$, $X^2$, $X^3$ and $X^4$ each independently represent a hydrogen atom, a fluorine atom, or a trifluoromethyl group, but at least one of $X^1$, $X^2$, $X^3$ and $X^4$ is a fluorine atom or a trifluoromethyl group.

The compound shown by the formula (C-2) is particularly preferably shown by the following formula (C-2').

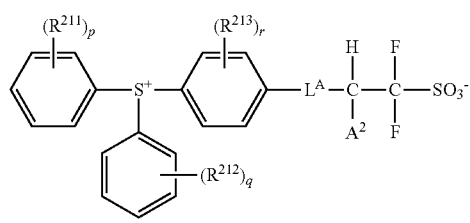

(C-2')

In the formula (C-2'), $L^A$ is as defined above. $A^2$ represents a hydrogen atom or a trifluoromethyl group, preferably a trifluoromethyl group. $R^{211}$, $R^{212}$ and $R^{213}$ each independently represent a hydrogen atom, or a linear, branched, or cyclic monovalent hydrocarbon group having 1 to 20 carbon atoms optionally containing a heteroatom. "p" and "q" each independently represent an integer of 0 to 5. "r" represents an integer of 0 to 4. Incidentally, this "p" is employed only in the formula (C-2').

In the formulae (C-2) and (C-2'), $L^A$ is preferably an ether bond, or $Q_X$-O-$L^{A'}$-O-$Q_Y$. $Q_X$ represents a bond to a benzene ring, and $Q_Y$ represents a bond to —CH($A^2$)-CF$_2$—SO$_3^-$. $L^{A'}$ represents a divalent hydrocarbon group having 1 to 10 carbon atoms optionally containing a heteroatom.

The photo-acid generator shown by the formula (C-2) or (C-2') is described in detail in Japanese Unexamined Patent Application Publication No. 2011-016746. Specific examples of the photo-acid generators include sulfonium compounds disclosed in this patent document and in paragraphs [0149] to [0150] of Japanese Unexamined Patent Application Publication No. 2015-214634.

Examples of the photo-acid generator shown by the formula (C-2) include ones shown below, but are not limited thereto. Note that, in the following formulae, $A^2$ is as defined above, Me represents a methyl group, nBu represents an n-butyl group, and tBu represents a tert-butyl group.

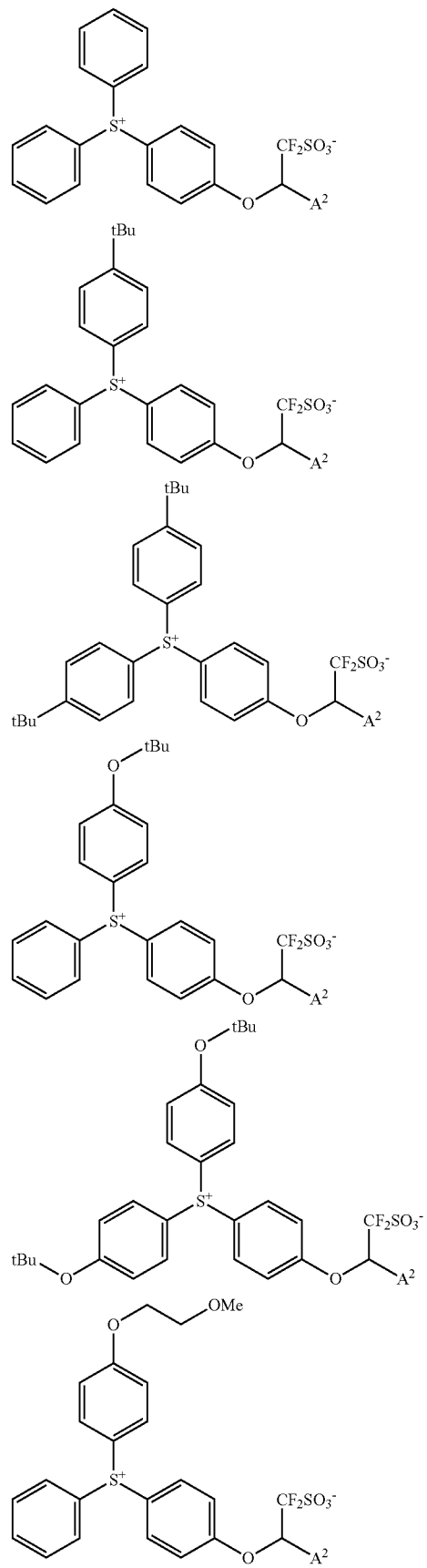

-continued

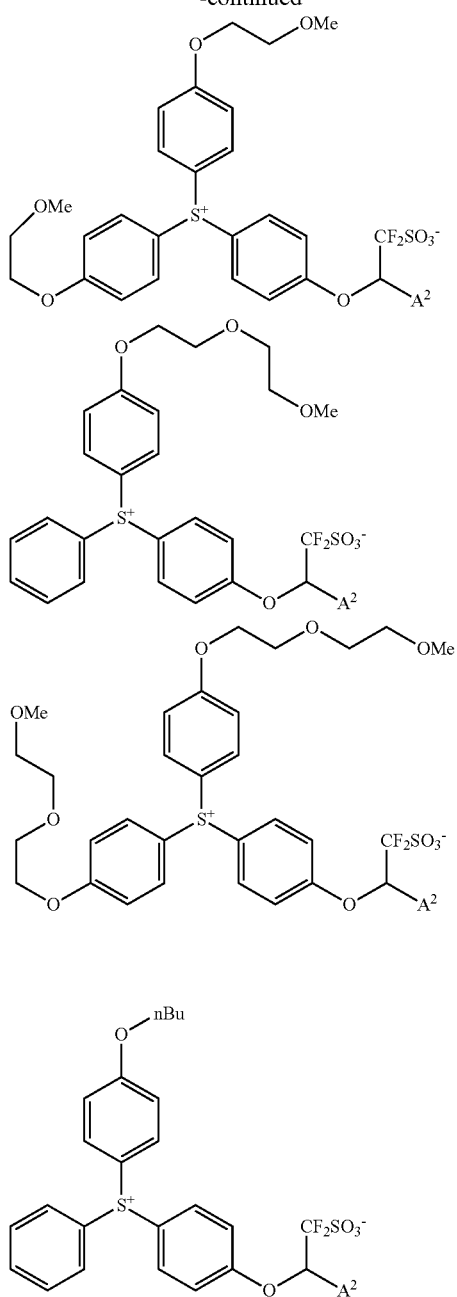

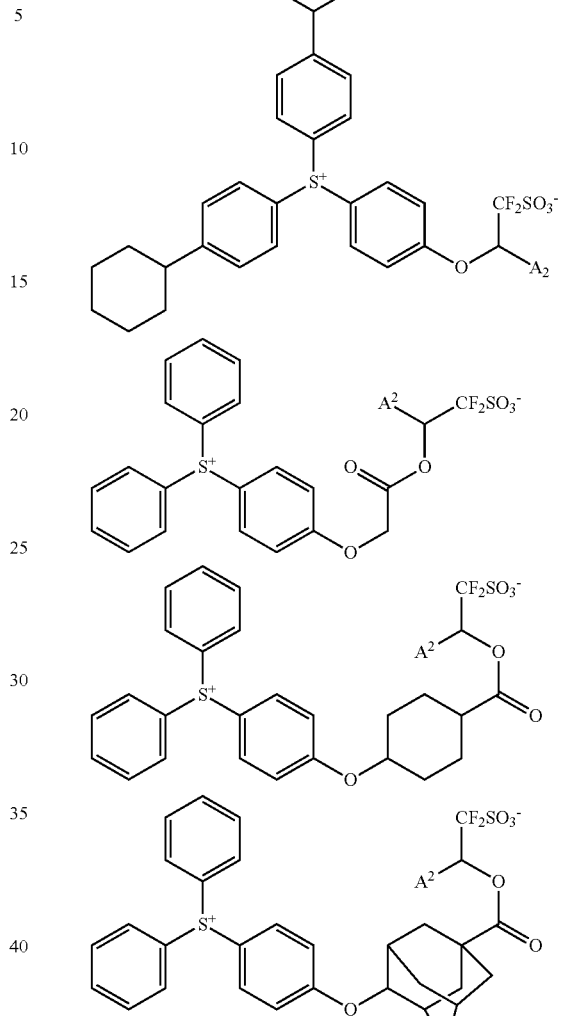

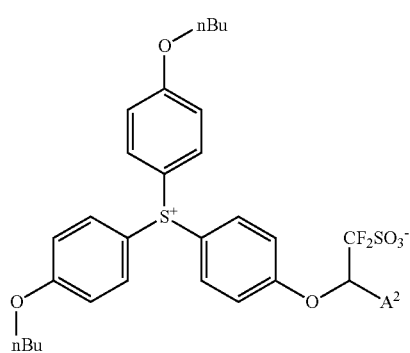

Among the above-described photo-acid generators, ones having the anion shown by the formula (C-1A') or (C-1D) are particularly preferable because the acid diffusion is small and the solubility to a solvent is excellent, too. Ones having the structure shown by the formula (C-2') are also particularly preferable because the acid diffusion is quite small.

The photo-acid generator of the component (C) is added in an amount of preferably 0.1 to 100 parts by mass, more preferably 0.5 to 50 parts by mass, based on 100 parts by mass of the base resin of the component (B). Within these ranges, there is no risk of resolution degradation or contamination problem after resist development or at the time of peeling.

[The Crosslinking Agent (D)]

In the present invention, a crosslinking agent may be blended. In the case of negative resist compositions, adding a crosslinking agent reduces the dissolution rate of an exposed portion, so that a negative pattern can be obtained.

Specific examples of the crosslinking agent usable in the present invention include: epoxy compounds, melamine compounds, guanamine compounds, glycoluril compounds, urea compounds, isocyanate compounds, and azide compounds all of which are optionally substituted with at least one group selected from a methylol group, an alkoxymethyl group, and an acyloxymethyl group; compounds containing a double bond such as an alkenyl ether group; and the like. These may be used as an additive, or introduced into a polymer side chain as a pendant group. Additionally, compounds containing a hydroxy group can also be used as a crosslinking agent.

Among these crosslinking agents, examples of the epoxy compounds include tris(2,3-epoxypropyl)isocyanurate, trimethylolmethane triglycidyl ether, trimethylolpropane triglycidyl ether, triethylolethane triglycidyl ether, and the like.

Examples of the melamine compounds include hexamethylolmelamine, hexamethoxymethylmelamine, such compounds as hexamethylolmelamine having 1 to 6 methylol groups methoxymethylated, and mixtures thereof; and hexamethoxyethylmelamine, hexaacyloxymethylmelamine, such compounds as hexamethylolmelamine having 1 to 6 methylol groups acyloxymethylated, and mixtures thereof.

Examples of the guanamine compounds include tetramethylolguanamine, tetramethoxymethylguanamine, such compounds as tetramethylolguanamine having 1 to 4 methylol groups methoxymethylated, and mixtures thereof; and tetramethoxyethylguanamine, tetraacyloxyguanamine, such compounds as tetramethylolguanamine having 1 to 4 methylol groups acyloxymethylated, and mixtures thereof.

Examples of the glycoluril compounds include tetramethylolglycoluril, tetramethoxyglycoluril, tetramethoxymethylglycoluril, such compounds as tetramethylolglycoluril having 1 to 4 methylol groups methoxymethylated, and mixtures thereof; and such compounds as tetramethylolglycoluril having 1 to 4 methylol groups acyloxymethylated, and mixtures thereof.

Examples of the urea compounds include tetramethylol urea, tetramethoxymethyl urea, tetramethoxyethyl urea, such compounds as tetramethylol urea having 1 to 4 methylol groups methoxymethylated, mixtures thereof, and the like.

Examples of the isocyanate compounds include tolylene diisocyanate, diphenylmethane diisocyanate, hexamethylene diisocyanate, cyclohexane diisocyanate, and the like.

Examples of the azide compounds include 1,1'-biphenyl-4,4'-bisazide, 4,4'-methylidene bisazide, 4,4'-oxybisazide, and the like.

Examples of the compounds containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and the like.

The crosslinking agent (D) is blended in an amount of preferably 2 to 50 parts by mass, more preferably 5 to 30 parts by mass, based on 100 parts by mass of the base polymer. Within these ranges, there is a low risk of pattern merging and resolution reduction. One kind of the crosslinking agent (D) can be used alone, or two or more kinds thereof can be used in combination.

[Other Components]

The inventive chemically-amplified negative resist composition can be blended in an appropriate combination with, other than the above-described components, an organic solvent, a surfactant, and the like as necessary. Constituting the negative resist composition in this manner makes it possible to reduce the solubility to an alkaline developer in comparison with negative patterns formed by using conventional negative resist compositions, and to form a favorable pattern profile with little top loss. Further, the resist film has high dissolution contrast and resolution, exposure latitude, excellent process adaptability, and favorable pattern profile after the exposure. Furthermore, since the acid diffusion can be particularly suppressed, the difference in dimension between dense and sparse patterns is small. From these, the inventive chemically-amplified negative resist composition is highly practical and usable as a quite effective resist material for very large scale integration (VLSI).

Organic Solvent

The inventive negative resist composition may contain an organic solvent as an optional component. The organic solvent is not particularly limited, as long as it is capable of dissolving the above-described components. Examples of such an organic solvent include those disclosed in paragraphs [0144] to [0145] of Japanese Unexamined Patent Application Publication No. 2008-111103: ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-t-butyl ether acetate; lactones such as γ-butyrolactone; and mixed solvents thereof. When an acetal-based acid labile group is used, a high-boiling-point alcohol-based solvent, specifically diethylene glycol, propylene glycol, glycerin, 1,4-butanediol, 1,3-butanediol, etc., may be added in order to accelerate deprotection reaction of the acetal.

Among these organic solvents, 1-ethoxy-2-propanol, propylene glycol monomethyl ether acetate, cyclohexanone, γ-butyrolactone, and mixed solvents thereof are preferable because of particularly excellent solubility of the component (A) as a quencher.

The organic solvent is used in an amount of preferably 200 to 12,000 parts by mass, more preferably 400 to 10,000 parts by mass, based on 100 parts by mass of the base resin (B).

Surfactant

A surfactant conventionally used to improve the coating property onto a substrate to be processed may be added to the inventive resist composition. When a surfactant is used, there are many known surfactants including PF-636 (manufactured by OMNOVA SOLUTIONS Inc.) and FC-4430 (manufactured by 3M) as described in Japanese Unexamined Patent Application Publication No. 2004-115630, any of which can be selected. The content of the surfactant is preferably 0 to 5 parts by mass based on 100 parts by mass of the base polymer (B).

[Resist Patterning Process]

The inventive resist patterning process includes steps of:
forming a resist film by using the above-described inventive chemically-amplified negative resist composition on a substrate to be processed;
irradiating the resist film with a high energy beam to form a pattern (exposing the resist film to KrF excimer laser beam, EB, EUV, or the like); and
developing the exposed resist film by using an alkaline developer.

As the substrate, it is possible to use, for example, a substrate for manufacturing an integrated circuit (such as Si, SiO$_2$, SiN, SiON, TiN, WSi, BPSG, SOG, organic antireflective film), or a substrate for manufacturing a mask circuit (such as Cr, CrO, CrON, MoSi$_2$, SiO$_2$). The resist composition is applied onto these substrates by a technique such as spin coating to a film thickness of 0.03 to 2 μm. The resulting film is prebaked on a hot plate preferably at 60 to 150° C. for 1 to 20 minutes, more preferably at 80 to 140° C. for 1 to 10 minutes. In this manner, a resist film is formed.

When KrF excimer laser beam or EUV is employed, the resist film can be exposed using a mask for forming a target pattern by irradiation with an exposure dose of preferably 1 to 200 mJ/cm$^2$, more preferably 10 to 100 mJ/cm$^2$. When EB is employed, the irradiation can be performed with an exposure dose of preferably 1 to 300 μC/cm$^2$, more preferably 10 to 200 μC/cm$^2$, to form a target pattern directly or using a mask.

Then, the resultant is subjected to post exposure bake (PEB) on a hot plate preferably at 60 to 150° C. for 1 to 20 minutes, more preferably at 80 to 140° C. for 1 to 10 minutes. Further, development is carried out using a developer of 0.1 to 5 mass %, preferably 2 to 3 mass %, alkaline aqueous solution such as tetramethylammonium hydroxide (TMAH) for preferably 0.1 to 3 minutes, more preferably 0.5 to 2 minutes, by a conventional technique such as dip, puddle, or spray. In this way, a target pattern is formed on the substrate.

As means in the patterning process after the resist film formation, rinsing with pure water (post-soaking) may be performed to extract the acid generator or the like from the film surface or to wash away particles. After the exposure, rinsing (post-soaking) may be performed to remove water left on the film.

EXAMPLE

Hereinafter, the present invention will be specifically described with reference to Synthesis Examples, Examples, and Comparative Examples, but the present invention is not limited to the following Examples.

The structures of quenchers (sulfonium salts) Q1 to Q15 used in resist compositions are shown below. Q1 to Q15 were each synthesized by ion exchange between an ammonium salt for providing the following anions and sulfonium chloride for providing the following cations.

Q-1
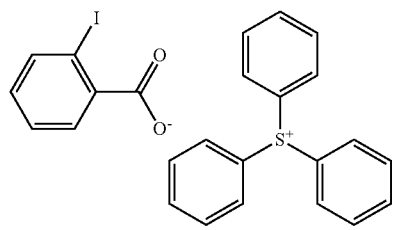

Q-2
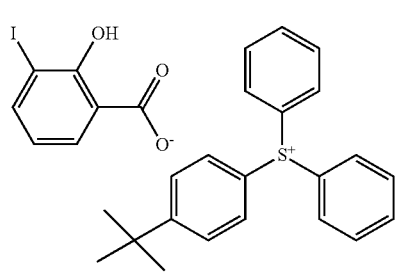

Q-3
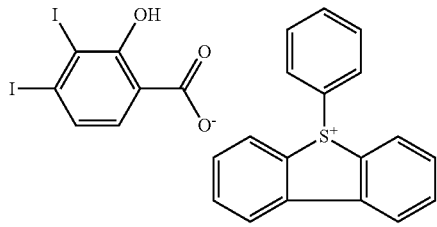

Q-4
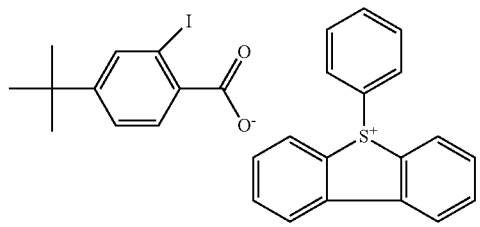

Q-5
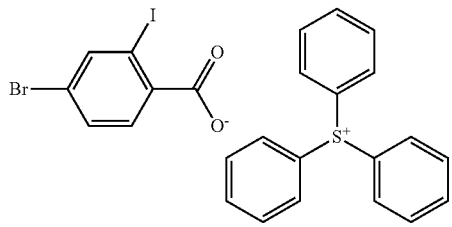

Q-6
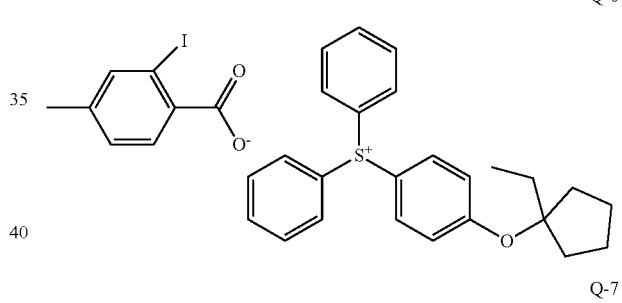

Q-7
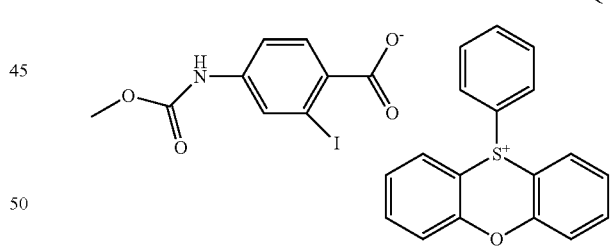

Q-8
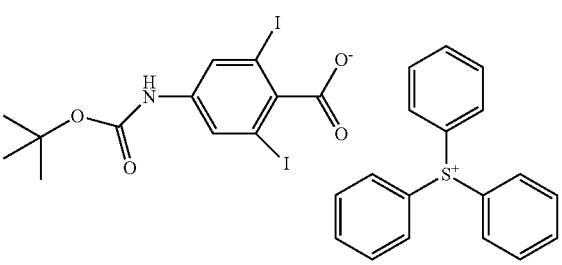

Q-9
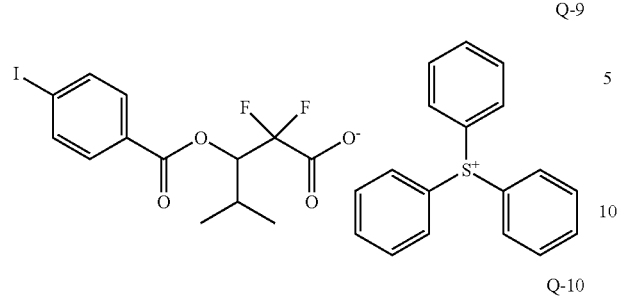
Q-10
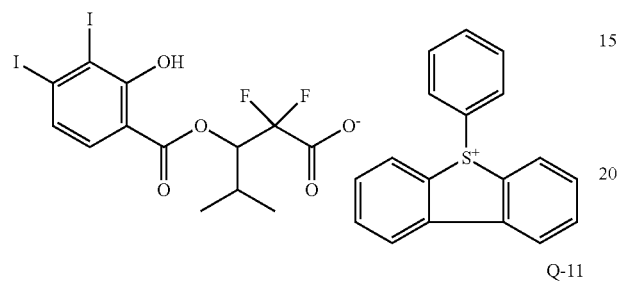
Q-11
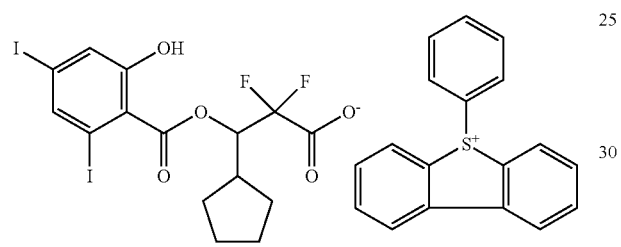
Q-12
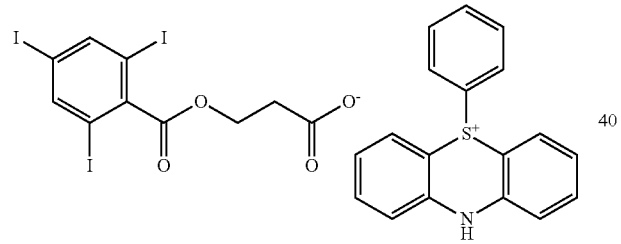
Q-13
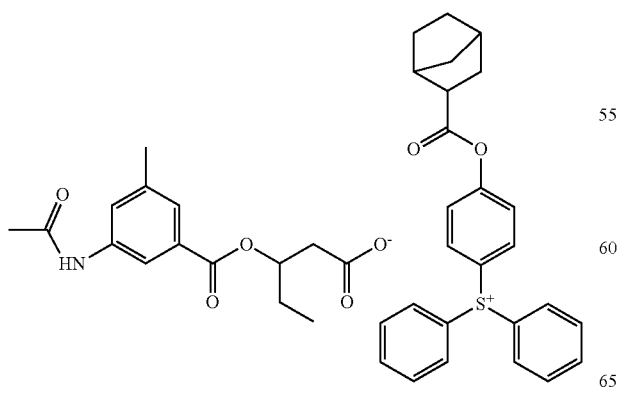
Q-14
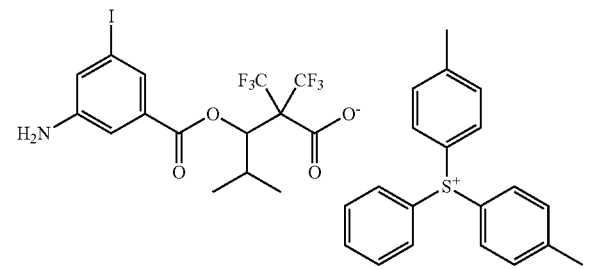
Q-15
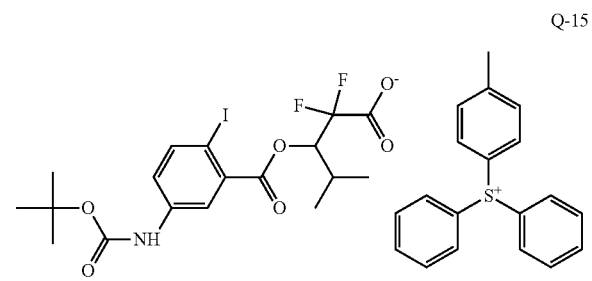
Likewise, comparative quenchers, Comparative Q1 to Comparative Q5, were synthesized. The structures thereof are shown below.
Comparative Q-1
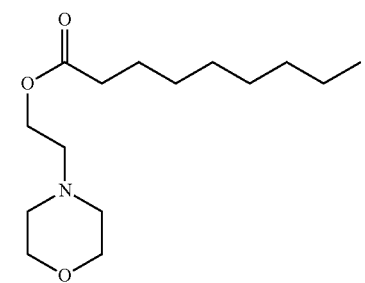
Comparative Q-2
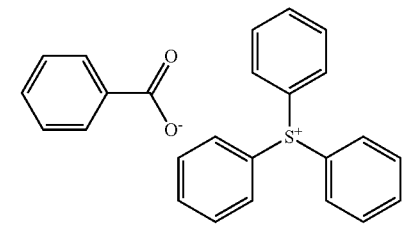
Comparative Q-3
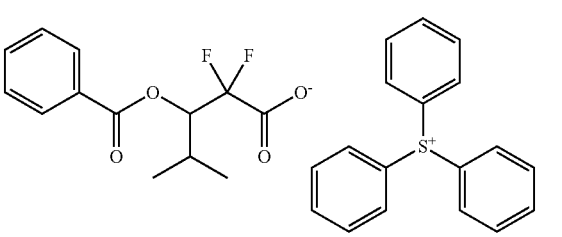

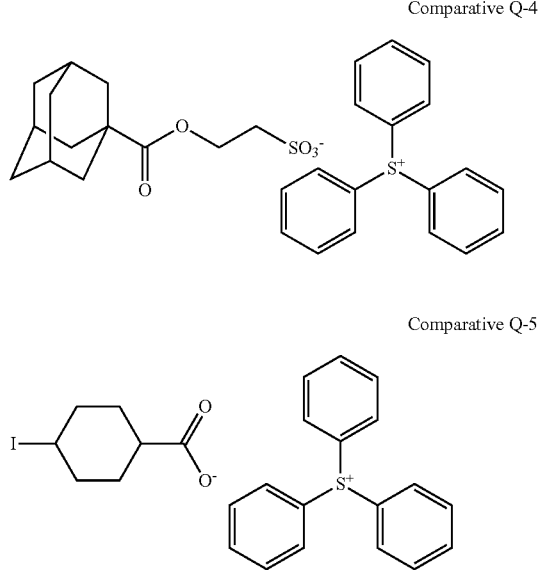

Comparative Q-4

Comparative Q-5

[Synthesis Examples] Synthesis of Base Polymers (Polymers 1 to 24)

Under nitrogen atmosphere, a combination of corresponding monomers was subjected to copolymerization reaction in propylene glycol monomethyl ether acetate (PGMEA) solution and γ-butyrolactone solvent. The obtained polymer solution was added dropwise to diisopropyl ether to agglomerate the copolymer. The diisopropyl ether was removed by decantation, and the copolymer was dissolved in acetone. The acetone solution was added dropwise to diisopropyl ether, and the deposited copolymer was collected by filtration. The collected copolymer was dissolved in acetone again. This acetone solution was added dropwise to water. The deposited copolymer was collected by filtration, and then dried at 40° C. for 40 hours. In this manner, white polymers were obtained. The polymers were measured by $^{13}$C-NMR, $^{1}$H-NMR, and GPC. Thus, the following analysis results were obtained. The compositions of the obtained base polymers were verified by $^{1}$H-NMR; and Mw and dispersity (Mw/Mn) were verified by GPC (solvent: THF, standard: polystyrene).

Table 1 shows the type and ratio of the monomers introduced in Polymers 1 to 20 and Comparative Polymers 21 to 24. Moreover, Table 2 shows the structures of repeating units introduced into the polymers.

TABLE 1

| | Unit 1 | Ratio (mol %) | Unit 2 | Ratio (mol %) | Unit 3 | Ratio (mol %) | Unit 4 | Ratio (mol %) | Mw | Mw/Mn |
|---|---|---|---|---|---|---|---|---|---|---|
| Polymer 1 | B1-1 | 60 | B2-1 | 40 | | | | | 4200 | 1.62 |
| Polymer 2 | B1-1 | 50 | B2-1 | 50 | | | | | 3900 | 1.65 |
| Polymer 3 | B1-1 | 65 | B2-2 | 35 | | | | | 4100 | 1.66 |
| Polymer 4 | B1-1 | 50 | B2-3 | 50 | | | | | 5500 | 1.6 |
| Polymer 5 | B1-1 | 40 | B2-4 | 50 | B3-1 | 10 | | | 4300 | 1.59 |
| Polymer 6 | B1-1 | 40 | B2-5 | 50 | B3-1 | 10 | | | 4400 | 1.65 |
| Polymer 7 | B1-2 | 60 | B2-1 | 40 | | | | | 4000 | 1.68 |
| Polymer 8 | B1-2 | 50 | B2-1 | 50 | | | | | 4700 | 1.67 |
| Polymer 9 | B1-2 | 55 | B2-2 | 45 | | | | | 4400 | 1.67 |
| Polymer 10 | B1-3 | 65 | B2-1 | 35 | | | | | 4300 | 1.59 |
| Polymer 11 | B1-3 | 75 | B2-1 | 25 | | | | | 5000 | 1.61 |
| Polymer 12 | B1-3 | 75 | B2-3 | 25 | | | | | 4200 | 1.66 |
| Polymer 13 | B1-3 | 60 | B2-4 | 35 | B3-1 | 5 | | | 5200 | 1.7 |
| Polymer 14 | B1-3 | 60 | B2-1 | 35 | B3-1 | 5 | | | 5500 | 1.56 |
| Polymer 15 | B1-3 | 60 | B2-1 | 35 | B4-1 | 5 | | | 4300 | 1.55 |
| Polymer 16 | B1-1 | 35 | B1-3 | 35 | B2-1 | 30 | | | 3900 | 1.61 |
| Polymer 17 | B1-1 | 30 | B1-3 | 40 | B2-1 | 25 | B3-1 | 5 | 4600 | 1.58 |
| Polymer 18 | B1-4 | 70 | B2-1 | 30 | | | | | 4900 | 1.68 |
| Polymer 19 | B1-1 | 50 | B1-4 | 20 | B2-1 | 30 | | | 5000 | 1.64 |
| Polymer 20 | B1-1 | 40 | B1-4 | 20 | B2-1 | 30 | B4-1 | 10 | 4500 | 1.63 |
| Comparative Polymer 21 | B1-5 | 60 | B2-1 | 40 | | | | | 4300 | 1.67 |
| Comparative Polymer 22 | B1-3 | 60 | B2-6 | 40 | | | | | 4600 | 1.71 |
| Comparative Polymer 23 | B1-3 | 70 | B2-7 | 30 | | | | | 4800 | 1.67 |
| Comparative Polymer 24 | B1-5 | 60 | B2-6 | 40 | | | | | 5100 | 1.7 |

TABLE 2
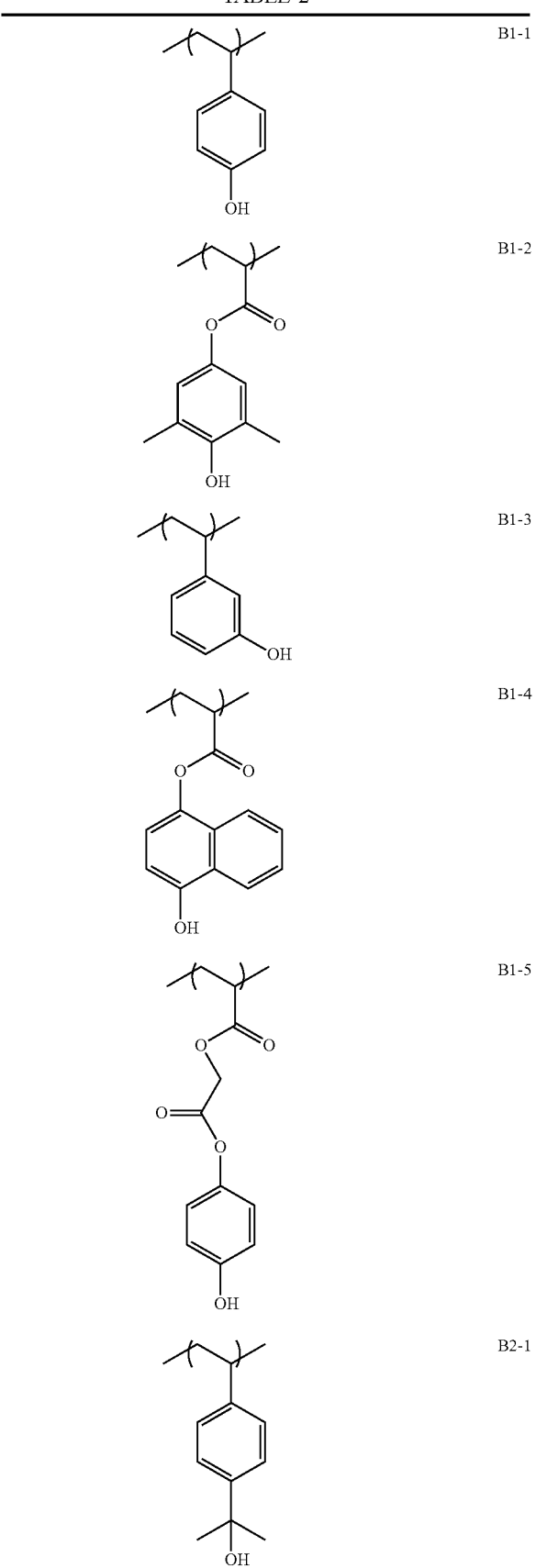

TABLE 2-continued

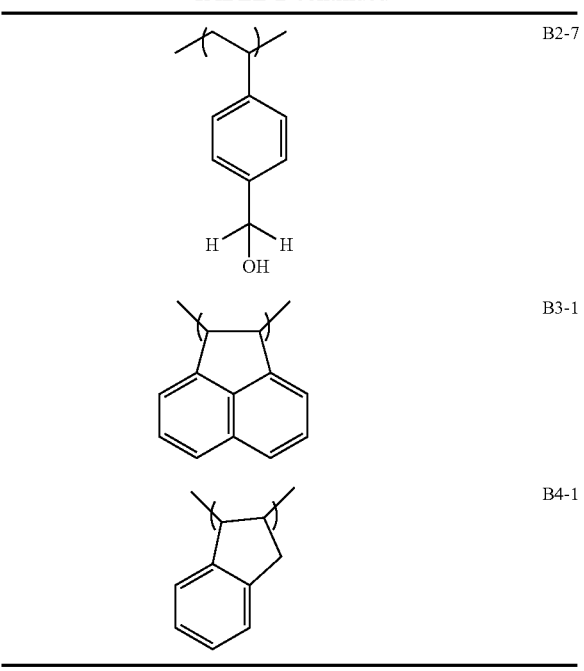

[Preparations of Negative Resist Compositions]

The base polymers (Polymers 1 to 20, Comparative Polymers 21 to 24), photo-acid generators (PAG-1 to PAG-3), the quenchers (Q-1 to Q-15, Comparative Q-1 to Comparative Q-5), a crosslinking agent (tetramethoxymethylglycoluril (TMGU)), and a surfactant (PF-636, manufactured by OMNOVA SOLUTIONS Inc.) were dissolved in organic solvents to prepare solutions according to compositions shown in Tables 3 to 5 below. Each of the obtained solutions was filtered through a UPE filter and/or nylon filter with 0.02 μm size. Thus, negative resist compositions were prepared. As the organic solvents for the resist compositions in Tables 3 to 5, a mixed solvent of propylene glycol monomethyl ether acetate (PGMEA) and γ-butyrolactone (GBL) or diacetone alcohol (DAA) was used. Note that the structures of PAG-1 to PAG-3 are as follows.

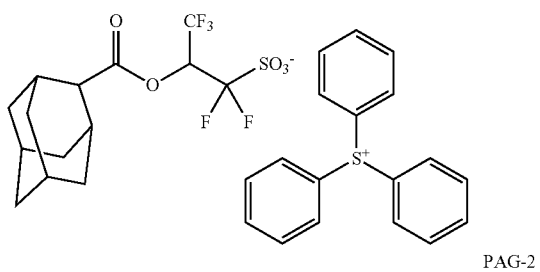

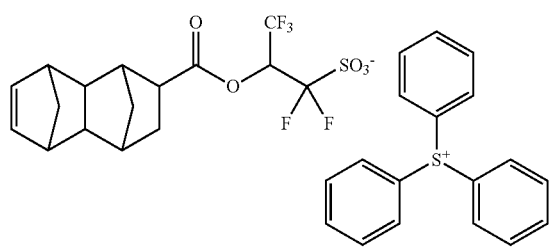

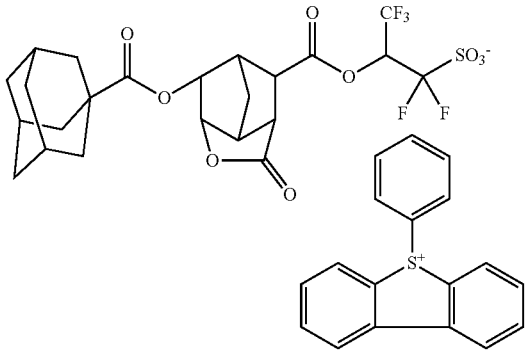

Resist Composition Evaluation: Electron Beam (EB) Drawing Evaluation

Examples 1-1 to 1-17, Comparative Examples 1-1 to 1-5

A silicon substrate was coated with an antireflective film solution (manufactured by Nissan Chemical Co., Ltd., DUV-42) and baked at 200° C. for 60 seconds to prepare an antireflective film (film thickness: 61 nm) on the substrate. This substrate was spin-coated with one of the resist compositions, and baked using a hot plate at 100° C. for 60 seconds. In this manner, 45-nm resist films were prepared. On the resultant, a dot pattern with an on-wafer size of 26 nm and a pitch of 52 nm was drawn using an electron beam writing system (ELS-F125, accelerating voltage: 125 kV) manufactured by Elionix Inc., while the exposure dose was changed from 50 μC/cm² with a step of 1 μC/cm². After the exposure, the film was baked at a temperature shown in Table 3 for 60 seconds (PEB). Then, puddle development was performed with a 2.38 mass % TMAH aqueous solution for 30 seconds, followed by rinsing with pure water and spin drying. Thus, negative type patterns were obtained. The dot patterns after the development were observed with CD-SEM (S9380) manufactured by Hitachi High-Technologies Corporation. The sensitivity, exposure latitude, and CDU were evaluated according to the following methods. Table 3 shows the results.

[Sensitivity Evaluation]

As the sensitivity, an optimum exposure dose $E_{op}$ (μC/cm²) was determined at which a dot pattern with a size of 26 nm and a pitch of 52 nm was obtained in [Electron Beam (EB) Drawing Evaluation]. The smaller the value, the higher the sensitivity.

[Exposure Latitude (EL) Evaluation]

In the EL evaluation, EL (unit: %) was determined according to the following equation from exposure doses forming the dot patterns which were obtained in [Electron Beam (EB) Drawing Evaluation] to have a size within a range of 26 nm±10% (23 nm to 29 nm). The larger the value, the more favorable.

$$EL\ (\%) = (|E_1 - E_2|/E_{op}) \times 100$$

$E_1$: optimum exposure dose providing a dot pattern with a size of 23 nm and a pitch of 52 nm $E_2$: optimum exposure dose providing a dot pattern with a size of 29 nm and a pitch of 52 nm $E_{op}$: optimum exposure dose providing a dot pattern with a size of 26 nm and a pitch of 52 nm

[Critical Dimension Uniformity (CDU) Evaluation]

The size of the dot pattern obtained in [Electron Beam (EB) Drawing Evaluation] by the irradiation at the optimum exposure dose in the sensitivity evaluation was measured at ten positions (nine CH patterns per position) in the single exposure-dose shot. Based on this result, the triple value (3G) of the standard deviation (σ) was determined as critical dimension uniformity (CDU). The smaller the value, the more excellent the critical dimension uniformity of the dot pattern.

Table 3 shows the results.

TABLE 3

| | Resist material | Polymer (parts by mass) | Acid generator (parts by mass) | Quencher (parts by mass) | Cross-linker (parts by mass) | Surfactant (parts by mass) | Organic solvent (parts by mass) | | PEB (° C.) | Sensitivity (μC/cm²) | EL (%) | CDU (nm) |
|---|---|---|---|---|---|---|---|---|---|---|---|---|
| Example 1-1 | R-1 | Polymer 1 (100) | PAG-1(14) | Q-1(5) | — | PF636 (0.08) | PGMEA (4400) | GBL (1100) | 130 | 176 | 13.4 | 3.4 |
| Example 1-2 | R-2 | Polymer 2 (100) | PAG-1(14) | Q-1(5) | — | PF636 (0.08) | PGMEA (4400) | GBL (1100) | 130 | 168 | 14.7 | 3.7 |
| Example 1-3 | R-3 | Polymer 3 (100) | PAG-1(14) | Q-2(5) | — | PF636 (0.08) | PGMEA (4400) | GBL (1100) | 130 | 187 | 14.1 | 3.4 |
| Example 1-4 | R-4 | Polymer 4 (100) | PAG-1(14) | Q-3(5) | — | PF636 (0.08) | PGMEA (4400) | GBL (1100) | 130 | 182 | 12.5 | 3.7 |
| Example 1-5 | R-5 | Polymer 5 (100) | PAG-1(14) | Q-4(5) | — | PF636 (0.08) | PGMEA (4400) | GBL (1100) | 130 | 176 | 16 | 3.6 |
| Example 1-6 | R-6 | Polymer 6 (100) | PAG-1(14) | Q-5(5) | — | PF636 (0.08) | PGMEA (4400) | GBL (1100) | 130 | 170 | 14.1 | 3.9 |
| Example 1-7 | R-7 | Polymer 7 (100) | PAG-1(14) | Q-6(5) | — | PF636 (0.08) | PGMEA (4400) | GBL (1100) | 130 | 169 | 16.1 | 3.1 |
| Example 1-8 | R-8 | Polymer 8 (100) | PAG-2(14) | Q-7(5) | — | PF636 (0.08) | PGMEA (4400) | GBL (1100) | 130 | 158 | 14.2 | 3.5 |
| Example 1-9 | R-9 | Polymer 9 (100) | PAG-2(14) | Q-8(5) | — | PF636 (0.08) | PGMEA (4400) | GBL (1100) | 130 | 162 | 15 | 3.4 |
| Example 1-10 | R-10 | Polymer 10 (100) | PAG-2(14) | Q-8(5) | — | PF636 (0.08) | PGMEA (4400) | GBL (1100) | 130 | 153 | 17.3 | 3.5 |
| Example 1-11 | R-11 | Polymer 11 (100) | PAG-2(14) | Q-9(5) | — | PF636 (0.08) | PGMEA (4400) | GBL (1100) | 130 | 155 | 17.9 | 3 |
| Example 1-12 | R-12 | Polymer 11 (100) | PAG-2(14) | Q-9(5) | TMGU (4) | PF636 (0.08) | PGMEA (4400) | GBL (1100) | 130 | 147 | 20 | 3.2 |
| Example 1-13 | R-13 | Polymer 11 (100) | PAG-2(14) | Q-10(5) | — | PF636 (0.08) | PGMEA (4400) | GBL (1100) | 130 | 154 | 15.2 | 3.4 |
| Example 1-14 | R-14 | Polymer 12 (100) | PAG-2(14) | Q-10(5) | — | PF636 (0.08) | PGMEA (4400) | GBL (1100) | 130 | 156 | 16.4 | 3.3 |
| Example 1-15 | R-15 | Polymer 13 (100) | PAG-2(14) | Q-11(5) | — | PF636 (0.08) | PGMEA (4400) | GBL (1100) | 130 | 165 | 15.1 | 3.6 |
| Example 1-16 | R-16 | Polymer 13 (100) | PAG-2(14) | Q-11(5) | TMGU (4) | PF636 (0.08) | PGMEA (4400) | GBL (1100) | 130 | 156 | 17 | 3.4 |
| Example 1-17 | R-17 | Polymer 14 (100) | PAG-2(14) | Q-12(5) | — | PF636 (0.08) | PGMEA (4400) | GBL (1100) | 130 | 174 | 16.3 | 3.6 |
| Comparative Example 1-1 | R-18 | Polymer 1 (100) | PAG-2(14) | Comparative Q-1(5) | — | PF636 (0.08) | PGMEA (4400) | GBL (1100) | 130 | 216 | 9 | 4.3 |
| Comparative Example 1-2 | R-19 | Polymer 1 (100) | PAG-1(14) | Comparative Q-2(5) | — | PF636 (0.08) | PGMEA (4400) | GBL (1100) | 130 | 224 | 10.2 | 4.2 |
| Comparative Example 1-3 | R-20 | Polymer 1 (100) | PAG-1(14) | Comparative Q-5(5) | — | PF636 (0.08) | PGMEA (4400) | GBL (1100) | 130 | 235 | 11.5 | 4.3 |
| Comparative Example 1-4 | R-21 | Comparative Polymer 21 (100) | PAG-2(14) | Q-1(5) | — | PF636 (0.08) | PGMEA (4400) | GBL (1100) | 130 | 198 | 7.8 | 4.6 |
| Comparative Example 1-5 | R-22 | Comparative Polymer 22 (100) | PAG-2(14) | Comparative Q-2(5) | — | PF636 (0.08) | PGMEA (4400) | GBL (1100) | 130 | 233 | 7.7 | 4.8 |

The results shown in Table 3 revealed that the inventive resist compositions (resist materials) containing (A) the specific quencher, (B) the specific base polymer, and (C) the photo-acid generator which generates a strong acid have high sensitivity and favorable EL and CDU. Thus, the present invention had high sensitivity and favorable EL and CDU. Meanwhile, the resist compositions of Comparative Examples not containing all of the components (A) to (C) according to the present invention had insufficient sensitivity, EL, and CDU. Moreover, in Comparative Example 1-3 using the quencher (Comparative Q-5) containing iodine but no iodinated benzoyloxy group, the sensitivity was poor, and the EL and CDU were not satisfactory, either. This suggests that the sensitivity, EL, and CDU are not improved by merely having iodine at the anion moiety of the component (A), and that it is essential for the onium salt to have the structure shown by the formula (A-1).

EUV Exposure Evaluation

Examples 2-1 to 2-16, Comparative Examples 2-1 to 2-7

A Si substrate with a silicon-containing spin-on hard mask SHB-A940 (silicon content: 43 mass %) formed to have a film thickness of 20 nm was spin-coated with a resist material shown in Table 4, and prebaked using a hot plate at 105° C. for 60 seconds to prepare a resist film having a film thickness of 50 nm. The resultant was exposed using an EUV scanner NXE3300 (manufactured by ASML, NA: 0.33, σ: 0.9/0.5, quadrupole illumination), followed by PEB on a hot plate at a temperature shown in Table 4 for 60 seconds, and development with a 2.38 mass % TMAH aqueous solution for 30 seconds to form a negative resist pattern. Consequently, the unexposed portion was dissolved in a developer, and an LS pattern having a space width of 23 nm and a pitch of 46 nm was obtained. The resist patterns obtained in this manner were evaluated as follows. Table 4 shows the results.

[Sensitivity Evaluation]

The LS patterns were observed with an electron microscope, and an optimum exposure dose Eop (mJ/cm$^2$) was determined at which an LS pattern with a space width of 23 nm and a pitch of 46 nm was obtained.

[LWR Evaluation]

Using CD-SEM (CG-5000) manufactured by Hitachi High-Technologies Corporation, the size of the LS pattern obtained by the irradiation at the optimum exposure dose was measured at ten positions in a longitudinal direction of the space width. Based on this result, the triple value (3G) of the standard deviation (σ) was determined as LWR. The smaller the value, the smaller the roughness and the more uniform the space width of the obtained pattern.

[Profile Evaluation]

The pattern profiles at the optimum exposure doses were compared, and the property was judged according to the following criteria.

good: pattern having a rectangular shape with side walls extending quite vertically.

poor: pattern having a tapered shape with side walls inclining greatly or with rounded top due to top loss.

TABLE 4

| | Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Sensitivity (mJ/cm$^2$) | LWR (nm) | Profile |
|---|---|---|---|---|---|---|---|---|---|---|---|---|---|
| Example 2-1 | R-23 | Polymer 10 (100) | PAG-1(26) | Q-1(6) | — | PF636 (0.08) | PGMEA (4400) | DAA (1100) | | 130 | 25 | 4.4 | good |
| Example 2-2 | R-24 | Polymer 11 (101) | PAG-1(26) | Q-2(6) | — | PF636 (0.08) | PGMEA (4400) | DAA (1100) | | 130 | 29 | 4.2 | good |
| Example 2-3 | R-25 | Polymer 11 (100) | PAG-1(26) | Q-3(6) | — | PF636 (0.08) | PGMEA (4400) | DAA (1100) | | 130 | 25 | 3.9 | good |
| Example 2-4 | R-26 | Polymer 12 (100) | PAG-2(26) | Q-4(6) | — | PF636 (0.08) | PGMEA (4400) | DAA (1100) | | 130 | 28 | 4.5 | good |
| Example 2-5 | R-27 | Polymer 12 (100) | PAG-2(26) | Q-4(6) | TMGU (4) | PF636 (0.08) | PGMEA (4400) | DAA (1100) | | 130 | 27 | 4.1 | good |
| Example 2-6 | R-28 | Polymer 13 (100) | PAG-2(26) | Q-5(6) | — | PF636 (0.08) | PGMEA (4400) | DAA (1100) | | 130 | 26 | 4.5 | good |
| Example 2-7 | R-29 | Polymer 14 (100) | PAG-2(26) | Q-6(6) | — | PF636 (0.08) | PGMEA (4400) | DAA (1100) | | 130 | 30 | 4.1 | good |
| Example 2-8 | R-30 | Polymer 15 (100) | PAG-2(26) | Q-7(6) | — | PF636 (0.08) | PGMEA (4400) | DAA (1100) | | 130 | 25 | 4.2 | good |
| Example 2-9 | R-31 | Polymer 16 (100) | PAG-3(26) | Q-8(2) | — | PF636 (0.08) | PGMEA (4400) | DAA (1100) | | 130 | 28 | 4.6 | good |
| Example 2-10 | R-32 | Polymer 17 (100) | PAG-3(26) | Q-9(6) | — | PF636 (0.08) | PGMEA (4400) | DAA (1100) | | 130 | 26 | 4.5 | good |
| Example 2-11 | R-33 | Polymer 18 (100) | PAG-3(26) | Q-10(6) | — | PF636 (0.08) | PGMEA (4400) | DAA (1100) | | 130 | 29 | 4.2 | good |
| Example 2-12 | R-34 | Polymer 18 (100) | PAG-3(26) | Q-11(6) | — | PF636 (0.08) | PGMEA (4400) | DAA (1100) | | 130 | 27 | 4.4 | good |
| Example 2-13 | R-35 | Polymer 19 (100) | PAG-3(26) | Q-12(6) | — | PF636 (0.08) | PGMEA (4400) | DAA (1100) | | 130 | 29 | 4.3 | good |
| Example 2-14 | R-36 | Polymer 19 (100) | PAG-3(26) | Q-13(6) | — | PF636 (0.08) | PGMEA (4400) | DAA (1100) | | 130 | 30 | 4.5 | good |
| Example 2-15 | R-37 | Polymer 20 (100) | PAG-3(26) | Q-14(6) | — | PF636 (0.08) | PGMEA (4400) | DAA (1100) | | 130 | 31 | 4.3 | good |
| Example 2-16 | R-38 | Polymer 20 (100) | PAG-3(26) | Q-15(6) | — | PF636 (0.08) | PGMEA (4400) | DAA (1100) | | 130 | 29 | 4.2 | good |
| Comparative Example 2-1 | R-39 | Polymer 10 (100) | PAG-1(26) | Comparative Q-2(6) | — | PF636 (0.08) | PGMEA (4400) | DAA (1100) | | 130 | 35 | 5.1 | poor |

TABLE 4-continued

| | Resist material | Polymer (parts by mass) | Acid generator (parts by mass) | Quencher (parts by mass) | Cross-linker (parts by mass) | Surfactant (parts by mass) | Organic solvent (parts by mass) | | PEB (° C.) | Sensitivity (mJ/cm²) | LWR (nm) | Profile |
|---|---|---|---|---|---|---|---|---|---|---|---|---|
| Comparative Example 2-2 | R-40 | Polymer 10 (100) | PAG-1(26) | Comparative Q-5(6) | — | PF636 (0.08) | PGMEA (4400) | DAA (1100) | 130 | 36 | 5.3 | poor |
| Comparative Example 2-3 | R-41 | Polymer 10 (100) | PAG-1(26) | Comparative Q-1(6) Comparative Q-3(6) | — | PF636 (0.08) | PGMEA (4400) | DAA (1100) | 130 | 37 | 5.6 | poor |
| Comparative Example 2-4 | R-42 | Polymer 10 (100) | PAG-1(26) | Comparative Q-1(6) Comparative Q-4(6) | — | PF636 (0.08) | PGMEA (4400) | DAA (1100) | 130 | 36 | 5.5 | poor |
| Comparative Example 2-5 | R-43 | Comparative Polymer 23 (100) | PAG-1(26) | Q-2(6) | — | PF636 (0.08) | PGMEA (4400) | DAA (1100) | 130 | — | — | poor |
| Comparative Example 2-6 | R-44 | Comparative Polymer 24 (100) | PAG-1(26) | Q-2(6) | — | PF636 (0.08) | PGMEA (4400) | DAA (1100) | 130 | 35 | 5.8 | poor |
| Comparative Example 2-7 | R-45 | Comparative Polymer 24 (100) | PAG-1(26) | Comparative Q-4(6) | — | PF636 (0.08) | PGMEA (4400) | DAA (1100) | 130 | 34 | 6.2 | poor |

The results shown in Table 4 revealed that the inventive resist compositions (resist materials) containing (A) the specific quencher, (B) the specific base polymer, and (C) the photo-acid generator which generates a strong acid have high sensitivity and favorable LWR. Thus, the present invention had favorable profiles. Meanwhile, the resist compositions of Comparative Examples not containing all of the components (A) to (C) according to the present invention were found to have poor profiles due to top loss. Particularly, in Comparative Example 2-5, the pattern profile was significantly degraded, and it was impossible to measure the sensitivity and LWR. Moreover, in Comparative Example 2-2 using the quencher (Comparative Q-5) containing iodine but no iodinated benzoyloxy group, poor sensitivity and poor profile were found. This suggests that the pattern profile is not improved by merely having iodine at the anion moiety of the component (A), and that it is essential for the onium salt to have the structure shown by the formula (A-1).

Film Remaining Evaluation at Exposed Portion

Examples 3-1 to 3-4, Comparative Examples 3-1 to 3-4

A Si substrate with a silicon-containing spin-on hard mask SHB-A940 (silicon content: 43 mass %) formed to have a film thickness of 20 nm was spin-coated with a resist material shown in Table 5, and prebaked using a hot plate at 105° C. for 60 seconds to prepare a resist film having a film thickness of 50 nm. The resultant was exposed using a KrF scanner S206D (manufactured by Nikon Corporation, NA: 0.82, Conventional illumination), while the exposure dose was changed. The film was subjected to PEB on a hot plate at a temperature shown in Table 5 for 60 seconds, and development with a 2.38 mass % TMAH aqueous solution for 30 seconds. At the positions exposed with various exposure doses, the film thicknesses were measured with a film thickness measurement system RE-3100 manufactured by SCREEN Semiconductor Solutions Co., Ltd. Ratios relative to the film thickness after the resist coating were calculated according to the following equation, and defined as film remaining percentages. FIG. 1 shows a graph plotted such that the horizontal axis represents the exposure doses and the vertical axis represents the film remaining percentages. Since the present invention is an alkali-negative resist composition, the higher the exposure dose, the higher the film remaining percentage of the resist as shown in FIG. 1. The film remaining percentage eventually reaches a plateau, and Table 5 shows that the film remaining percentage at the plateau is indicated as plateaued film remaining percentage (i.e., value A in FIG. 1). A larger value of the plateaued film remaining percentage means that the solubility of the exposed portion into an alkaline developer is suppressed and excellent.

Film remaining percentage (%)={Film thickness at each exposure dose (nm)/Film thickness immediately after coating (50 nm)}×100

TABLE 5

| | Resist material | Polymer (parts by mass) | Acid generator (parts by mass) | Quencher (parts by mass) | Cross-linker (parts by mass) | Surfactant (parts by mass) | Organic solvent (parts by mass) | | PEB (° C.) | Plateaued film remaining percentage (%) |
|---|---|---|---|---|---|---|---|---|---|---|
| Example 3-1 | R-46 | Polymer 2 (100) | PAG-3(26) | Q-1(12) | — | PF636 (0.08) | PGMEA (4400) | DAA (1100) | 130 | 81 |

TABLE 5-continued

| | Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Plateaued film remaining percentage (%) |
|---|---|---|---|---|---|---|---|---|---|---|---|
| Example 3-2 | R-47 | Polymer 2 (100) | PAG-3(26) | Q-4(12) | — | PF636 (0.08) | PGMEA (4400) | DAA (1100) | | 130 | 84 |
| Example 3-3 | R-48 | Polymer 2 (100) | PAG-3(26) | Q-11(12) | — | PF636 (0.08) | PGMEA (4400) | DAA (1100) | | 130 | 85 |
| Example 3-4 | R-49 | Polymer 2 (100) | PAG-3(26) | Q-12(12) | — | PF636 (0.08) | PGMEA (4400) | DAA (1100) | | 130 | 87 |
| Comparative Example 3-1 | R-50 | Polymer 2 (100) | PAG-3(26) | Comparative Q-2(12) | — | PF636 (0.08) | PGMEA (4400) | DAA (1100) | | 130 | 70 |
| Comparative Example 3-2 | R-51 | Polymer 2 (100) | PAG-3(26) | Comparative Q-3(12) | — | PF636 (0.08) | PGMEA (4400) | DAA (1100) | | 130 | 72 |
| Comparative Example 3-3 | R-52 | Polymer 2 (100) | PAG-3(26) | Comparative Q-5(12) | — | PF636 (0.08) | PGMEA (4400) | DAA (1100) | | 130 | 71 |
| Comparative Example 3-4 | R-53 | Comparative Polymer 23 (100) | PAG-3(26) | Q-1(12) | — | PF636 (0.08) | PGMEA (4400) | DAA (1100) | | 130 | 60 |

The result in Table 5 shows that the plateaued film remaining percentage of the inventive resist materials containing (A) the sulfonium salt and (B) the specific base polymer is high and favorable. In contrast, the resist compositions of Comparative Examples not containing all of the components (A) to (C) according to the present invention had low plateaued film remaining percentages.

Tables 3, 4 revealed that the inventive negative type compositions are excellent in sensitivity, LWR, CDU, and pattern profile in the EB and EUV lithographies. Further, Table 5 revealed that the inventive negative type compositions are excellent in plateaued film remaining percentage in the KrF lithography, that is, the solubility of the exposed portion to an alkaline developer is suppressed. Besides (C) the photo-acid generator which generates an acid for insolubilizing the base polymer, both of (A) the quencher and (B) the specific base polymer have to be incorporated in the inventive resist composition, and apparently the performance improvements are not demonstrated by incorporating only one of (A) and (B).

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A chemically-amplified negative resist composition comprising:
(A) a quencher containing an onium salt shown by the following formula (A-1);
(B) a base polymer containing repeating units shown by the following formulae (B1) and (B2); and
(C) a photo-acid generator which generates an acid,

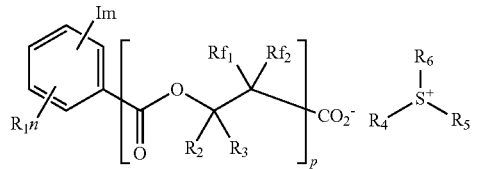

(A-1)

wherein $R_1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, —$NR_S$—C(=O)—$R_8$, or —$NR_S$—C(=O)—O—$R_8$; $R_7$ represents a hydrogen atom or a linear, branched, or cyclic alkyl group having 1 to 6 carbon atoms optionally containing a halogen atom, a hydroxy group, an alkoxy group, an acyl group, or an acyloxy group; $R_8$ represents a linear, branched, or cyclic alkyl group having 1 to 16 carbon atoms or alkenyl group having 2 to 16 carbon atoms, or an aryl group having 6 to 12 carbon atoms, and optionally contains a halogen atom, a hydroxy group, an alkoxy group, an acyl group, or an acyloxy group; $R_2$ and $R_3$ each represent a hydrogen atom or a linear, branched, or cyclic alkyl group having 1 to 20 carbon atoms; $Rf_1$ and $Rf_2$ each independently represent a fluorine atom, or a trifluoromethyl group; $R_4$, $R_5$, and $R_6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, and carbon atoms of these groups are optionally interposed by an ether group, an ester group, a carbonyl group, a carbonate group, or a sulfonic acid ester group; $R_4$ and $R_5$ optionally bond with each other to form a ring with a sulfur atom bonded to $R_4$ and $R_5$; "m" represents an integer of 1 to 5; "n" represents an integer satisfying 0≤n≤5-m; and "p" represents an integer of 1,

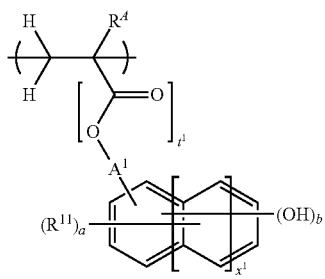

(B1)

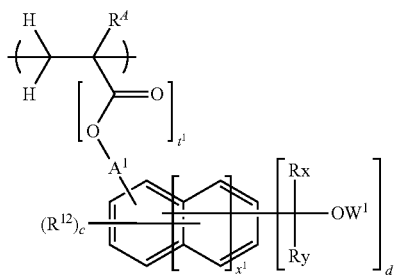

(B2)

wherein $R^4$ represents a hydrogen atom, a fluorine atom, a methyl group, or a trifluoromethyl group; $R^{11}$ and $R^{12}$ each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted; $A^1$ represents a single bond or a linear, branched, or cyclic alkylene group having 1 to 10 carbon atoms and optionally having an ether bond interposed in a carbon-carbon bond; $W^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond; Rx and Ry each independently represent a hydrogen atom, an alkyl group having 1 to 15 carbon atoms optionally substituted with a hydroxy group or an alkoxy group, or a monovalent aromatic group optionally having a substituent, given that not both of Rx and Ry are hydrogen atoms simultaneously, and Rx and Ry optionally bond with each other to form a ring with a carbon atom bonded to Rx and Ry; $t^1$ represents 0 or 1; $x^1$ represents an integer of 0 to 2; "a" represents an integer satisfying $0 \leq a \leq 5+2x^1-b$; "c" represents an integer satisfying $0 \leq c \leq 5+2x^1-d$; and "b" and "d" each represent an integer of 1 to 3.

2. The chemically-amplified negative resist composition according to claim 1, wherein the base polymer further contains at least one repeating unit selected from a repeating unit shown by the following formula (B3) and a repeating unit shown by the following formula (B4):

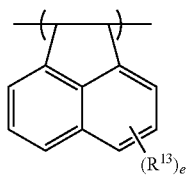

(B3)

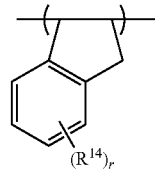

(B4)

wherein $R^{13}$ and $R^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted; and "e" and "f" each independently represent an integer of 0 to 4.

3. The chemically-amplified negative resist composition according to claim 1, wherein the base polymer contains a repeating unit shown by the following formula (B5) and a repeating unit shown by the following formula (B6):

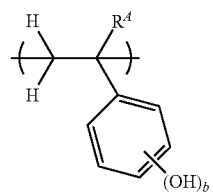

(B5)

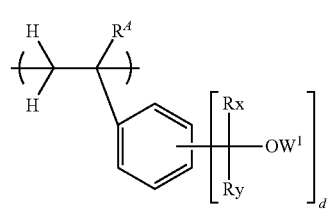

(B6)

wherein $R^4$, Rx, Ry, $W^1$, "b", and "d" are as defined above.

4. The chemically-amplified negative resist composition according to claim 2, wherein the base polymer contains a repeating unit shown by the following formula (B5) and a repeating unit shown by the following formula (B6):

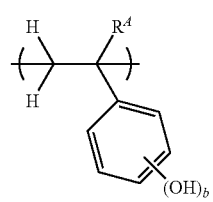

(B5)

-continued

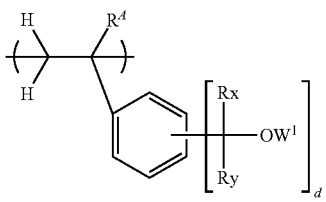

(B6)

wherein $R^A$, Rx, Ry, $W^1$, "b", and "d" are as defined above.

5. The chemically-amplified negative resist composition according to claim 1, further comprising (D) a crosslinking agent.

6. The chemically-amplified negative resist composition according to claim 2, further comprising (D) a crosslinking agent.

7. The chemically-amplified negative resist composition according to claim 3, further comprising (D) a crosslinking agent.

8. The chemically-amplified negative resist composition according to claim 4, further comprising (D) a crosslinking agent.

9. A resist patterning process using the chemically-amplified negative resist composition according to claim 1, comprising steps of:
  forming a resist film by using the chemically-amplified negative resist composition on a substrate to be processed;
  irradiating the resist film with a high energy beam to form a pattern; and
  developing the resist film by using an alkaline developer.

10. A resist patterning process using the chemically-amplified negative resist composition according to claim 2, comprising steps of:
  forming a resist film by using the chemically-amplified negative resist composition on a substrate to be processed;
  irradiating the resist film with a high energy beam to form a pattern; and
  developing the resist film by using an alkaline developer.

11. A resist patterning process using the chemically-amplified negative resist composition according to claim 3, comprising steps of:
  forming a resist film by using the chemically-amplified negative resist composition on a substrate to be processed;
  irradiating the resist film with a high energy beam to form a pattern; and
  developing the resist film by using an alkaline developer.

12. A resist patterning process using the chemically-amplified negative resist composition according to claim 5, comprising steps of:
  forming a resist film by using the chemically-amplified negative resist composition on a substrate to be processed;
  irradiating the resist film with a high energy beam to form a pattern; and
  developing the resist film by using an alkaline developer.

13. The resist patterning process according to claim 9, wherein the high energy beam is an electron beam or an extreme ultraviolet ray with a wavelength of 3 to 15 nm.

14. The resist patterning process according to claim 10, wherein the high energy beam is an electron beam or an extreme ultraviolet ray with a wavelength of 3 to 15 nm.

15. The resist patterning process according to claim 11, wherein the high energy beam is an electron beam or an extreme ultraviolet ray with a wavelength of 3 to 15 nm.

16. The resist patterning process according to claim 12, wherein the high energy beam is an electron beam or an extreme ultraviolet ray with a wavelength of 3 to 15 nm.

* * * * *